US012635304B2

(12) United States Patent
Jin et al.

(10) Patent No.: US 12,635,304 B2
(45) Date of Patent: May 19, 2026

(54) DISPLAY DEVICE AND METHOD OF MANUFACTURING THE SAME

(71) Applicant: Samsung Display Co., LTD., Yongin-si (KR)

(72) Inventors: Ki Su Jin, Yongin-si (KR); Jae Hyun Lee, Yongin-si (KR); Seul Ki Kim, Yongin-si (KR); Min Sik Jung, Yongin-si (KR); Seung Ha Choi, Yongin-si (KR); Jong Bum Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 528 days.

(21) Appl. No.: 18/118,486

(22) Filed: Mar. 7, 2023

(65) Prior Publication Data

US 2023/0411561 A1 Dec. 21, 2023

(30) Foreign Application Priority Data

Jun. 16, 2022 (KR) ........................ 10-2022-0073563

(51) Int. Cl.
| | |
|---|---|
| *H10H 20/831* | (2025.01) |
| *H10H 20/01* | (2025.01) |
| *H10H 20/857* | (2025.01) |

(52) U.S. Cl.
CPC ........ *H10H 20/8312* (2025.01); *H10H 20/01* (2025.01); *H10H 20/857* (2025.01); *H10H 20/032* (2025.01); *H10H 20/0364* (2025.01)

(58) Field of Classification Search
CPC .. H10H 20/8312; H10H 20/01; H10H 20/857; H10H 20/0264; H10H 20/032; H10D 30/6729; H10D 30/6728; H10D 30/6713; H10D 30/67
See application file for complete search history.

(56) References Cited

U.S. PATENT DOCUMENTS

| | | |
|---|---|---|
| 2017/0186834 A1 | 6/2017 | Kimura |
| 2020/0135772 A1* | 4/2020 | Lee ...................... H10K 59/131 |

FOREIGN PATENT DOCUMENTS

| | | |
|---|---|---|
| KR | 10-1424249 | 8/2014 |

* cited by examiner

*Primary Examiner* — Nathanael R Briggs
(74) *Attorney, Agent, or Firm* — Innovation Counsel LLP

(57) ABSTRACT

A display device includes a first base part, a semiconductor layer including a first semiconductor part disposed on the first base part and a second semiconductor part adjacent to a first side of the first semiconductor part in a first direction, a gate insulating layer disposed on the semiconductor layer and including a first gate insulating layer and a second gate insulating layer spaced apart from each other, and a gate conductive layer including a gate electrode disposed on the first gate insulating layer and overlapping the first semiconductor part and a first connecting electrode overlapping the second gate insulating layer and the second semiconductor part. The first connecting electrode includes a protrusion, the second gate insulating layer includes a recess, and the protrusion of the first connecting electrode overlaps the recess of the second gate insulating layer.

20 Claims, 41 Drawing Sheets

ACNE: ACNE1, ACNE2
ACT: ACT1, ACT2, ACT3
115: 115a, 115b, 115c

ACT: ACT1, ACT2, ACT3

115: 115a, 115b, 115c

ACNE: ACNE1, ACNE2

115: 115a, 115b, 115c

ACT'

110

115'_1: 115'_1a, 115'_1b, 115'_1c

115'_1: 115'_1a, 115'_1b, 115'_1c

115'_1: 115'_1a, 115'_1b, 115'_1c

115'_1: 115'_1a, 115'_1b, 115'_1c

115'_1: 115'_1a, 115'_1b, 115'_1c

115'_1: 115'_1a, 115'_1b, 115'_1c

115: 115a, 115b, 115c

ACNE: ACNE1, ACNE2
ACT: ACT1, ACT2, ACT3
115: 115a, 115d, 115e

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0073563 under 35 U.S.C. 119, filed on Jun. 16, 2022, in the Korean Intellectual Property Office, the entire contents of which are incorporated herein by reference.

BACKGROUND

1. Technical Field

Embodiments relate to a display device and a method of manufacturing the same.

2. Description of the Related Art

Display devices have increasingly become of importance with the development of multimedia, and various types of display devices, such as a liquid crystal display (LCD) device, an organic light-emitting diode (OLED) display device, or the like, have been used.

A self-luminous display device, which is a type of display device, includes self-luminous elements such as OLEDs. Each of the self-luminous elements may include two electrodes facing each other and an emission layer interposed between the two electrodes. In a case where the self-luminous elements are OLEDs, electrons and holes from the two electrodes may recombine together in the emission layer to generate excitons, and light may be emitted in response to the transition of the excitons from an excited state to a ground state.

The self-luminous display device does not require a light source such as a backlight unit and may thus be implemented as a low-power consumption, thin, light-weight display device with high-quality characteristics such as wide viewing angles, high luminance and contrast, and a fast response speed, drawing attention as a next-generation display device.

SUMMARY

Embodiments provide a display device capable of reducing the number of conductive layers and preventing any increases in resistance when different conductive layers are in contact with one another.

However, embodiment of the disclosure are not limited to those set forth herein. The above and other embodiments of the disclosure will become more apparent to one of ordinary skill in the art to which the disclosure pertains by referencing the detailed description of the disclosure given below.

In an embodiment, a display device may include a first base part, a semiconductor layer including a first semiconductor part disposed on the first base part, a second semiconductor part adjacent to on a first side of the first semiconductor part in a first direction, and a third semiconductor part adjacent to on a second side of the first semiconductor part in the first direction, a gate insulating layer disposed on the semiconductor layer and including a first gate insulating layer, a second gate insulating layer, and a third gate insulating layer spaced apart from each other, and a gate conductive layer including a gate electrode disposed on the first gate insulating layer and overlapping the first semiconductor part, a first connecting electrode overlapping the second gate insulating layer and the second semiconductor part, and a second connecting electrode overlapping the third gate insulating layer and the third semiconductor part, wherein the first connecting electrode may include a protrusion, the second gate insulating layer may include a recess, and the protrusion of the first connecting electrode overlaps the recess of the second gate insulating layer.

The second connecting electrode may include a protrusion, the third gate insulating layer may include a recess, and the protrusion of the second connecting electrode may overlap the recess of the third gate insulating layer.

The first connecting electrode may be directly connected to the second semiconductor part, the second connecting electrode may be directly connected to the third semiconductor part, the second and third semiconductor parts may include semiconductor openings penetrating the second and third semiconductor parts in a thickness direction, the first connecting electrode may include a (1-1)-th connecting electrode and a (1-2)-th connecting electrode including the protrusion of the first connecting electrode and connected to the (1-1)-th connecting electrode, and an end portion of the second gate insulating layer overlapping the first connecting electrode may be aligned with an end portion of the (1-2)-th connecting electrode or may be disposed between the end portion of the (1-2)-th connecting electrode and an end portion of the (1-1)-th connecting electrode.

The second semiconductor part may include a (2-1)-th semiconductor part extending in the first direction, the (2-1)-th semiconductor part may include the semiconductor opening of the second semiconductor part, a first-side semiconductor part adjacent to a first side of the semiconductor opening of the second semiconductor part in the first direction, and a (2-1-1)-th semiconductor part adjacent to a second side of the semiconductor opening of the second semiconductor part in the first direction.

The (2-1-1)-th semiconductor part may be directly connected to the first semiconductor part.

The first-side semiconductor part may include a (2-1-2)-th semiconductor part overlapping the first connecting electrode, and a (2-1-3)-th semiconductor part protruding toward the semiconductor opening of the second semiconductor part, beyond the first connecting electrode, in a plan view.

The (2-1-1)-th semiconductor part may have a higher conductivity than the first semiconductor part.

The (2-1-3)-th semiconductor part may have a higher conductivity than the (2-1-2)-th semiconductor part.

The second semiconductor part may further include a (2-2)-th semiconductor part adjacent to a first side of the (2-1)-th semiconductor part in a second direction intersecting the first direction, and a (2-3)-th semiconductor part adjacent to a second side of the (2-1)-th semiconductor part in the second direction, and the (2-2)-th and (2-3)-th semiconductor parts may be directly connected to the (2-1-3)-th semiconductor part.

The (2-2)-th and (2-3)-th semiconductor parts may have a higher conductivity than the (2-1-2)-th semiconductor part.

The display device may further include a width of the (1-2)-th connecting electrode in the second direction may be smaller than a width of the (1-1)-th connecting electrode in the second direction.

The (1-2)-th connecting electrode may protrude from the end portion of the (1-1)-th connecting electrode toward the semiconductor openings.

The (2-1-3)-th semiconductor part may protrude from the (1-2)-th connecting electrode toward the semiconductor openings, in a plan view.

The (1-2)-th connecting electrode may be positioned in a middle portion of the end portion of the (1-1)-th connecting electrode.

The recess of the second gate insulating layer overlapping the first connecting electrode may include an insulating opening recessed from the end portion of the second gate insulating layer in the first direction from the first semiconductor part to the second semiconductor part.

The second gate insulating layer overlapping the first connecting electrode may include end portions spaced apart from each other in a second direction intersecting the first direction and forming the recess of the second gate insulating layer, and the (1-2)-th connecting electrode may be disposed between the end portions of the second gate insulating layer.

The end portions of the second gate insulating layer overlapping the first connecting electrode may be in contact with end portions of the (1-2)-th connecting electrode in the second direction.

A distance between the end portions of the second gate insulating layer in the second direction and a width of the (1-2)-th connecting electrode in the second direction may be substantially same as each other.

In an embodiment, a display device may include a first base part, a semiconductor layer including a first semiconductor part disposed on the first base part, and a second semiconductor part adjacent to a first side of the first semiconductor part in a first direction, a gate insulating layer disposed on the semiconductor layer including a first gate insulating layer and a second gate insulating layer spaced apart from each other, and a gate conductive layer including a gate electrode disposed on the first gate insulating layer and overlapping the first semiconductor part, and a first connecting electrode overlapping the second gate insulating layer and the second semiconductor part, wherein the first connecting electrode may include a protrusion, the second gate insulating layer may include a recess, and the protrusion of the first connecting electrode may overlap the recess of the second gate insulating layer.

The first connecting electrode may be directly connected to the second semiconductor part, the first connecting electrode may include a (1-1)-th connecting electrode and a (1-2)-th connecting electrode including the protrusion of the first connecting electrode and connected to the (1-1)-th connecting electrode, and a width of the (1-2)-th connecting electrode in a second direction may be smaller than a width of the (1-1)-th connecting electrode in the second direction.

The second semiconductor part may include a semiconductor opening penetrating the second semiconductor part.

The (1-2)-th connecting electrode may protrude from an end portion of the (1-1)-th connecting electrode toward the semiconductor opening.

The first gate insulating layer may overlap the gate electrode, and the second gate insulating layer may overlap the first connecting electrode.

The recess of the gate insulating layer overlapping the first connecting electrode may include an insulating opening recessed from an end portion of the second gate insulating layer in the first direction the first semiconductor part to the second semiconductor part.

The end portion of the second gate insulating layer overlapping the first connecting electrode may be disposed between an end portion of the (1-2)-th connecting electrode and an end portion of the (1-1)-th connecting electrode.

In an embodiment, a method of manufacturing a display device may include forming a semiconductor layer on a first base part and including a first semiconductor part and a second semiconductor part adjacent to a first side of the first semiconductor part in a first direction, forming a gate insulating layer on the semiconductor layer and including an insulating opening overlapping the second semiconductor part, disposing a gate conductive layer on the gate insulating layer, disposing a photoresist on the gate conductive layer, and forming a gate electrode and a first connecting electrode including a (1-1)-th connecting electrode and a (1-2)-th connecting electrode protruding from the (1-1)-th connecting electrode in the first direction by etching the gate conductive layer by using the photoresist in a plan view, wherein the insulating opening of the gate insulating layer may overlap the (1-2)-th connecting electrode of the first connecting electrode.

The method of manufacturing may further include forming a semiconductor opening penetrating the second semiconductor part in a thickness direction, by etching the semiconductor layer exposed by the gate insulating layer, after the etching of the gate conductive layer by using the photoresist.

The method of manufacturing may further include etching the gate insulating layer by using the photoresist, after the forming of the semiconductor opening, and changing a characteristic of the semiconductor layer exposed by the gate electrode and the first connecting electrode to be conductive by the etching of the gate insulating layer by using the photoresist.

According to the aforementioned and other embodiments of the disclosure, the number of conductive layers may be reduced, and any increases in resistance may be prevented when different conductive layers are in contact with one another.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which:

FIG. 8 is a schematic plan view of a modified example of the color conversion substrate of FIG. 6;

FIG. 13 is a schematic cross-sectional view taken along line X2-X2' of FIG. 9;

DETAILED DESCRIPTION OF THE EMBODIMENTS

Figure 1:
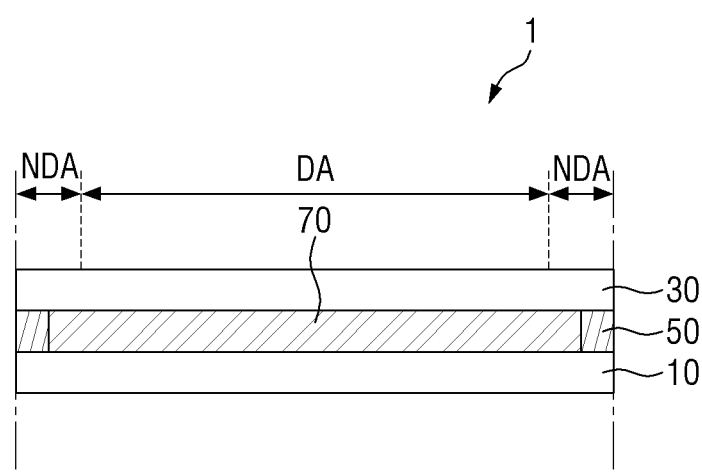
FIG. 1 is a schematic cross-sectional view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments will be described with reference to the accompanying drawings.

FIG. 1 is a schematic cross-sectional view of a display device according to an embodiment.

Referring to FIG. 1, a display device 1 may be applicable to a small-size electronic device to a mid-size electronic device such as a tablet personal computer (PC), a smartphone, a car navigation unit, a camera, a center information display (CID) of a car, a wristwatch-type electronic device, a personal digital assistant (PDA), a portable multimedia player (PMP), or a gaming console or a mid- to large-size electronic device such as a television (TV), an electronic billboard, a monitor, a PC, or a notebook computer, but embodiments are not limited thereto. For example, the display device 1 may be employed in various electronic devices.

The display device 1 may include a display area DA, which displays an image, and a non-display area NDA, which does not display an image. The non-display area NDA may be positioned around the display area DA and may surround the display area DA. An image displayed in the display area DA may be visible from above in a third direction Z.

The display device 1 may include a display substrate 10 and a color conversion substrate 30, which faces the display substrate 10, and may further include a sealing member which couples the display substrate 10 and the color conversion substrate 30, and a filler which is disposed between the display substrate 10 and the color conversion substrate 30.

The display substrate 10 may include elements and circuits for displaying an image (e.g., pixel circuits such as switching elements), a pixel-defining layer, which defines light-emitting areas and a non-light-emitting area in the display area DA, and self-light-emitting elements. The self-light-emitting elements may include organic light-emitting diodes (OLEDs), quantum-dot light-emitting diodes (LEDs), micro-LEDs including an inorganic material, and/or nano-LEDs including an inorganic material. For descriptive convenience, the self-light-emitting elements will hereinafter be described as being OLEDs.

The color conversion substrate 30 may be positioned on the display substrate 10 and may face the display substrate 10. In some embodiments, the color conversion substrate 30 may include color conversion pattern members capable of converting the color of incident light. In some embodiments, the color conversion substrate 30 may include color filters and/or wavelength shifting pattern members. In some embodiments, the color conversion substrate may include both the color filters and the wavelength shifting pattern members.

The sealing member 50 may be positioned between the display substrate 10 and the color conversion substrate 30 in the non-display area NDA. In a plan view, the sealing member 50 may be disposed along the edge portions of each of the display substrate 10 and the color conversion substrate 30, in the non-display area NDA, to surround the display area DA. The display substrate 10 and the color conversion substrate 30 may be coupled together via the sealing member 50.

In some embodiments, the sealing member 50 may be formed of an organic material. For example, the sealing member 50 may be formed of an epoxy resin, but embodiments are not limited thereto. In some embodiments, the sealing member 50 may be provided as frit including glass.

The filler 70 may be positioned in the space between the display substrate 10 and the color conversion substrate 30, surrounded by the sealing member 50. The filler 70 may fill the gap between the display substrate 10 and the color conversion substrate 30.

In some embodiments, the filler 70 may be formed of a material capable of transmitting light therethrough. In some embodiments, the filler 70 may be formed of an organic material. For example, the filler 70 may be formed of a silicone-based organic material, an epoxy-based organic material, or the mixture thereof.

In some embodiments, the filler 70 may be formed of a material having an extinction coefficient of substantially zero. There is a correlation between refractive index and extinction coefficient, and the less the refractive index, the less the extinction coefficient. In case that the refractive index is about 1.7 or less, the extinction coefficient substantially converges on zero. In some embodiments, the filler 70 may be formed of a material having a refractive index of about 1.7 or less, and as a result, the absorption of light provided by the self-light-emitting elements, through the filler 70, may be prevented or minimized. In some embodiments, the filler 70 may be formed of an organic material having a refractive index of about 1.4 to about 1.6.

FIG. 1 illustrates that the display device 1 includes the display substrate 10, the color conversion substrate 30, the sealing member 50, and the filler 70, but embodiments are not limited thereto. In some embodiments, the sealing member 50 and the filler 70 may not be provided, and the entire color conversion substrate 30 except for a second base part 310 may be disposed on the display substrate 10.

Figure 2:
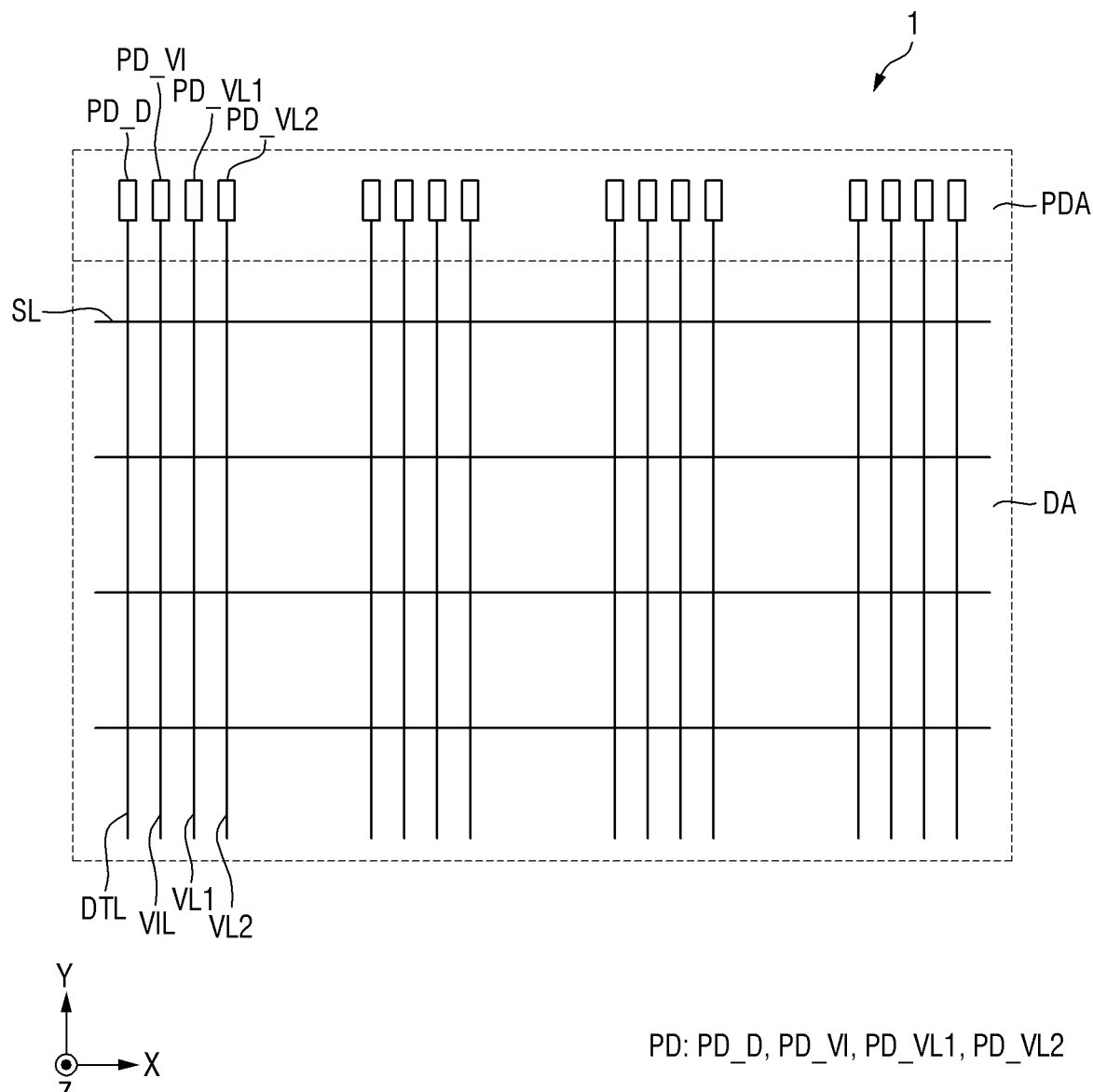
FIG. 2 is a schematic plan view illustrating the layout of lines of the display device of FIG. 1.

FIG. 2 is a schematic plan view illustrating the layout of lines of the display device of FIG. 1.

Referring to FIG. 2, the display device 1 may include lines. The display device 1 may include scan lines SL, data lines DTL, initialization voltage lines VIL, and voltage lines (e.g., VL1 and VL2). For example, the display device 1 may further include other lines.

The data lines DTL, the initialization voltage lines VIL, and the voltage lines (e.g., VL1 and VL2) may extend in a second direction Y (or a Y-axis direction), and the scan lines SL may extend in a first direction X (or an X-axis direction). The data lines DTL, the initialization voltage lines VIL, and the voltage lines (e.g., VL1 and VL2) may be connected to connecting pads PD, which are disposed in a pad area PDA of the non-display area NDA. The connecting pads PD may include data pads PD_D, which are connected to the data lines DTL, initialization voltage pads PD_V1, which are connected to the initialization voltage lines VIL, and voltage pads (e.g., PD_VL1 and PD_VL2), which are connected to the voltage lines (e.g., VL1 and VL2).

The term "connect" or "connection", as used herein, not only means that one element is coupled to another element through physical contact, but also means that one element is coupled to another element via yet another element. One integral member may be understood as having parts connected to one another. The connection between two elements may encompass not only a direct connection between the two elements, but also an electrical connection between two elements.

The connecting pads PD are illustrated as being disposed in the pad area PDA, on the upper side of the display area DA, but embodiments are not limited thereto. In another example, some of the connecting pads PD may be disposed on the lower side of the display area DA or on the left or right side of the display area DA.

A pixel PX or a subpixel SPXn (where n is an integer of 1 to 3) of the display device 1 may include a pixel driving circuit. The above-described lines of the display device 1 may apply driving signals to the pixel driving circuit and may extend by the pixel or the subpixel SPXn. The pixel driving circuit may include transistors and capacitors. The numbers of transistors and capacitors included in the pixel driving circuit may vary. For example, the pixel driving circuit may have a "3T-1C" structure including three transistors and one capacitor. The pixel driving circuit will hereinafter be described as having the "3T-1C" structure, but embodiments are not limited thereto. In another example, various other structures such as a "2T-1C", "7T-1C", or "6T-1C" structure may also be applicable to the pixel driving circuit.

Figure 3:
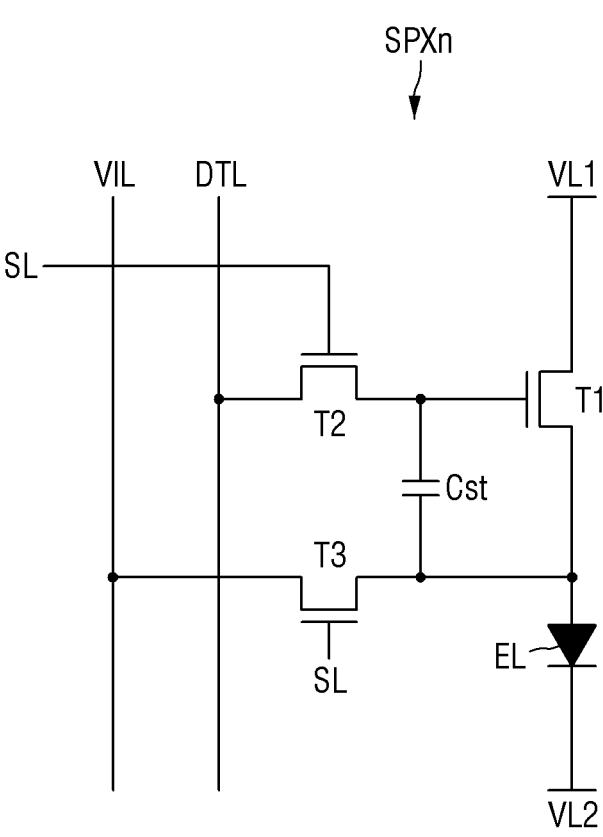
FIG. 3 is a schematic diagram of an equivalent circuit of a pixel of the display device of FIG. 1.

FIG. 3 is a schematic diagram of an equivalent circuit of a subpixel of the display device 1 of FIG. 1.

Referring to FIG. 3, a subpixel SPXn of the display device 1 may include a light-emitting element EL such as a light-emitting diode, three transistors, i.e., first, second, and third transistors T1, T2, and T3, and one storage capacitor Cst.

The light-emitting element EL may emit light in accordance with a current applied thereto via the first transistor T1. The light-emitting element EL may include a first electrode, a second electrode, and at least one light-emitting element disposed between the first and second electrodes. The light-emitting element may emit light of a certain wavelength range in accordance with electric signals transmitted thereto from the first and second electrodes.

A first end portion of the light-emitting element EL may be connected to the source electrode of the first transistor T1, and a second end portion of the light-emitting element EL may be connected to a second voltage line VL2, to which a low-potential voltage (hereinafter, a second power supply voltage) is supplied. For example, the second power supply voltage is lower than a high-potential voltage (hereinafter, a first power supply voltage), which is supplied to a first voltage line VL1.

The first transistor T1 may control a current flowing from the first voltage line VL1, to which the first power supply voltage is supplied, to the light-emitting element EL in accordance with the difference in voltage between the gate electrode and the source electrode of the first transistor T1. For example, the first transistor T1 may be a transistor for driving the light-emitting element EL. The gate electrode of the first transistor T1 may be connected to the source electrode of the second transistor T2, the source electrode of the first transistor T1 may be connected to the first electrode of the light-emitting element EL, and the drain electrode of the first transistor T1 may be connected to the first voltage line VL1, to which the first power supply voltage is supplied.

The second transistor T2 may be turned on by a scan signal from a scan line SL to connect a data line DTL to the gate electrode of the first transistor T1. The gate electrode of the second transistor T2 may be connected to the scan line SL, the source electrode of the second transistor T2 may be connected to the gate electrode of the first transistor T1, and the drain electrode of the second transistor T2 may be connected to the data line DTL.

The third transistor T3 may be turned on by the scan signal from the scan line SL to connect an initialization voltage line VIL to a first end portion of the light-emitting element EL. The gate electrode of the third transistor T3 may be connected to the scan line SL, the drain electrode of the third transistor T3 may be connected to the initialization voltage line VIL, and the source electrode of the third transistor T3 may be connected to the first end portion of the light-emitting element EL or the source electrode of the first transistor T1.

Figure 4:
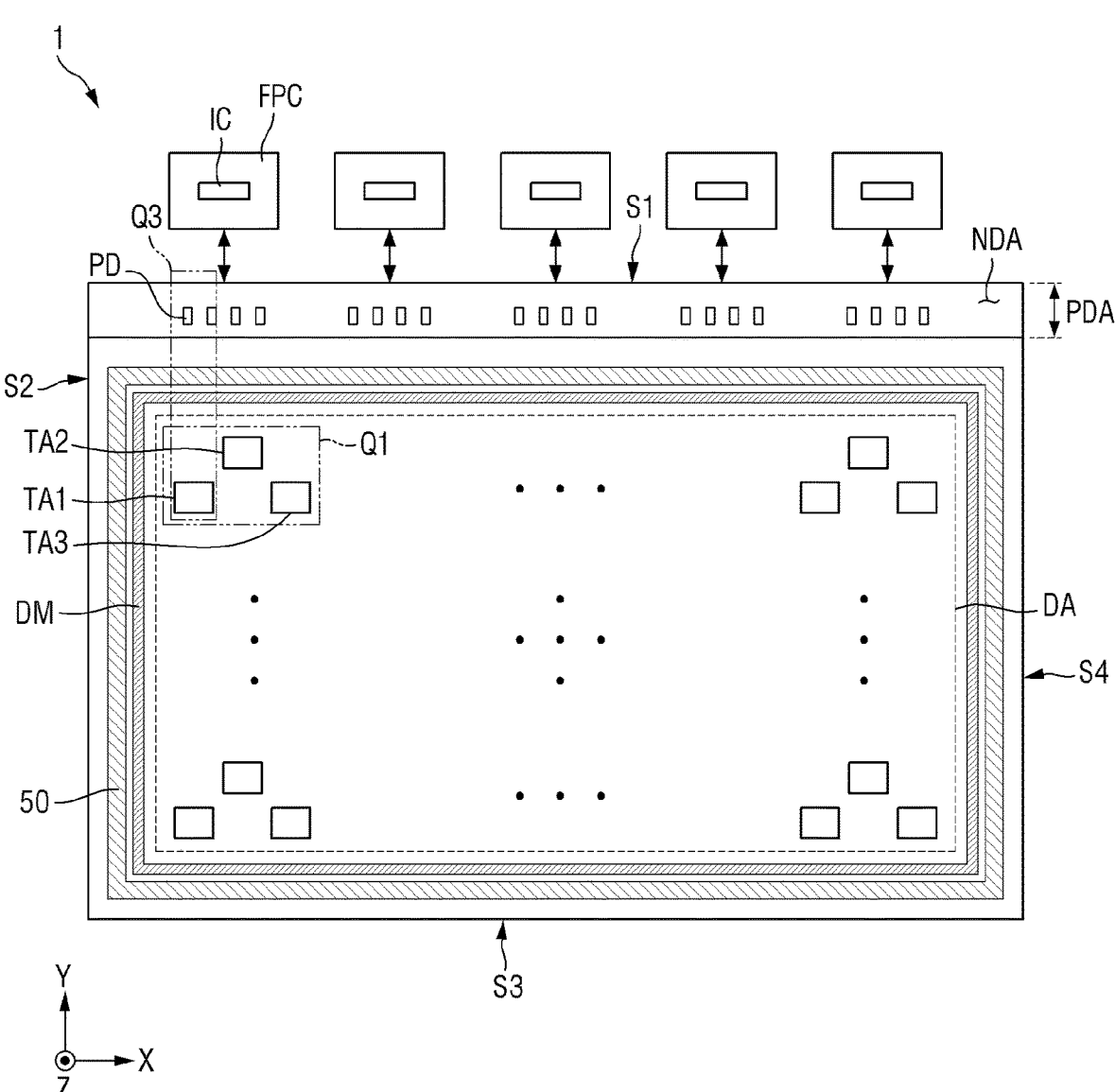
FIG. 4 is a schematic plan view of the display device of FIG. 4.

The source electrodes and the drain electrodes of the first, second, and third transistors T1, T2, and T3 are not limited to the above descriptions. The first, second, and third transistors T1, T2, and T3 may be formed as thin-film transistors (TFTs). FIG. 4 illustrates that the first, second, and third transistors T1, T2, and T3 are formed as N-type metal-oxide semiconductor field-effect transistors (MOSFETs), but embodiments are not limited thereto. In another example, the first, second, and third transistors T1, T2, and T3 may all be formed as P-type MOSFETs. In another example, some of the first, second, and third transistors T1, T2, and T3 may be formed as N-type MOSFETS, and the other transistor(s) may be formed as P-type MOSFETs.

The storage capacitor Cst may be formed between the gate electrode and the source electrode of the first transistor T1. The storage capacitor Cst may store a differential voltage corresponding to the difference in voltage between the gate electrode and the source electrode of the first transistor T1.

FIG. 3 illustrates that the gate electrodes of the second and third transistors T2 and T3 are connected to the same scan line SL and are thus turned on at the same time by the scan signal from the same scan line SL, but embodiments are not limited thereto. In another example, the gate electrodes of the second and third transistors T2 and T3 may be connected to different scan lines SL.

Figure 5:
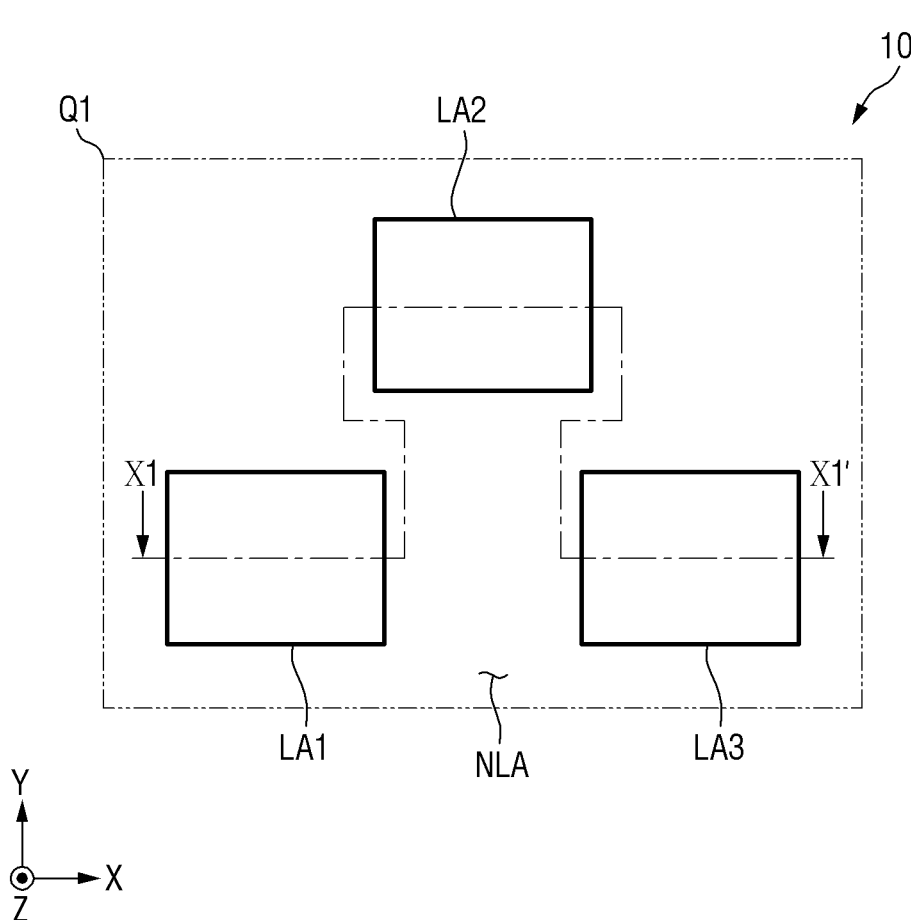
FIG. 5 is a schematic enlarged plan view of part Q1 of FIG. 4 and illustrates a display substrate of the display device of FIG. 4.
Figure 6:
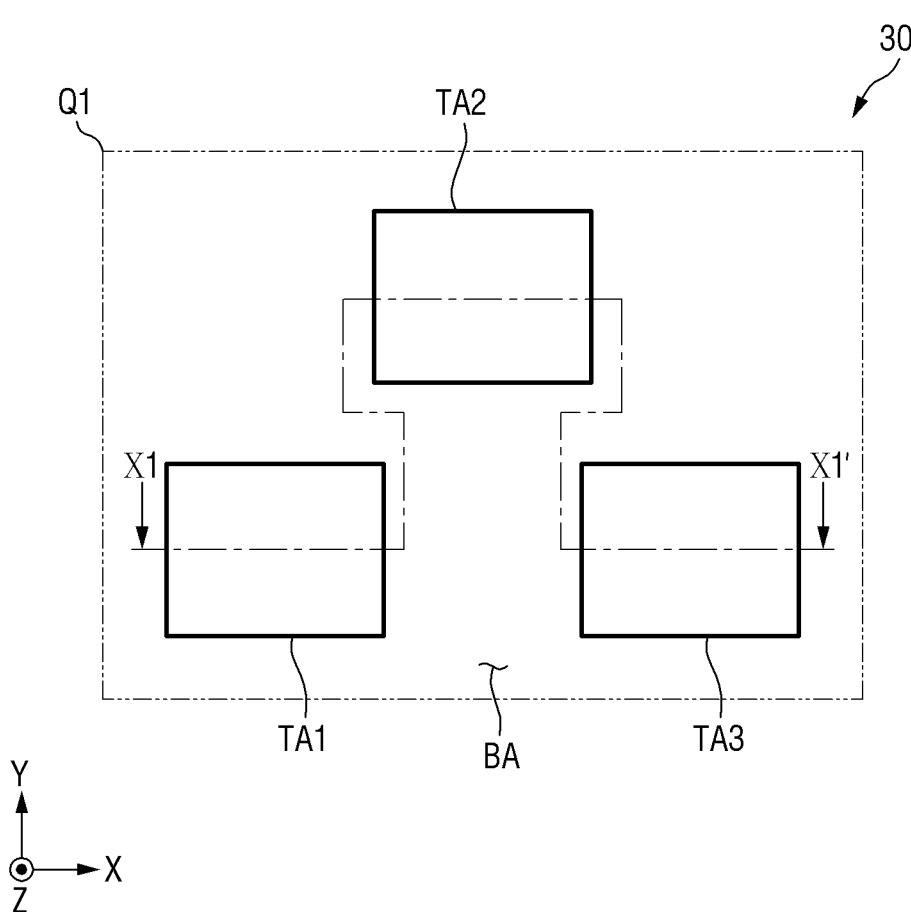
FIG. 6 is a schematic enlarged plan view of part Q1 of FIG. 4 and illustrates a color conversion substrate of the display device of FIG. 4.
Figure 7:
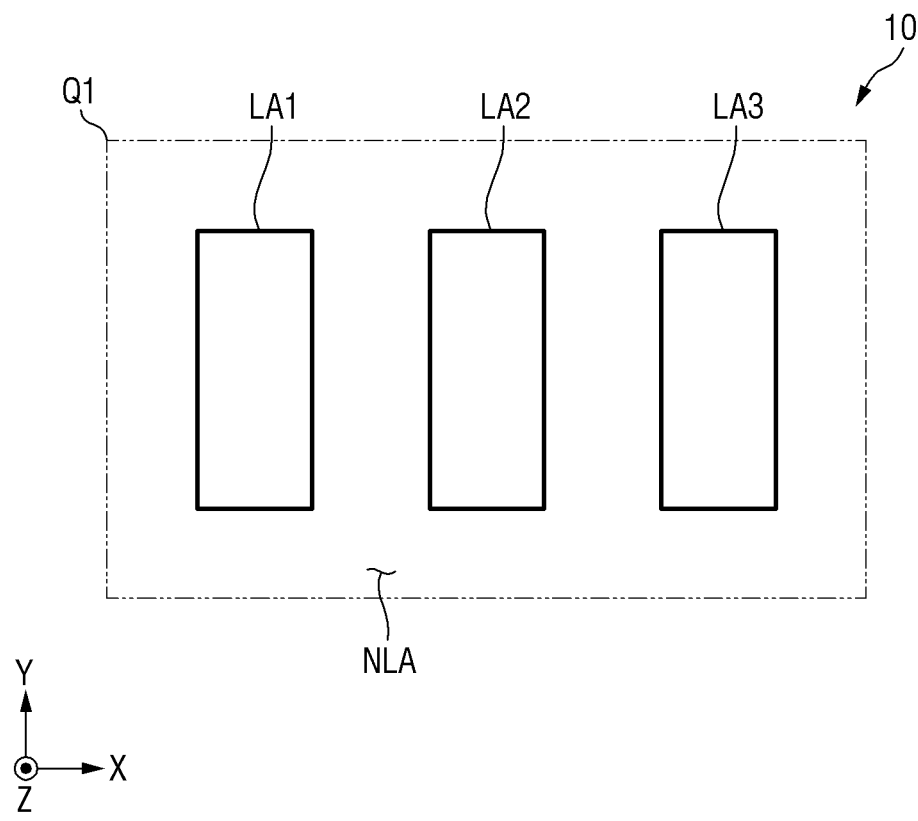
FIG. 7 is a schematic plan view of a modified example of the display substrate of FIG. 5.
Figure 8:
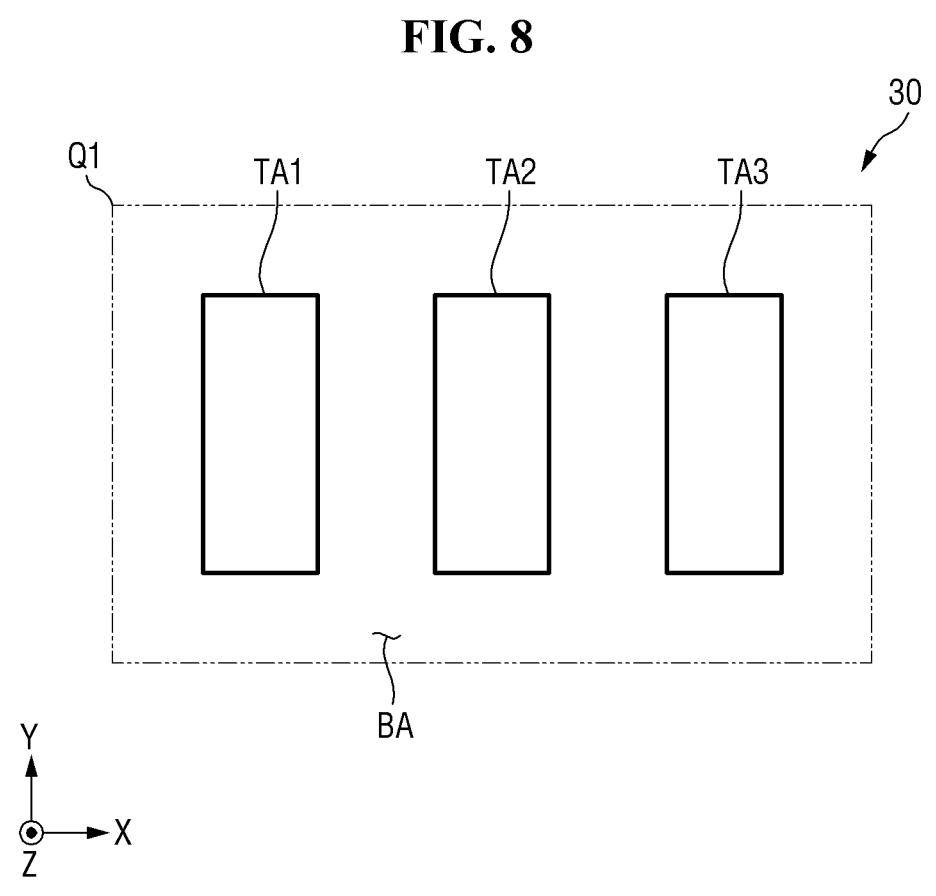
Figure 9:
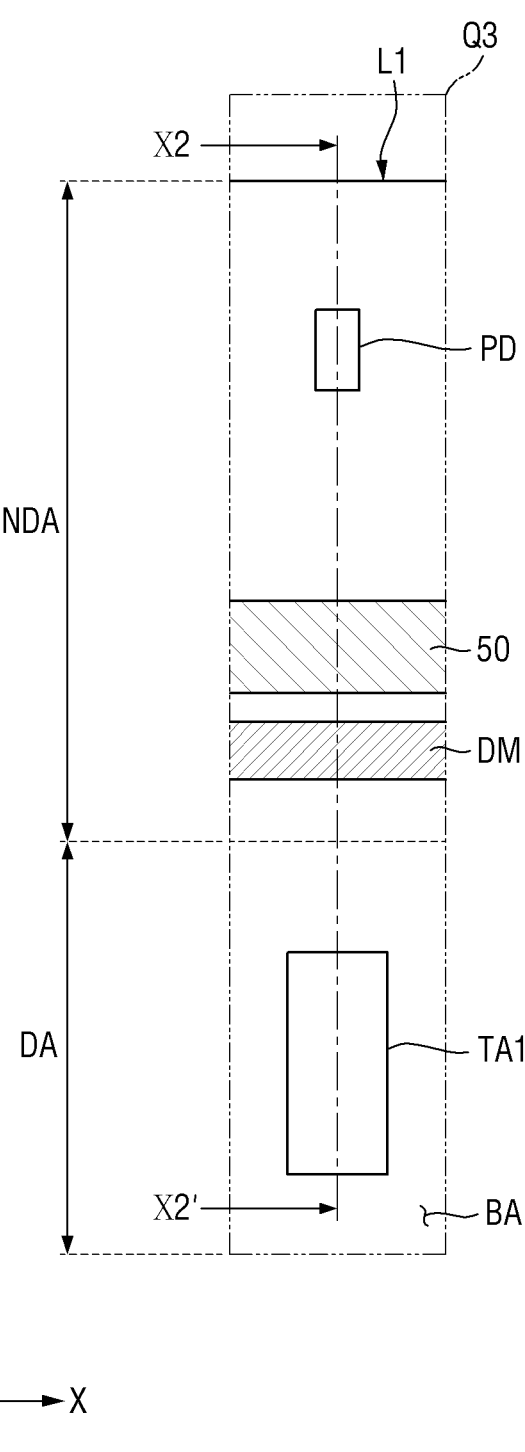
FIG. 9 is a schematic enlarged plan view of part Q3 of FIG. 4.

FIG. 4 is a schematic plan view of the display device 1 of FIG. 1. FIG. 5 is a schematic enlarged plan view of part Q1 of FIG. 4 and illustrates a display substrate of the display device 1 of FIG. 4. FIG. 6 is a schematic enlarged plan view of part Q1 of FIG. 4 and illustrates a color conversion substrate of the display device 1 of FIG. 4. FIG. 7 is a schematic plan view of a modified example of the display substrate 10 of FIG. 5. FIG. 8 is a schematic plan view of a modified example of the color conversion substrate 30 of FIG. 6. FIG. 9 is a schematic enlarged plan view of part Q3 of FIG. 4.

Referring to FIGS. 4 through 9 and further to FIG. 1, the display device 1 may have a rectangular shape in a plan view. The display device 1 may include first and third sides 51 and S3, which extend in the first direction X, and second and fourth sides S2 and S4, which extend in the second direction Y that intersects the first direction X. The corners where the sides of the display device 1 meet may be right-angled, but embodiments are not limited thereto. In some embodiments, the length of the first and third sides 51 and S3 may differ from the length of the second and fourth sides S2 and S4. For example, the first and third sides 51 and S3 may be longer than the second and fourth sides S2 and S4. The shape of the display device 1 is not limited thereto, and the display device 1 may have a shape other than a rectangular shape, such as a circular shape.

The display device 1 may further include flexible circuit boards FPC and driving chips IC.

Light-emitting areas (e.g., LA1, LA2, and LA3) and a non-light-emitting area NLA may be defined on the display substrate 10 in the display area DA.

In the display area DA of the display substrate 10, first, second, and third light-emitting areas LA1, LA2, and LA3 may be defined. The first, second, and third light-emitting areas LA1, LA2, and LA3 may be areas that output light generated by the light-emitting elements of the display substrate 10 to the outside of the display substrate 10, and the non-light-emitting area NLA may be an area that does not output light to the outside of the display substrate 10. In some embodiments, the non-light-emitting area NLA may surround the first, second, and third light-emitting areas LA1, LA2, and LA3 in the display area DA.

In some embodiments, the first, second, and third light-emitting areas LA1, LA2, and LA3 may output light of a third color. In some embodiments, light of the third color may be blue light and may have a peak wavelength of about 440 nm to about 480 nm. For example, the term "peak wavelength" refers to the wavelength at which the intensity of light reaches its maximum.

In some embodiments, the first, second, and third light-emitting areas LA1, LA2, and LA3 may form a group, and a plurality of such groups may be defined in the display area DA.

Referring to FIG. 5, the first and third light-emitting areas LA1 and LA3 may be adjacent to each other in the first direction X, and the second light-emitting area LA2 may be positioned on sides, the second direction Y of the first and third light-emitting areas LA1 and LA3. However, embodiments are not limited to this, and the layout of the first, second, and third light-emitting areas LA1, LA2, and LA3 may vary. For example, the first, second, and third light-emitting areas LA1, LA2, and LA3 may be sequentially arranged along the first direction X. In some embodiments, the first, second, and third light-emitting areas LA1, LA2, and LA3 may form a group, and such groups may be repeatedly arranged along the first and second directions X and Y.

The first, second, and third light-emitting areas LA1, LA2, and LA3 will hereinafter be described as being arranged as illustrated in FIG. 5.

Referring to FIG. 6, light-transmitting areas (e.g., TA1, TA2, and TA3) and a light-blocking area BA may be defined on the color conversion substrate 30 in the display area DA. The light-transmitting areas (e.g., TA1, TA2, and TA3) may be areas that output light emitted from the display substrate 10 to the outside of the display device 1 through the color conversion substrate 30. The light-blocking area BA may be an area that does not transmit light emitted from the display substrate 10 therethrough.

In some embodiments, first, second, and third light-transmitting areas TA1, TA2, and TA3 may be defined on the color conversion substrate 30.

The first light-transmitting area TA1 may correspond to, or overlap, the first light-emitting area LA1. The second and third light-transmitting areas TA2 and TA3 may correspond to, or overlap, the second and third light-emitting areas LA2 and LA3, respectively.

In a case where the first and third light-emitting areas LA1 and LA3 are adjacent to each other in the first direction X and the second light-emitting area LA2 is disposed on sides, in the second direction Y, of the first and third light-emitting areas LA1 and LA3, as illustrated in FIG. 5, the first and third light-transmitting areas TA1 and TA3 may be adjacent to each other in the first direction X, and the second light-transmitting area TA2 may be disposed on sides, in the second direction Y, of the first and third light-transmitting areas TA1 and TA3, as illustrated in FIG. 4.

In some embodiments, in a case where the first, second, and third light-emitting areas LA1, LA2, and LA3 are sequentially arranged along the first direction X, as illustrated in FIG. 7, the first, second, and third light-transmitting areas TA1, TA2, and TA3 may be sequentially arranged along the first direction X, as illustrated in FIG. 8.

In some embodiments, the first, second, and third light-transmitting areas TA1, TA2, and TA3 may have a quadrilateral shape in a plan view, but embodiments are not limited thereto. The quadrilateral shape may be a rectangular or square shape. In another example, the first, second, and third light-transmitting areas TA1, TA2, and TA3 may have a circular shape, an elliptical shape, or another polygonal shape in a plan view.

In some embodiments, light of the third color from the display substrate 10 may be provided to the outside of the display device 1 through the first, second, and third light-transmitting areas TA1, TA2, and TA3. Light output from the first light-transmitting area TA1 to the outside of the display device 1, light output from the second light-transmitting area TA2 to the outside of the display device 1, and light output from the third light-transmitting area TA3 to the outside of the display device 1 may be referred to as first emission light, second emission light, and third emission light, respectively. The first emission light may be light of a first color, the second emission light may be light of a second color, which is different from the first color, and the third emission light may be light of the third color. In some embodiments, light of the third color may be blue light having a wavelength of about 380 nm to about 500 nm and a peak wavelength of about 440 nm to about 480 nm, light of the first color may be red light having a wavelength of about 600 nm to about 780 nm and a peak wavelength of about 610 nm to about 650 nm, and light of the second color may be green light having a wavelength of about 500 nm to about 600 nm and a peak wavelength of about 510 nm to about 550 nm.

The light-blocking area BA may be positioned around the first, second, and third light-transmitting areas TA1, TA2, and TA3 of the color conversion substrate 30 in the display area DA. In some embodiments, the light-blocking area BA may surround the first, second, and third light-transmitting areas TA1, TA2, and TA3. The light-blocking area BA may also be positioned in the non-display area NDA of the display device 1.

The first, second, and third light-transmitting areas TA1, TA2, and TA3 and the light-blocking area BA may be defined on the color conversion substrate 30 in the display area DA, as illustrated in FIG. 6. The first, second, and third light-transmitting areas TA1, TA2, and TA3 may be areas that provide light emitted from the display substrate 10 to the outside of the display device 1 through the color conversion substrate 30. The light-blocking area BA may be an area that does not transmit light emitted from the display substrate 10 therethrough.

Referring again to FIG. 4, a dam member DM and the sealing member 50 may be disposed in the non-display area NDA of the display device 1.

The dam member DM may prevent the spill (or overflowing) of an organic material (or monomer) from an encapsulation layer during the formation of the encapsulation layer in the display area DA and may thus prevent the organic material overflowing from the encapsulation layer from extending to the edge portions of the display device 1.

In some embodiments, the dam member DM may surround (e.g., completely surround) the display area DA in a plan view.

The sealing member 50 may couple the display substrate 10 and the color conversion substrate 30.

The sealing member 50 may be disposed on the outside of the dam member DM in the non-display area NDA, and may surround the dam member DM and the display area DA in a plan view.

The non-display area NDA of the display device 1 may include the pad area PDA, and the connecting pads PD may be positioned in the pad area PDA.

The display substrate 10 of the display device 1 may include the dam member DM and the connecting pads PD.

The flexible circuit boards FPC may be connected to the connecting pads PD. The flexible circuit board FPC may electrically connect circuit boards for providing signals or power for driving the display device 1 to the display substrate 10 of FIG. 1.

The driving chips IC may be electrically connected to the circuit boards and may thus be provided with data and signals. In some embodiments, the driving chips IC may be data driving chips IC and may receive data control signals and image data from the circuit boards and generate and output data voltages corresponding to the image data.

In some embodiments, the driving chips IC may be mounted on the flexible circuit boards FPC. For example, the driving chips IC may be mounted on the flexible circuit boards FPC in a chip-on-film (COF) manner.

As will be described below, data voltages from the driving chips IC and power from the circuit boards may be transmitted to the pixel circuits of the display substrate 10 of FIG. 1 via the flexible circuit boards FPC and the connecting pads PD.

The structure of the display device 1 will hereinafter be described in further detail.

Figure 10:
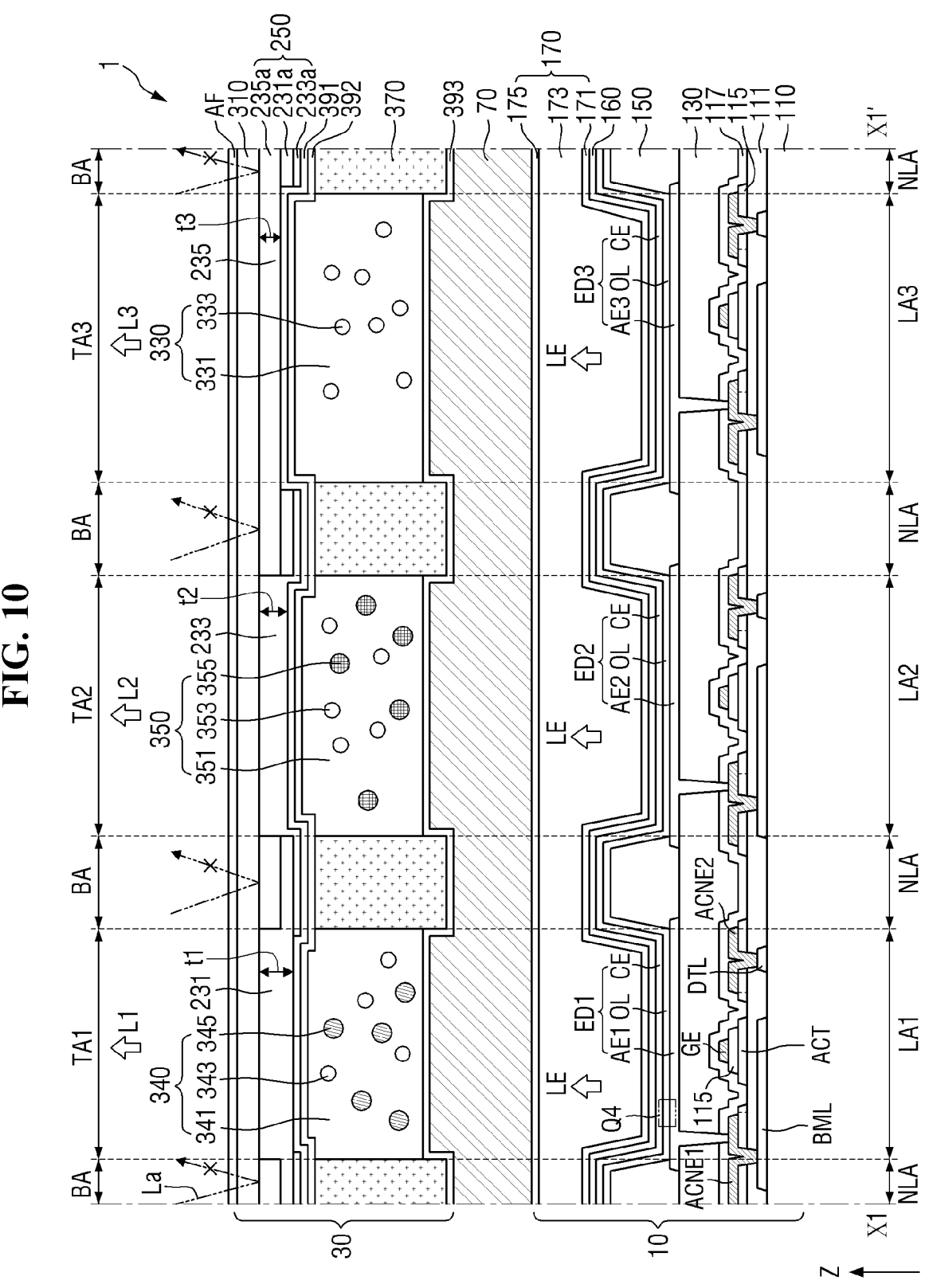
FIG. 10 is a schematic cross-sectional view taken along lines X1-X1' of FIGS. 5 and 6.
Figure 11:
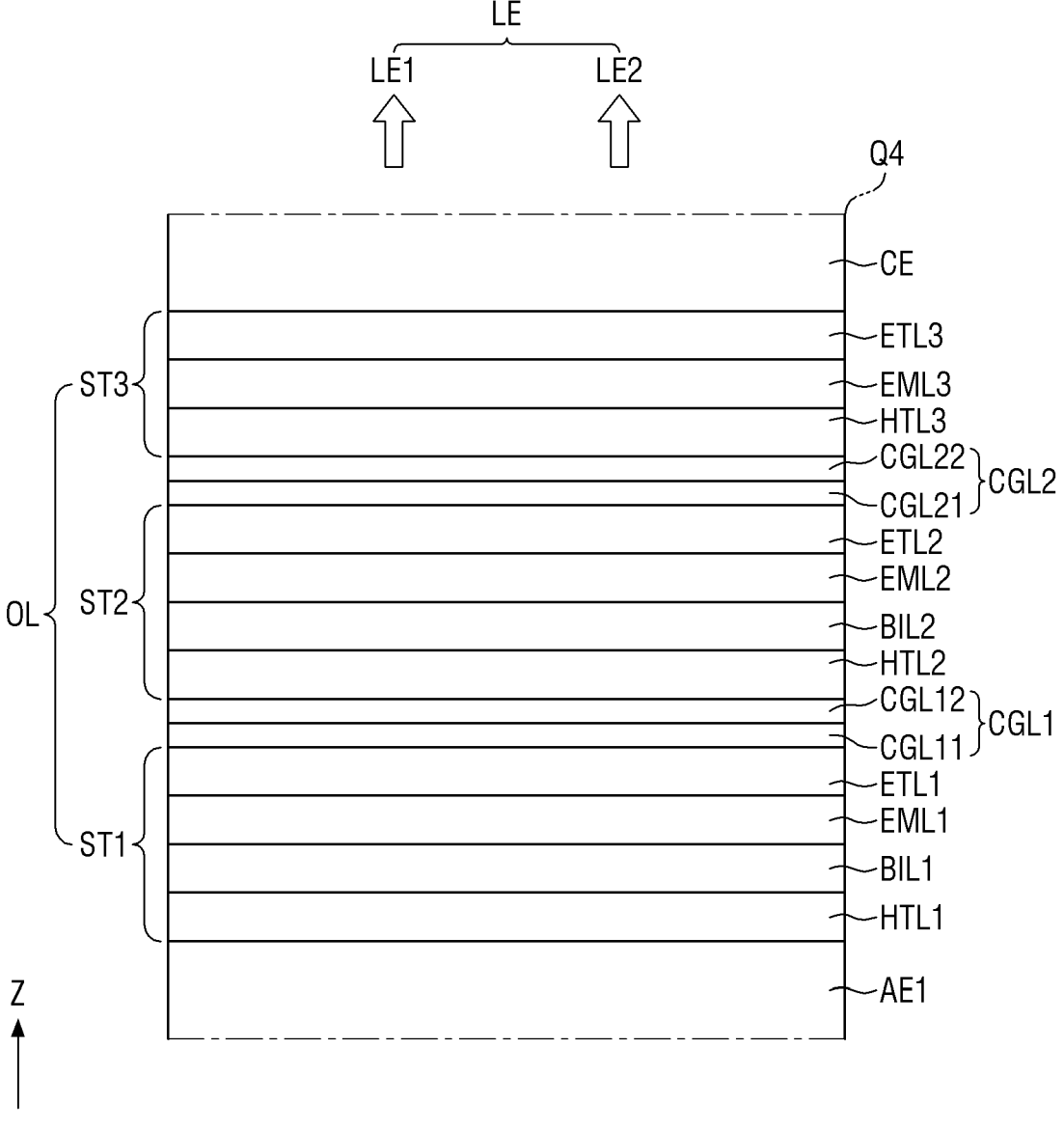
FIG. 11 is a schematic enlarged cross-sectional view of part Q4 of FIG. 10.
Figure 12:
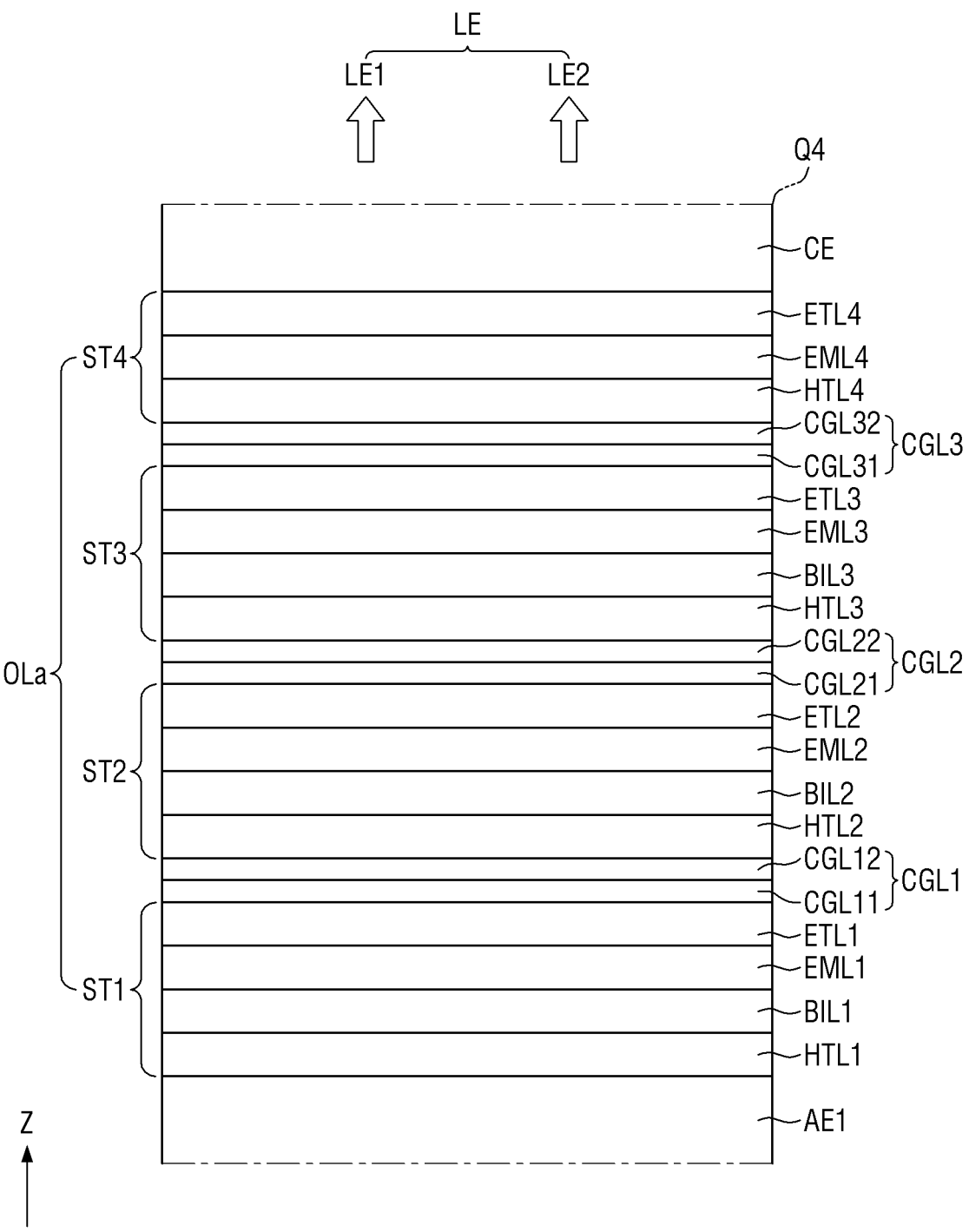
FIG. 12 is a schematic cross-sectional view of a modified example of the structure illustrated in FIG. 11.
Figure 13:
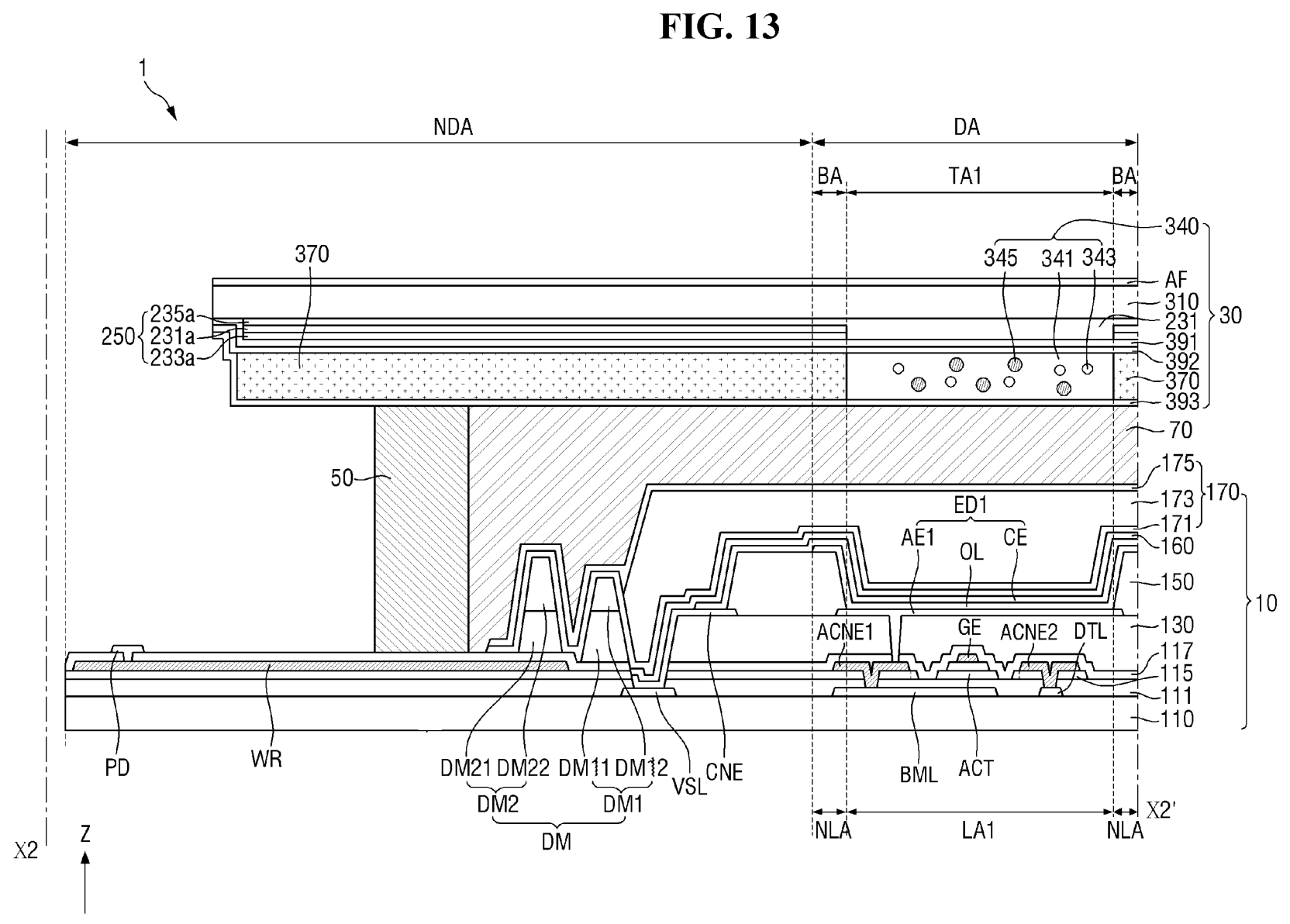

FIG. 10 is a schematic cross-sectional view taken along lines X1-X1' of FIGS. 5 and 6. FIG. 11 is a schematic enlarged cross-sectional view of part Q4 of FIG. 10. FIG. 12 is a schematic cross-sectional view of a modified example of the structure illustrated in FIG. 11. FIG. 13 is a schematic cross-sectional view taken along line X2-X2' of FIG. 9.

Referring to FIGS. 10 through 13 and further to FIGS. 1 through 9, the display device 1 may include the display substrate 10 and the color conversion substrate 30 and may further include the filler 70, which is positioned between the display substrate 10 and the color conversion substrate 30.

The display substrate 10 will hereinafter be described.

A first base part 110 may be formed of a material having light transmittance. The first base part 110 may be a glass substrate or a plastic substrate. In a case where the first base part 110 is a plastic substrate, the first base part 110 may have flexibility.

In some embodiments, light-emitting areas, i.e., first, second, and third light-emitting areas LA1, LA2, and LA3, and a non-light-emitting area NLA may be defined on the first base part 110 in the display area DA.

The four sides of the display device 1, e.g., the first, second, third, and fourth sides 51, S2, S3, and S4, may coincide with the four sides of the first base part 110. For example, the first, second, third, and fourth sides 51, S2, S3, and S4 of the display device 1 may also be referred to as the first, second, third, and fourth sides 51, S2, S3, and S4 of the first base part 110.

A first conductive layer may be positioned on the first base part 110. The first conductive layer may include a lower light-blocking layer BML and data lines DTL. The lower light-blocking layer BML may overlap second semiconductor parts of a semiconductor layer ACT in a thickness direction, and the data lines DTL may overlap third semiconductor parts of the semiconductor layer ACT in the thickness direction.

The lower light-blocking layer BML may prevent external light or light emitted by the light-emitting elements from entering the semiconductor layer ACT. Accordingly, the occurrence of leakage currents in thin-film transistors (TFTs) may be prevented.

The lower light-blocking layer BML may be formed of a conductive material capable of blocking light. For example, the lower light-blocking layer BML may include silver (Ag), nickel (Ni), gold (Au), platinum (Pt), aluminum (Al), copper (Cu), molybdenum (Mo), titanium (Ti), neodymium (Nd), or an alloy thereof. In some embodiments, the lower light-blocking layer BML may have a single structure or a multilayer structure. For example, in a case where the lower light-blocking layer BML has a multilayer structure, the lower light-blocking layer BML may include a stack of Ti/Cu/indium tin oxide (ITO) or Ti/Cu/aluminum oxide ($Al_2O_3$), but embodiments are not limited thereto.

In some embodiments, lower light-blocking layers BML may be provided to correspond to, and overlap, the semiconductor layer ACT. In some embodiments, the width of the lower light-blocking layer BML may be greater than the width of the semiconductor layer ACT.

The buffer layer 111 may be disposed on the lower light-blocking layer BML. The buffer layer 111 may be positioned on the first base part 110 and may be disposed in the display area DA and the non-display area NDA. The buffer layer 111 may block any foreign material or moisture that penetrates (or permeates) into the display device 1 through the first base part 110. For example, the buffer layer 111 may include an inorganic material such as silicon oxide ($SiO_2$), silicon nitride ($SiN_x$), or silicon oxynitride (SiON) and may be formed as a single film or a multilayer film.

The semiconductor layer ACT may be positioned on the buffer layer 111. The semiconductor layer ACT may be disposed in the display area DA and the non-display area NDA. The semiconductor layer ACT may be disposed in the display area DA to correspond to the first, second, and third light-emitting areas LA1, LA2, and LA3 and form the scan lines SL, the data lines DTL, the initialization voltage lines VIL, the first voltage lines VL1, and the second voltage lines VL2. The semiconductor layer ACT may also form the semiconductor layer ACT of each thin-film transistor (TFT), e.g., the first, second, and third transistors T1, T2, and T3 of FIG. 3. The semiconductor layer ACT will hereinafter be described as being used as the semiconductor layer ACT of each thin-film transistor (TFT). The semiconductor layer ACT may include first semiconductor parts overlapping gate electrodes GE, second semiconductor parts on sides of the first semiconductor parts, and third semiconductor parts on other sides of the first semiconductor parts. The structure and the functions of the semiconductor layer ACT will be described below.

The semiconductor layer ACT may include an oxide semiconductor. The semiconductor layer ACT may be formed of zinc oxide (ZnO) or a ZnO-based material such as indium zinc oxide (IZO) or indium gallium zinc oxide (IGZO) and may be, for example, an IGZO semiconductor, which is ZnO including metals such as indium (In) and gallium (Ga), but embodiments are not limited thereto. In another example, the semiconductor layer ACT may include amorphous silicon or polysilicon.

A gate insulating layer 115 may be positioned on the semiconductor layer ACT. In some embodiments, the gate insulating layer 115 may be positioned in the display area DA and the non-display area NDA. In some embodiments, the gate insulating layer 115 may include an inorganic material such as $SiO_2$, $SiN_x$, SiON, aluminum oxide ($Al_2O_3$), titanium oxide ($TiO_2$), tantalum oxide ($Ta_2O$), hafnium oxide ($HfO_2$), or zirconium oxide ($ZrO_2$). The gate insulating layer 115 may overlap connecting electrodes (e.g., ACNE1 and ACNE2) and the gate electrodes GE.

A second conductive layer (or a gate conductive layer) may be positioned on the gate insulating layer 115 and may include the gate electrodes GE, gate metals WR, first connecting electrodes ACNE1, and second connecting electrodes ACNE2. The gate electrodes GE, the first connecting electrodes ACNE1, and the second connecting electrodes ACNE2 may be positioned in the display area DA and may overlap the semiconductor parts of the semiconductor layer ACT. Referring to FIGS. 2 and 13, the gate metals WR may include parts of lines electrically connecting the connecting pads PD and the elements disposed in the display area DA, such as thin-film transistors (TFTs), e.g., the first, second, and third transistors T1, T2, and T3, and light-emitting elements. For example, the gate metals WR may electrically connect the connecting pads PD to the data lines DTL. For example, data signals applied through the connecting pads PD may be provided to the data lines DTL through the gate metals WR.

The gate electrodes GE may overlap the first semiconductor parts of the semiconductor layer ACT. The first semiconductor parts may be spaced apart from the gate electrodes GE by the gate insulating layer 115.

The connecting electrodes (e.g., ACNE1 and ACNE2) may overlap, and be electrically connected to, the second semiconductor parts and the third semiconductor parts of the semiconductor layer ACT. The connecting electrodes (e.g., ACNE1 and ACNE2) may be connected to the lower light-blocking layer BML and the data lines DTL of the first conductive layer. The first connecting electrodes ACNE1 may be the drain electrodes of thin-film transistors (TFTs), and the second connecting electrodes ACNE2 may be the source electrodes of the thin-film transistors (TFTs). For example, the second semiconductor parts of the semiconductor layer ACT that are connected to the first connecting electrodes ACNE1 may be drain regions, and the third semiconductor parts of the semiconductor layer ACT that are connected to the second connecting electrodes ACNE2 may be source regions.

For adhesion to neighboring layers, surface flatness, and processability, the second conductive layer (e.g., the gate electrodes GE, the gate metals WR, the first connecting electrodes ACNE1, and the second connecting electrodes ACNE2) may include at least one of Al, Pt, palladium (Pd), Ag, Mg, Au, Ni, Nd, iridium (Ir), chromium (Cr), lithium (Li), calcium (Ca), Mo, Ti, tungsten (W), and Cu and may be formed as a single film or a multilayer film, but embodiments are not limited thereto. In some embodiments, the second conductive layer may include a transparent conductive oxide (TCO). For example, the second conductive layer may include tungsten oxide ($W_xO_x$), $TiO_2$, ITO, IZO, ZnO, indium tin zinc oxide (ITZO), or magnesium oxide (MgO).

For example, the second conductive layer may have a structure in which Ti, Cu, and ITO are stacked, but embodiments are not limited thereto.

A passivation layer 117 may be disposed on the second conductive layer. In some embodiments, the passivation layer 117 may be positioned in the display area DA and the non-display area NDA. In some embodiments, the passivation layer 117 may include an inorganic material such as $SiO_2$, $SiN_x$, SiON, $Al_2O_3$, $TiO_2$, $Ta_2O$, $HfO_2$, or $ZrO_2$.

A via layer 130 may be positioned on the passivation layer 117. The via layer 130 may cover the thin-film transistors (TFTs) in the display area DA, and may expose part of a power supply line VSL in the non-display area NDA.

In some embodiments, the via layer 130 may be a planarization film. In some embodiments, the via layer 130 may be formed of an organic material. For example, the via layer 130 may include an acrylic resin, an epoxy resin, an imide resin, or an ester resin. In some embodiments, the via layer 130 may include a photosensitive organic material.

In the display area DA, first, second, and third anode electrodes AE1, AE2, and AE3 may be positioned on the via layer 130. The connecting electrodes (e.g., ACNE1 and ACNE2) and the connecting pads PD may be positioned on the via layer 130 in the non-display area NDA.

The first anode electrode AE1 may overlap the first light-emitting area LA1, and at least part of the first anode electrode AE1 may expand into the non-light-emitting area NLA. The second anode electrode AE2 may overlap the second light-emitting area LA2, and at least part of the second anode electrode AE2 may expand into the non-light-emitting area NLA. The third anode electrode AE3 may overlap the third light-emitting area LA3, and at least part of the third anode electrode AE3 may expand into the non-light-emitting area NLA.

The first anode electrode AE1 may be connected to the drain region of a thin-film transistor (TFT) corresponding to the first anode electrode AE1 through the via layer 130, the second anode electrode AE2 may be connected to the drain region of the thin-film transistor (TFT) corresponding to the second anode electrode AE2 through the via layer 130, and the third anode electrode AE3 may be connected to the drain region of the thin-film transistor (TFT) corresponding to the third anode electrode AE3 through the via layer 130. The first, second, and third anode electrodes AE1, AE2, and AE3 may be connected to the drain regions of the thin-film transistors (TFTs) (or the second semiconductor parts) through the first connecting electrodes ACNE1 (or the drain electrodes).

In some embodiments, the first, second, and third anode electrodes AE1, AE2, and AE3 may be reflective electrodes, in which case, the first, second, and third anode electrodes AE1, AE2, and AE3 may be metal layers including a metal such as Ag, Mg, Al, Pt, Pd, Au, Ni, Nd, Ir, or Cr. In some embodiments, the first, second, and third anode electrodes AE1, AE2, and AE3 may further include metal oxide layers deposited on the metal layers. The first, second, and third anode electrodes AE1, AE2, and AE3 may have a multilayer stack structure, for example, a double-layer structure such as ITO/Ag, Ag/ITO, ITO/Mg, or ITO/MgF or a triple-layer structure such as ITO/Ag/ITO.

The connecting electrodes (e.g., ACNE1 and ACNE2) may be electrically connected to (or in direct contact with) the power supply line VSL in the non-display area NDA. For example, in some embodiments, the connecting electrodes (e.g., ACNE1 and ACNE2) may be disposed in the display area DA and may be electrically connected to the power supply line VSL in the display area DA.

The connecting pads PD may be disposed in the non-display area NDA and may be electrically connected to the gate metals WR of the second conductive layer.

The pixel-defining layer 150 may be positioned on the first, second, and third anode electrodes AE1, AE2, and AE3. The pixel-defining layer 150 may include openings, which expose the first, second, and third anode electrodes AE1, AE2, and AE3, and may define the first, second, and third light-emitting areas LA1, LA2, and LA3. For example, part of the first anode electrode AE1, which is not covered and is exposed by the pixel-defining layer 150, may be the first light-emitting area LA1, part of the second anode electrode AE2, which is not covered and is exposed by the pixel-defining layer 150, may be the second light-emitting area LA2, and part of the third anode electrode AE3, which is not covered and is exposed by the pixel-defining layer 150, may be the third light-emitting area LA3. An area where the pixel-defining layer 150 is disposed may be the non-light-emitting area NLA.

In some embodiments, the pixel-defining layer 150 may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or benzo-cyclobutene (BCB).

The pixel-defining layer 150 may overlap a light-blocking pattern layer 250 that will be described. In some embodiments, the pixel-defining layer 150 may also overlap a bank pattern layer 370 that will be described.

Referring to FIGS. 10 and 13, a light-emitting layer OL may be disposed on the first, second, and third anode electrodes AE1, AE2, and AE3.

In some embodiments, the light-emitting layer OL may be in the form of a film formed continuously over the first, second, and third light-emitting areas LA1, LA2, and LA3 and the non-light-emitting area NLA. In some embodiments, the light-emitting layer OL may be positioned only in the display area DA, but embodiments are not limited thereto. In some embodiments, part of the light-emitting layer OL may be further disposed in the non-display area NDA. The light-emitting layer OL will be described below in detail.

The cathode electrode CE may be positioned on the light-emitting layer OL. Part of the cathode electrode CE may be further disposed in the non-display area NDA. The cathode electrode CE may be electrically connected to (or in contact with) the connecting electrodes (e.g., ACNE1 and ACNE2) in the non-display area NDA. A driving voltage ELVSS provided to the power supply line VSL may be transmitted to the cathode electrode CE through the connecting electrodes (e.g., ACNE1 and ACNE2).

In some embodiments, the cathode electrode CE may be semitransparent or transparent. In a case where the cathode electrode CE is semitransparent, the cathode electrode CE may include Ag, Mg, Cu, Al, Pt, Pd, Au, Ni, Nd, Ir, Cr, Li, Ca, LiF/Ca, LiF/Al, Mo, Ti, or a compound or mixture thereof, for example, the mixture of Ag and Mg. In another example, in a case where the cathode electrode CE has a thickness of dozens to hundreds of angstroms, the cathode electrode CE may be semitransparent.

In a case where the cathode electrode CE is transparent, the cathode electrode CE may include a TCO. For example, the cathode electrode CE may include $W_xO_x$, $TiO_2$, ITO, IZO, ZnO, ITZO, or MgO.

In some embodiments, the cathode electrode CE may cover (e.g., completely cover) the light-emitting layer OL. In some embodiments, as illustrated in FIG. 13, the end portion of the cathode electrode CE may be positioned on the outside of the end portion of the light-emitting layer OL, and the end portion of the light-emitting layer OL may be covered (e.g., completely covered) by the cathode electrode CE.

The first anode electrode AE1, the light-emitting layer OL, and the cathode electrode CE may form a first light-emitting element ED1, the second anode electrode AE2, the light-emitting layer OL, and the cathode electrode CE may form a second light-emitting element ED2, and the third anode electrode AE3, the light-emitting layer OL, and the cathode electrode CE may form a third light-emitting element ED3. The first, second, and third light-emitting elements ED1, ED2, and ED3 may emit emission light LE.

As illustrated in FIG. 11, the emission light LE, which is finally emitted from the light-emitting layer OL, may be a mixed light having first and second components LE1 and LE2. The first and second components LE1 and LE2 may have a peak wavelength of about 440 nm to about 480 nm. For example, the emission light LE may be blue light.

As illustrated in FIG. 11, in some embodiments, the light-emitting layer OL may have, for example, a tandem structure in which light emission layers are laid over one another, as illustrated in FIG. 7. For example, the light-emitting layer OL may include a first stack ST1, which includes a first light emission layer EML1, a second stack ST2, which is positioned on the first stack ST1 and includes a second light emission layer EML2, a third stack ST3, which is positioned on the second stack ST2 and includes a third light emission layer EML3, a first charge generation layer CGL1, which is positioned between the first and second stacks ST1 and ST2, and a second charge generation layer CGL2, which is positioned between the second and third stacks ST2 and ST3. The first, second, and third stacks ST1, ST2, and ST3 may overlap one another.

The first, second, and third light emission layers EML1, EML2, and EML3 may overlap each other.

In some embodiments, the first, second, and third light emission layers EML1, EML2, and EML3 may all emit light of blue wavelength light. The first, second, and third light emission layers EML1, EML2, and EML3 may all be blue-light emission layers and may include an organic material.

In some embodiments, at least one of the first, second, and third light emission layers EML1, EML2, and EML3 may emit first blue light having a first peak wavelength, and at least another one of the first, second, and third light emission layers EML1, EML2, and EML3 may emit second blue light having a second peak wavelength, which is different from the first peak wavelength. For example, one of the first, second, and third light emission layers EML1, EML2, and EML3 may emit the first blue light having the first peak wavelength, and the other two light emission layers may emit the second blue light having the second peak wavelength. For example, the emission light LE, which is finally emitted from the light-emitting layer OL, may be a mixed light having the first and second components LE1 and LE2, the first component LE1 may be the first blue light having the first peak wavelength, and the second component LE2 may be the second blue light having the second peak wavelength.

In some embodiments, one of the first and second peak wavelengths may range between about 440 nm and about 460 nm, and the other peak wavelength may range between about 460 nm and about 480 nm. However, embodiments are not limited thereto. In some embodiments, the first and second peak wavelengths may include about 460 nm. In some embodiments, one of the first blue light and the second blue light may be a deep-blue light, and the other blue light may be a sky-blue light.

In some embodiments, the emission light LE may be a blue light and may include long- and short-wavelength components. Thus, the light-emitting layer OL may emit a blue light with a broad emission peak as the emission light LE. Accordingly, color visibility at side viewing angles may be improved, as compared to conventional light-emitting elements emitting blue light with a sharp emission peak.

In some embodiments, each of the first, second, and third light emission layers EML1, EML2, and EML3 may include a host and a dopant. The material of the host is not limited. For example, tris(8-hydroxyquinolino)aluminum (Alq3), 4,4'-bis(N-carbazolyl)-1,1'-biphenyl (CBP), poly(n-vinyl-carbazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TB ADN), distyrylarylene (DSA), 4,4'-bis(9-carbazolyl)-2,2'-dimethyl-biphenyl (CDBP), or 2-methyl-9,10-bis(naphthalen-2-yl)an-thracene (MADN) may be used as the host.

For example, the first, second, and third light emission layers EML1, EML2, and EML3, which emit blue light, may include a fluorescent material selected from the group con-sisting of spiro-DPVBi, spiro-6P, distyryl benzene (DSB), distyryl arylene (DSA), a polyfluorene (PFO)-based poly-mer, and poly(p-phenylene vinylene) (PPV). In another example, the first, second, and third light emission layers EML1, EML2, and EML3 may include a phosphorescent material including an organometallic complex such as (4,6-F2ppy)2Irpic.

As already mentioned above, at least one of the first, second, and third light emission layers EML1, EML2, and EML3 may emit blue light having a different wavelength range from at least another one of the first, second, and third light emission layers EML1, EML2, and EML3. To emit blue light of different wavelength ranges, the first, second, and third light emission layers EML1, EML2, and EML3 may include the same material, and a method of controlling a resonance distance may be used. In another example, to emit blue light of different wavelength ranges, at least two of the first, second, and third light emission layers EML1, EML2, and EML3 may include different materials.

However, embodiments are not limited thereto. In another example, the first, second, and third light emission layers EML1, EML2, and EML3 may all emit blue light having a peak wavelength of about 440 nm to about 480 nm and may be formed of the same material.

In another example, one of the first, second, and third light emission layers EML1, EML2, and EML3 may emit the first blue light having the first peak wavelength, another one of the first, second, and third light emission layers EML1, EML2, and EML3 may emit the second blue light having the second peak wavelength, which is different from the first peak wavelength, and the other light emission layer may emit third blue light having a third peak wavelength, which is different form the first and second peak wavelengths. In some embodiments, one of the first, second, and third peak wavelengths may range between about 440 nm and about 460 nm, and another one of the first, second, and third peak wavelengths may range between about 460 nm and about 470 nm, and the other peak wavelength may range between about 470 nm and about 480 nm.

In some embodiments, the emission light LE, which is emitted from the light-emitting layer OL, may be blue light and may include long-wavelength component, intermediate-wavelength component, and short-wavelength component. Thus, the light-emitting layer OL may emit blue light having a broad emission peak as the emission light LE and may improve color visibility at side viewing angles.

The light-emitting elements of the display device 1 may improve an optical efficiency as compared to conventional light-emitting elements not employing a tandem structure in which multiple light emission layers are stacked, and may lengthen the life of the display device 1.

In another example, at least one of the first second, and third light emission layers EML1, EML2, and EML3 may emit light of the third color, for example, blue light, at least another one of the first second, and third light emission layers EML1, EML2, and EML3 may emit light of the second color, for example, green light. The peak wavelength of blue light emitted by at least one of the first second, and third light emission layers EML1, EML2, and EML3 may range between about 440 nm and about 480 nm or between about 460 nm and about 480 nm, and the peak wavelength of green light emitted by at least another one of the first second, and third light emission layers EML1, EML2, and EML3 may range between about 510 nm and about 550 nm.

For example, one of the first second, and third light emission layers EML1, EML2, and EML3 may be a green-light emission layer emitting green light, and the other two light emission layers may be blue-light emission layers emitting blue light. In this example, the peak wavelength range of blue light emitted by one of the two blue-light emission layers may coincide with (or differ from) the peak wavelength range of blue light emitted by the other blue-light emission layer.

In another example, the emission light LE, which is emitted from the light-emitting layer OL, may be a mixed light having the first and second components LE1 and LE2 mixed therein, and the first and second components LE1 and LE2 may be blue light and green light, respectively. For example, in a case where the first and second components LE1 and LE2 are deep-blue light and green light, respec-tively, the emission light LE may be sky-blue light. The emission light LE, which is emitted from the light-emitting layer OL, may be the mixture of blue light and green light and may include long- and short-wavelength components. Thus, the light-emitting layer OL may emit blue light with a broad emission peak as the emission light LE and may improve color visibility at side viewing angles. As the second component LE2 of the emission light LE is green light, the green-light component of light to be emitted to the outside of the display device 1 may be compensated for, and as a result, the color reproducibility of the display device 1 may be improved.

In some embodiments, a green-light emission layer among the first, second, and third light emission layers EML1, EML2, and EML3 may include a host and a dopant. The material of the host of the green-light emission layer is not limited. The host of the green-light emission layer may include, for example, Alq3, 4,4'-bis(N-carbazolyl)-1,1'-bi-phenyl (CBP), poly(n-vinylcarbazole) (PVK), 9,10-di(naph-thalene-2-yl)anthracene (ADN), TCTA, 1,3,5-tris(N-phenylbenzimidazole-2-yl)benzene (TPBi), 3-tert-butyl-9,10-di (naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN).

The dopant of the green-light emission layer may include, for example, a fluorescent material including Alq3 or a phosphorescent material such as fac-tris(2-phenylpyridine) iridium (Ir(ppy)3), bis(2-phenylpyridine)(acetylacetonate) iridium(III) (Ir(ppy)2(acac)), or 2-phenyl-4-methyl-pyridine iridium (Ir(mpyp)3).

The first charge generation layer CGL1 may be positioned between the first and second stacks ST1 and ST2. The first charge generation layer CGL1 may inject electric charge into the light-emitting layer OL. The first charge generation layer CGL1 may balance electric charge between the first and second stacks ST1 and ST2. The first charge generation layer CGL1 may include an n-type charge generation layer CGL11 and a p-type charge generation layer CGL12. The p-type charge generation layer CGL12 may be disposed on the n-type charge generation layer CGL11 and may be positioned between the n-type charge generation layer CGL11 and the second stack ST2.

The first charge generation layer CGL1 may have a structure in which the n-type charge generation layer CGL11 and the p-type charge generation layer CGL12 are bonded together. The n-type charge generation layer CGL11 may be disposed closer to the first anode electrode AE1 than to the cathode electrode CE. The p-type charge generation layer CGL12 may be disposed closer to the cathode electrode CE than to the first anode electrode AE1. The n-type charge generation layer CGL11 may provide electrons to the first light emission layer EML1, which is adjacent to the first anode electrode AE1, and the p-type charge generation layer CGL12 may provide holes to the second light emission layer EML2, which is included in the second stack ST2. As the first charge generation layer CGL1 is disposed between the first and second stacks ST1 and ST2 and provides charge to the light-emitting layer OL, an emission efficiency may be improved, and a driving voltage may be lowered.

The first stack ST1 may be positioned on the first, second, and third anode electrodes AE1, AE2, and AE3 and may further include a first hole transport layer HTL1, a first electron blocking layer BILL and a first electron transport layer ETL1.

The first hole transport layer HTL1 may be positioned on the first, second, and third anode electrodes AE1, AE2, and AE3. The first hole transport layer HTL1 may facilitate (or perform) the transport of holes and may include a hole transport material. The hole transport material may include a carbazole derivative such as N-phenylcarbazole or poly-vinylcarbazole, a fluorene derivative, a triphenylamine derivative such as N,N'-bis(3-methylphenyl)-N,N'-diphe-nyl-[1,1-biphenyl]-4,4'-diamine (TPD) or TCTA, N,N'-di(1-naphthyl)-N,N'-diphenylbenzidine (NPB), or 4,4'-Cyclohex-ylidene bis[N,N-bis(4-methylphenyl)benzenamine] (TAPC), but embodiments are not limited thereto.

The first electron blocking layer BIL1 may be positioned on the first hole transport layer HTL1, and may be posi-tioned between the first hole transport layer HTL1 and the first light emission layer EML1. The first electron blocking layer BIL1 may include a hole transport material and a metal (or a metal compound) to prevent electrons generated in the first light emission layer EML1 from spilling over (or overflowing) to the first hole transport layer HTL1. In some embodiments, the first hole transport layer HTL1 and the first electron blocking layer BIL1 may be incorporated into a single layer.

The first electron transport layer ETL1 may be positioned on the first light emission layer EML1, and may be posi-tioned between the first charge generation layer CGL1 and the first light emission layer EML1. In some embodiments, the first electron transport layer ETL1 may include an electron transport material such as Alq3, TPBi, 2,9-Dim-ethyl-4,7-diphenyl-1,10-phenanthroline (BCP), 4,7-Diphe-nyl-1,10-phenanthroline (Bphen), 3-(4-Biphenylyl)-4-phe-nyl-5-tert-butylphenyl-1,2,4-triazole (TAZ), 4-(Naphthalen-1-yl)-3,5-diphenyl-4H-1,2,4-triazole (NTAZ), (2-(4-Biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum) (BAlq), berylliumbis(benzoquinolin-10-olate) (Bebq2), AND, or a mixture thereof, but embodiments are not limited thereto. The second stack ST2 may be positioned on the first charge generation layer CGL1 and may further include a second hole transport layer HTL2, a second electron blocking layer BIL2, and a second electron transport layer ETL2.

The second hole transport layer HTL2 may be positioned on the first charge generation layer CGL1. The second hole transport layer HTL2 may be formed of the same material, and have the same structure, as the first hole transport layer HTL1. The second hole transport layer HTL2 may include at least one selected from among the above-described mate-rials that is included in the first hole transport layer HTL1. The second hole transport layer HTL2 may be formed as a single-layer film or a multilayer film.

The second electron blocking layer BIL2 may be posi-tioned on the second hole transport layer HTL2, and may be positioned between the second hole transport layer HTL2 and the first light emission layer EML1. The second electron blocking layer BIL2 may be formed of the same material, and in the same structure, as the first electron blocking layer BIL1. The second electron blocking layer BIL2 may include at least one selected from among the above-described mate-rials that is included in the first electron blocking layer BILL The second electron transport layer ETL2 may be posi-tioned on the second light emission layer EML2, and may be positioned between the second charge generation layer CGL2 and the second light emission layer EML2. The second electron transport layer ETL2 may be formed of the same material, and have the same structure, as the first electron transport layer ETL1. The second electron transport layer ETL2 may include at least one selected from among the above-described materials that is included in the first electron transport layer ETL1. The second electron transport layer ETL2 may be formed as a single-layer film or a multilayer film.

The second charge generation layer CGL2 may be posi-tioned on the second stack ST2, and may be positioned between the second and third stacks ST2 and ST3.

The second charge generation layer CGL2 may have the same structure as the first charge generation layer CGL1. For example, the second charge generation layer CGL2 may include an n-type charge generation layer CGL21, which is adjacent to the second stack ST2, and a p-type charge generation layer CGL22, which is adjacent to the cathode electrode CE. The p-type charge generation layer CGL22 may be disposed on the n-type charge generation layer CGL21.

The second charge generation layer CGL2 may have a structure in which the n-type charge generation layer CGL21 and the p-type charge generation layer CGL22 are bonded together. The first and second charge generation layers CGL1 and CGL2 may be formed of different materials or of the same material.

The second stack ST2 may be positioned on the second charge generation layer CGL2 and may further include a third hole transport layer HTL3 and a third electron transport layer ETL3.

The third hole transport layer HTL3 may be positioned on the second charge generation layer CGL2. The third hole transport layer HTL3 may be formed of the same material, and have the same structure, as the first hole transport layer HTL1. For example, the third hole transport layer HTL3 may include at least one selected from among the above-described materials that is included in the first hole transport layer HTL1. The third hole transport layer HTL3 may be formed as a single-layer film or a multilayer film. In a case where the third hole transport layer HTL3 consists of multiple layers, the multiple layers may include different materials.

The third electron transport layer ETL3 may be positioned on the third light emission layer EML3, and may be positioned between the cathode electrode CE and the third light emission layer EML3. The third electron transport layer ETL3 may be formed of the same material, and have the same structure, as the first electron transport layer ETL1 and may include at least one selected from among the above-described materials that is included in the first electron transport layer ETL1. The third electron transport layer ETL3 may be formed as a single-layer film or a multilayer film. In a case where the third electron transport layer ETL3 consists of multiple layers, the multiple layers may include different materials.

For example, a hole injection layer may be further positioned between the first stack ST1 and the first, second, or third anode electrode AE1, AE2, and AE3, may be positioned between the second stack ST2 and the first charge generation layer CGL1, and/or and may be positioned between the third stack ST3 and the second charge generation layer CGL2. The hole injection layer may facilitate (or perform) the injection of holes into the first, second, and third light emission layers EML1, EML2, and EML3. In some embodiments, the hole injection layer may be formed of at least one selected from the group consisting of copper phthalocyanine (CuPc), poly(3,4)-ethylenedioxythiophene (PEDOT), polyaniline (PANI), and N,N-dinaphthyl-N,N'-diphenyl benzidine (NPD), but embodiments are not limited thereto. In some embodiments, multiple hole injection layers may be positioned between the first stack ST1 and the first, second, or third anode electrode AE1, AE2, and AE3, may be positioned between the second stack ST2 and the first charge generation layer CGL1, and may be positioned between the third stack ST3 and the second charge generation layer CGL2.

For example, an electron injection layer may be further positioned between the third electron transport layer ETL3 and the cathode electrode CE, may be positioned between the second charge generation layer CGL2 and the second stack ST2, and/or and may be positioned between the first charge generation layer CGL1 and the first stack ST1. The electron injection layer may facilitate (or perform) the injection of electrons and may be formed of Alq3, PBD, TAZ, spiro-PBD, BAlq, or SAlq, but embodiments are not limited thereto. For example, the electron injection layer may include a metal halide compound, for example, at least one selected from the group consisting of MgF2, LiF, NaF, KF, RbF, CsF, FrF, LiI, NaI, KI, RbI, CsI, FrI, and CaF2, but embodiments are not limited thereto. For example, the electron injection layer may include a lanthanum (La)-based material such as Yb, Sm, or Eu. For example, the electron injection layer may include both a metal halide material such as RbLYb or KLYb and the La-based material. In a case where the electron injection layer includes both the metal halide material and the La-based material, the electron injection layer may be formed by co-depositing the metal halide material and the La-based material. In some embodiments, multiple electron injection layers may be positioned between the third electron transport layer ETL3 and the cathode electrode CE, may be positioned between the second charge generation layer CGL2 and the second stack ST2, and may be positioned between the first charge generation layer CGL1 and the first stack ST1.

The structure of the light-emitting layer OL may vary. For example, the light-emitting layer OL may be modified into a light-emitting layer OLa of FIG. 12. Referring to FIG. 12, the light-emitting layer OLa, unlike its counterpart of FIG. 11, may further include a fourth stack ST4 on a third stack ST3 and a third charge generation layer CGL3 between the third and fourth stacks ST3 and ST4.

The fourth stack ST4 may include a fourth light emission layer EML4 and may further include a fourth hole transport layer HTL4, a third electron blocking layer BIL3, and a fourth electron transport layer ETL4.

A first light emission layer EML1, a second light emission layer EML2, a third light emission layer EML3, and the fourth light emission layer EML4 may emit light of the blue wavelength light. At least two of the first, second, third, and fourth light emission layers EML1, EML2, EML3, and EML4 may emit blue light of different peak wavelengths, individually.

In another example, at least one of the first, second, third, and fourth light emission layers EML1, EML2, EML3, and EML4 may emit green light, and at least another one of the first, second, third, and fourth light emission layers EML1, EML2, EML3, and EML4 may emit blue light. For example, one of the first, second, third, and fourth light emission layers EML1, EML2, EML3, and EML4 may be a green-light emission layer, and the other light emission layers may all be blue-light emission layers.

In another example, the fourth light emission layer EML4 may be a green-light emission layer, and the first, second, and third light emission layers EML1, EML2, and EML3 may all be blue-light emission layers.

The fourth hole transport layer HTL4 may be positioned on a second charge generation layer CGL2. The fourth hole transport layer HTL4 may be formed of the same material, and have the same structure, as a first hole transport layer HTL1. For example, the fourth hole transport layer HTL4 may include at least one selected from among the above-mentioned materials that is included in the first hole transport layer HTL1. The fourth hole transport layer HTL4 may be formed as a single-layer film or a multilayer film. In a case where the fourth hole transport layer HTL4 is formed of multiple layers, the multiple layers may include different materials.

The third electron blocking layer BIL3 may be positioned on the fourth hole transport layer HTL4, and may be positioned between the fourth hole transport layer HTL4 and the fourth light emission layer EML4. The third electron blocking layer BIL3 may be formed of the same material, and have the same structure, as the first electron blocking layer BIL1. For example, the third electron blocking layer BIL3 may include at least one selected from among the above-mentioned materials that is included in the first electron blocking layer BIL1. In some embodiments, the third electron blocking layer BIL3 may not be provided.

The fourth electron transport layer ETL4 may be positioned on the fourth light emission layer EML4, and may be positioned between the third charge generation layer CGL3 and the fourth light emission layer EML4. The fourth electron transport layer ETL4 may be formed of the same material, and have the same structure, as the first electron transport layer ETL1. For example, the fourth electron transport layer ETL4 may include at least one selected from among the above-mentioned materials that is included in the first electron transport layer ETL1. The fourth electron transport layer ETL4 may be formed as a single-layer film or a multilayer film. In a case where the fourth electron transport layer ETL4 consists of multiple layers, the multiple layers may include different materials.

The third charge generation layer CGL3 may have the same structure as a first charge generation layer CGL1. For example, the third charge generation layer CGL3 may include an n-type charge generation layer CGL31, which is disposed adjacent to a second stack ST2, and a p-type charge generation layer CGL32, which is disposed adjacent to a cathode electrode CE. The p-type charge generation layer CGL32 may be disposed on the n-type charge generation layer CGL31.

For example, an electron injection layer may be further positioned between the fourth stack ST4 and the third charge generation layer CGL3, and a hole injection layer may be further positioned between the fourth stack ST4 and the second charge generation layer CGL2.

In some embodiments, both the light-emitting layer OL of FIG. 9 and the light-emitting layer OLa of FIG. 10 may not include red-light emission layers and may not emit light of the first color, for example, red light. For example, the emission light LE may not include components having a peak wavelength of about 610 nm to about 650 nm, but may include only components having a peak wavelength of about 440 nm to about 550 nm.

Referring to FIG. 13, the dam member DM may be positioned on the passivation layer 117 in the non-display area NDA.

The dam member DM may be positioned on the outside of the power supply line VSL. As illustrated in FIG. 13, the power supply line VSL may be positioned between the dam member DM and the display area DA. The power supply line VSL may be disposed (or included) in the first conductive layer.

In some embodiments, the dam member DM may include dams. For example, the dam member DM may include first and second dams DM1 and DM2.

The first dam DM1 may overlap (e.g., partially overlap) the power supply line VSL and may be spaced apart from the via layer 130 with the power supply line VSL interposed therebetween. In some embodiments, the first dam DM1 may include a first lower dam pattern layer DM11, which is positioned on the passivation layer 117, and a first upper dam pattern layer DM12, which is positioned on the first lower dam pattern layer DM11.

The second dam DM2 may be positioned on the outside of the first dam DM1 and may be spaced apart from the first dam DM1. In some embodiments, the second dam DM2 may include a second lower dam pattern layer DM21, which is positioned on the passivation layer 117, and a second upper dam pattern layer DM22, which is positioned on the second lower dam pattern layer DM21.

In some embodiments, the first and second lower dam pattern layers DM11 and DM21 and the via layer 130 may be formed of the same material, and the first and second lower dam pattern layers DM11 and DM21 and the via layer 130 may be formed at the same time.

In some embodiments, the first and second upper dam pattern layers DM12 and DM22 and the pixel-defining layer 150 may be formed of the same material, and the first and second upper dam pattern layers DM12 and DM22 and the pixel-defining layer 150 may be formed at the same time.

In some embodiments, the first and second dams DM1 and DM2 may have different heights, which are measured from an upper surface of the first base part 110. For example, the second dam DM2 may be higher than the first dam DM1. For example, the height of the dam member DM may gradually increase as being farther away from the display area DA. Accordingly, the dam member DM may effectively prevent the spill of an organic material during the formation of an organic layer 173 of the encapsulation layer 170.

Referring to FIGS. 10 and 13, a first capping layer 160 may be positioned on the cathode electrode CE. The first capping layer 160 may be disposed in common in the first, second, and third light-emitting areas LA1, LA2, and LA3 and the non-light-emitting area NLA. The first capping layer 160 may improve viewing angle characteristics and may increase external luminous efficiency.

The first capping layer 160 may include at least one of inorganic and organic materials having light transmittance. For example, the first capping layer 160 may be formed as an inorganic layer, an organic layer, or an organic layer including inorganic particles. For example, the first capping layer 160 may include a triamine derivative, a carbazole biphenyl derivative, an arylenediamine derivative, or an aluminum quinoline complex (e.g., Alq3).

For example, the first capping layer 160 may be formed of the mixture of a high refractive material and a low refractive material. In another example, the first capping layer 160 may include two layers having different refractive indexes, for example, a high refractive index layer and a low refractive index layer.

In some embodiments, the first capping layer 160 may cover (e.g., completely cover) the cathode electrode CE. In some embodiments, as illustrated in FIG. 13, the end portion of the first capping layer 160 may be positioned on the outside of the end portion of the cathode electrode CE, and the end portion of the cathode electrode CE may be covered (e.g., completely covered) by the first capping layer 160.

The encapsulation layer 170 may be disposed on the first capping layer 160. The encapsulation layer 170 may protect the elements disposed therebelow, for example, the first, second, and third light-emitting elements ED1, ED2, and ED3, from a foreign material such as moisture. The encapsulation layer 170 may be disposed in common in the first, second, and third light-emitting areas LA1, LA2, and LA3 and the non-light-emitting area NLA. In some embodiments, the encapsulation layer 170 may cover (e.g., directly cover) the cathode electrode CE. In some embodiments, a capping layer covering the cathode electrode CE may be further disposed between the encapsulation layer 170 and the cathode electrode CE, in which case, the encapsulation layer 170 may cover (e.g., directly cover) the capping layer. The encapsulation layer 170 may be a thin-film encapsulation (TFE) layer.

In some embodiments, the encapsulation layer 170 may include a lower inorganic layer 171, the organic layer 173, and an upper inorganic layer 175, which are sequentially stacked.

In some embodiments, the lower inorganic layer 171 may cover the first, second, and third light-emitting elements ED1, ED2, and ED3 in the display area DA. The lower inorganic layer 171 may cover the dam member DM and extend even to the outside of the dam member DM in the non-display area NDA.

In some embodiments, the lower inorganic layer 171 may cover (e.g., completely cover) the first capping layer 160. In some embodiments, the end portion of the lower inorganic layer 171 may be positioned on the outside of the end portion of the first capping layer 160, and the end portion of the first capping layer 160 may be covered (e.g., completely covered) by the lower inorganic layer 171.

The lower inorganic layer 171 may include a stack of films. The organic layer 173 may be positioned on the lower inorganic layer 171. The organic layer 173 may cover the first, second, and third light-emitting elements ED1, ED2, and ED3 in the display are DA. In some embodiments, part of the organic layer 173 may be positioned in the non-display area NDA, but not on the outside of the dam member DM. Part of the organic layer 173 is illustrated as being disposed on the inside of the first dam DM1, but embodiments are not limited thereto. In some embodiments, part of the organic layer 173 may be filled in the space between the first and second dams DM1 and DM2, and the end portion of the organic layer 173 may be positioned between the first and second dams DM1 and DM2.

The upper inorganic layer 175 may be positioned on the organic layer 173. The upper inorganic layer 175 may cover the organic layer 173. In some embodiments, in the non-display area NDA, the upper inorganic layer 175 may be in contact with (e.g., in direct contact with) the lower inorganic layer 171 to form inorganic-inorganic bonds. In some embodiments, the end portions of the upper and lower inorganic layers 175 and 171 may be substantially aligned with each other. The upper inorganic layer 175 may include a stack of films.

In some embodiments, the lower inorganic layer 171 and the upper inorganic layer 175 may be formed of silicon nitride, aluminum nitride, zirconium nitride, titanium nitride, hafnium nitride, tantalum nitride, silicon oxide, aluminum oxide, titanium oxide, tin oxide, cerium oxide, SiON, or lithium fluoride, but embodiments are not limited thereto.

In some embodiments, the organic layer 173 may be formed of an acrylic resin, a methacrylic resin, polyisoprene, a vinyl resin, an epoxy resin, a urethane resin, a cellulose resin, or a perylene resin.

The color conversion substrate 30 will hereinafter be described with reference to FIGS. 14 through 16 and further to FIGS. 1 through 13.

Figure 14:
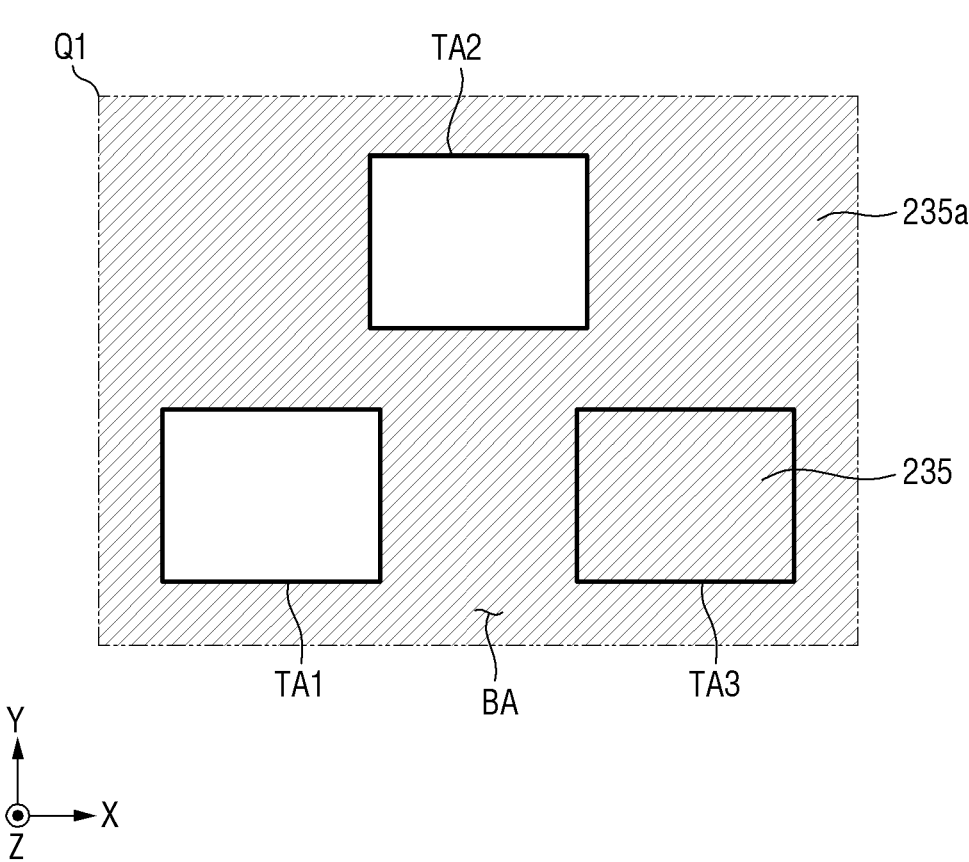
FIG. 14 is a schematic plan view illustrating the layout of third color filters in the color conversion substrate of the display device of FIG. 4.

FIG. 14 is a schematic plan view illustrating the layout of third color filters in the color conversion substrate of the display device 1 of FIG. 4. FIG. 15 is a schematic plan view illustrating the layout of first color filters in the color conversion substrate of the display device 1 of FIG. 4. FIG. 16 is a schematic plan view illustrating the layout of second color filters in the color conversion substrate of the display device 1 of FIG. 4.

Referring to FIGS. 10 and 13, the second base part 310 may be formed of a material having light transmittance.

In some embodiments, the second base part 310 may include a glass substrate or a plastic substrate. In some embodiments, the second base part 310 may further include an additional layer on the glass substrate or the plastic substrate, such as an insulating layer (e.g., an inorganic film).

In some embodiments, the light-transmitting areas (e.g., TA1, TA2, and TA3) and the light-blocking area BA may be defined on the second base part 310. In a case where the second base part 310 includes a glass substrate, the refractive index of the second base part 310 may be about 1.5.

Referring to FIGS. 10 and 13, a color filter layer may be disposed on a surface of the second base part 310 that faces the display substrate 10. The color filter layer may include color filters (e.g., 231, 233, and 235) and the light-blocking pattern layer 250.

Referring to FIGS. 10, 13, and 14 through 16, the color filters (e.g., 231, 233, and 235) may overlap the light-transmitting areas (e.g., TA1, TA2, and TA3). The light-blocking pattern layer 250 may overlap the light-blocking area BA. A first color filter 231 may overlap the first light-transmitting area TA1, a second color filter 233 may overlap the second light-transmitting area TA2, and a third color filter 235 may overlap the third light-transmitting area TA3. The light-blocking pattern layer 250 may overlap the light-blocking area BA and may block the transmission of light. In some embodiments, the light-blocking pattern layer 250 may be arranged substantially in a lattice shape in a plan view. The light-blocking pattern layer 250 may include a first light-blocking pattern part 235a on the surface of the second base part 310, a second light-blocking pattern part 231a on the first light-blocking pattern part 235a, and a third light-blocking pattern part 233a on the second light-blocking pattern part 231a. The first light-blocking pattern part 235a and the third color filter 235 may include the same material, the second light-blocking pattern part 231a and the first color filter 231 may include the same material, and the third light-blocking pattern part 233a and the second color filter 233 may include the same material. For example, in the light-blocking area BA, the light-blocking pattern layer 250 may have a structure in which the first, second, and third light-blocking pattern parts 235a, 231a, and 233a are sequentially stacked. As external light La is incident upon the light-blocking area BA, as illustrated in FIG. 10, all the external light La except for light of the third color (e.g., light of the first and second colors) may be absorbed by the first light-blocking pattern part 235a, and light of the third color may be absorbed by the second and third light-blocking pattern parts 231a and 233a. For example, some of the external light La (e.g., light of the third color) may not pass through the first light-blocking pattern part 235a, but may be reflected from the interface between the first light-blocking pattern part 235a and the second base part 310.

In some embodiments, the light-blocking pattern layer 250 may include an organic light-blocking material and may be formed by coating and exposing the organic light-blocking material. For example, the organic light-blocking material may include a black matrix.

The first color filter 231 may function as a blocking filter for blocking blue light and green light. In some embodiments, the first color filter 231 may selectively transmit light of the first color (e.g., red light) therethrough and may block or absorb light of the second color (e.g., green light) and light of the third color (e.g., blue light). For example, the first color filter 231 may be a red color filter and may include a red colorant. The first color filter 231 may include a base resin and a red colorant dispersed in the base resin.

The second color filter 233 may function as a blocking filter for blocking blue light and red light. In some embodiments, the second color filter 233 may selectively transmit light of the second color (e.g., green light) therethrough and may block or absorb light of the first color (e.g., red light) and light of the third color (e.g., blue light). For example, the second color filter 233 may be a green color filter and may include a green colorant.

The third color filter 235 may selectively transmit light of the third color (e.g., blue light) therethrough and may block or absorb light of the first color (e.g., red light) and light of the second color (e.g., green light). For example, the third color filter 235 may be a blue color filter and may include a blue colorant such as a blue dye or a blue pigment. The term "colorant", as used herein, encompasses both a dye and a pigment.

Referring to FIGS. 10 and 13, a low refractive index layer 391, which covers the light-blocking pattern layer 250 and the first, second, and third color filters 231, 233, and 235, may be positioned on the surface of the second base part 310. In some embodiments, the low refractive index layer 391 may be in contact with (e.g., in direct contact with) the first, second, and third color filters 231, 233, and 235. In some embodiments, the low refractive index layer 391 may be in contact with (e.g., in direct contact with) the light-blocking pattern layer 250.

The low refractive index layer 391 may have a lower refractive index than first and second wavelength shifting pattern members 340 and 350 and a light-transmitting pattern member 330. For example, the low refractive index layer 391 may be formed of an inorganic material. For example, the low refractive index layer 391 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. In some embodiments, hollow particles may be formed in the low refractive index layer 391 to lower the refractive index of the low refractive index layer 391.

A low refractive index capping layer 392 may be further disposed between the first and second wavelength shifting pattern members 340 and 350 and between the low refractive index layer 391 and the light-transmitting pattern member 330. In some embodiments, the low refractive index capping layer 392 may be in contact with (e.g., in direct contact with) the first wavelength shifting pattern member 340, the second wavelength shifting pattern member 350, and the light-transmitting pattern member 330. In some embodiments, the low refractive index capping layer 392 may be in contact with (e.g., in direct contact with) the bank pattern layer 370.

The low refractive index capping layer 392 may have a lower refractive index than the first wavelength shifting pattern member 340, the second wavelength shifting pattern member 350, and the light-transmitting pattern member 330. For example, the low refractive index capping layer 392 may be formed of an inorganic material. For example, the low refractive index capping layer 392 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. In some embodiments, hollow particles may be formed in the low refractive index capping layer 392 to lower the refractive index of the low refractive index capping layer 392.

The low refractive index capping layer 392 may prevent the first, second, and third color filters 231, 233, and 235 from being damaged by, or contaminated with, impurities from the outside, such as moisture or the air. For example, the low refractive index capping layer 392 may prevent the colorants of the first, second, and third color filters 231, 233, and 235 from diffusing into other elements such as the first and second wavelength shifting pattern members 340 and 350.

In some embodiments, the low refractive index layer 391 and the low refractive index capping layer 392 may surround sides of the light-blocking pattern layer 250 in the non-display area NDA. In some embodiments, the low refractive index layer 391 may be in contact with (e.g., in direct contact with) the second base part 310 in the non-display area NDA.

The bank pattern layer 370 may be positioned on a surface of the low refractive index capping layer 392 that faces the display substrate 10. In some embodiments, the bank pattern layer 370 may be positioned on (e.g., directly on) the surface of the low refractive index capping layer 392 and may be in contact with (e.g., in direct contact with) the low refractive index capping layer 392.

In some embodiments, the bank pattern layer 370 may overlap the non-light-emitting area NLA or the light-blocking area BA. In some embodiments, as illustrated in FIG. 15, the bank pattern layer 370 may surround the first, second, and third light-transmitting areas TA1, TA2, and TA3 in a plan view. The bank pattern layer 370 may define spaces in which the first wavelength shifting pattern member 340, the second wavelength shifting pattern member 350, and the light-transmitting pattern member 330 are arranged.

In some embodiments, the bank pattern layer 370 may be formed as a single integral pattern, but embodiments are not limited thereto. In some embodiments, part of the bank pattern layer 370 surrounding the first light-transmitting area TA1, part of the bank pattern layer 370 surrounding the second light-transmitting area TA2, and part of the bank pattern layer 370 surrounding the third light-transmitting area TA3 may be formed as separate individual pattern layers.

In a case where the first wavelength shifting pattern member 340, the second wavelength shifting pattern member 350, and the light-transmitting pattern member 330 are formed by ejecting an ink composition through nozzles, e.g., by inkjet printing, the bank pattern layer 370 may function as a guide for placing the ink composition at each desired location. For example, the bank pattern layer 370 may function as a partition wall.

In some embodiments, the bank pattern layer 370 may overlap the pixel-defining layer 150.

In some embodiments, as illustrated in FIG. 13, the bank pattern layer 370 may be further positioned in the non-display area NDA. The bank pattern layer 370 may overlap the light-blocking pattern layer 250 in the non-display area NDA.

In some embodiments, the bank pattern layer 370 may include a photo-curable organic material having photo-curability. In some embodiments, the bank pattern layer 370 may include a photo-curable organic material including a light-blocking material. In a case where the bank pattern layer 370 is capable of blocking the transmission of light, the bank pattern layer 370 may prevent light from infiltrating between adjacent light-emitting areas in the display area DA. For example, the bank pattern layer 370 may prevent emission light LE, which is transmitted from the second light-emitting element ED2, from being incident on the first wavelength shifting pattern member 340, which overlaps the first light-emitting area LA1. For example, the bank pattern layer 370 may block or prevent external light from infiltrating into the elements disposed therebelow in the non-light-emitting area NLA and the non-display area NDA.

As illustrated in FIGS. 10 and 13, the first wavelength shifting pattern member 340, the second wavelength shifting pattern member 350, and the light-transmitting pattern member 330 may be positioned below the low refractive index layer 391. In some embodiments, the first wavelength shifting pattern member 340, the second wavelength shifting pattern member 350, and the light-transmitting pattern member 330 may be positioned in the display area DA.

The light-transmitting pattern member 330 may overlap the third light-emitting area LA3 or the third light-emitting element ED3. The light-transmitting pattern member 330 may be positioned in the space defined in the third light-transmitting area TA3 by the bank pattern layer 370.

In some embodiments, the light-transmitting pattern member 330 may be formed in an island pattern. The light-transmitting pattern member 330 is illustrated as not overlapping the light-blocking area BA, but embodiments are not limited thereto. In some embodiments, part of the light-transmitting pattern member 330 may overlap the light-blocking area BA.

The light-transmitting pattern member 330 may transmit incident light therethrough. As already mentioned above, emission light LE from the third light-emitting element ED3 may be blue light. Blue emission light LE may be emitted to the outside of the display device 1 through the light-transmitting pattern member 330 and the third color filter 235. For example, third light L3 emitted to the outside of the display device 1 through the third light-emitting area LA3 may be blue light.

In some embodiments, the light-transmitting pattern member 330 may include a third base resin 331 and may further include a third scatterer 333, which is dispersed in the third base resin 331. Although the terms "first," "second," and "third" are used herein to describe the base resins, the scatterers and/or the wavelength shifters of the light-transmitting pattern member 330, the first wavelength shifting pattern member 340, and the second wavelength shifting pattern member 350, the base resins, the scatterers and/or the wavelength shifters of the light-transmitting pattern member 330, the first wavelength shifting pattern member 340, and the second wavelength shifting pattern member 350 should not be limited by those terms. Those terms are simply for distinguishing one element from another element. For example, a first base resin, scatterer, or wavelength shifter could be termed a second or third base resin, scatterer, or wavelength shifter, or vice versa.

The third base resin 331 may be formed of a material having a high light transmittance. In some embodiments, the third base resin 331 may be formed of an organic material. For example, the third base resin 331 may include an organic material such as an epoxy resin, an acrylic resin, a cardo resin, or an imide resin.

The third scatterer 333 may have a different refractive index from the third base resin 331 and may form an optical interface with the third base resin 331. For example, the third scatterer 333 may be light-scattering particles. The material of the third scatterer 333 is not limited as long as the material scatters at least some of the emission light LE. For example, the third scatterer 333 may be particles of a metal oxide or an organic material. For example, the metal oxide may be $TiO_2$, $ZrO_2$, $Al_2O_3$, indium oxide ($In_2O_3$), ZnO, or tin oxide ($SnO_2$), and the organic material may be an acrylic resin or a urethane resin. For example, the third scatterer 333 may include $TiO_2$.

The third scatterer 333 may scatter incident light in random directions substantially without changing the wavelength of emission light LE passing through the light-transmitting pattern member 330, regardless of the incidence direction of the incident light. In some embodiments, the light-transmitting pattern member 330 may be in contact with (e.g., in direct contact with) the bank pattern layer 370.

The first wavelength shifting pattern member 340 may overlap the first light-emitting area LA1 or the first light-emitting element ED1 or the first light-transmitting area TA1.

In some embodiments, the first wavelength shifting pattern member 340 may be positioned in the space defined in the first light-transmitting area TA1 by the bank pattern layer 370.

Figure 15:
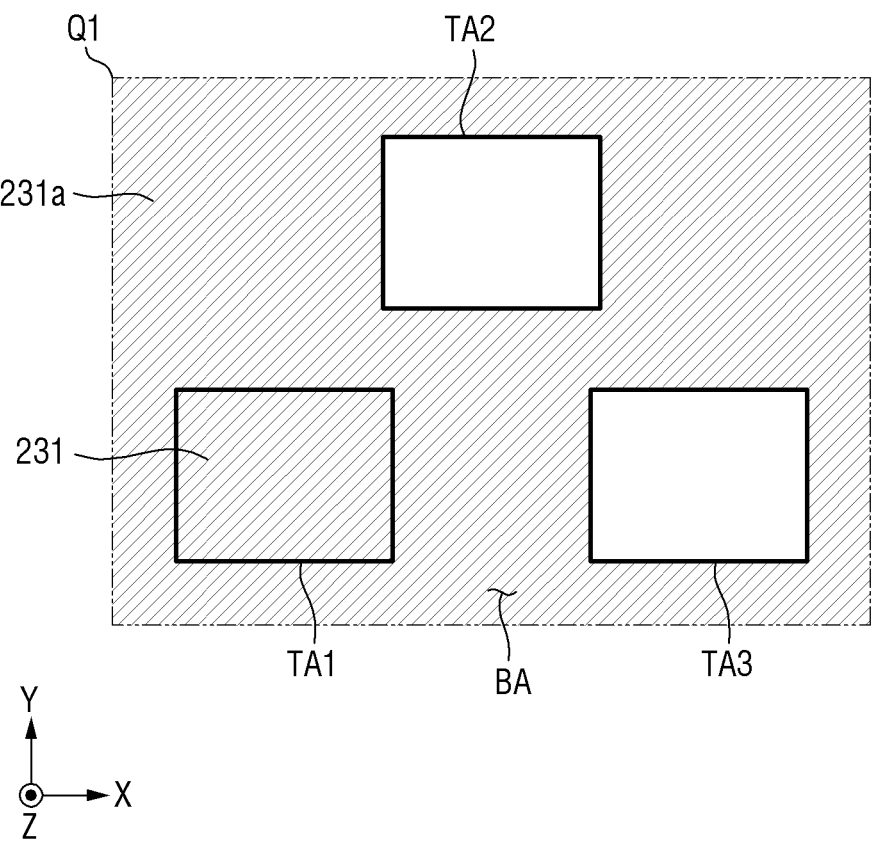
FIG. 15 is a schematic plan view illustrating the layout of first color filters in the color conversion substrate of the display device of FIG. 4.
Figure 16:
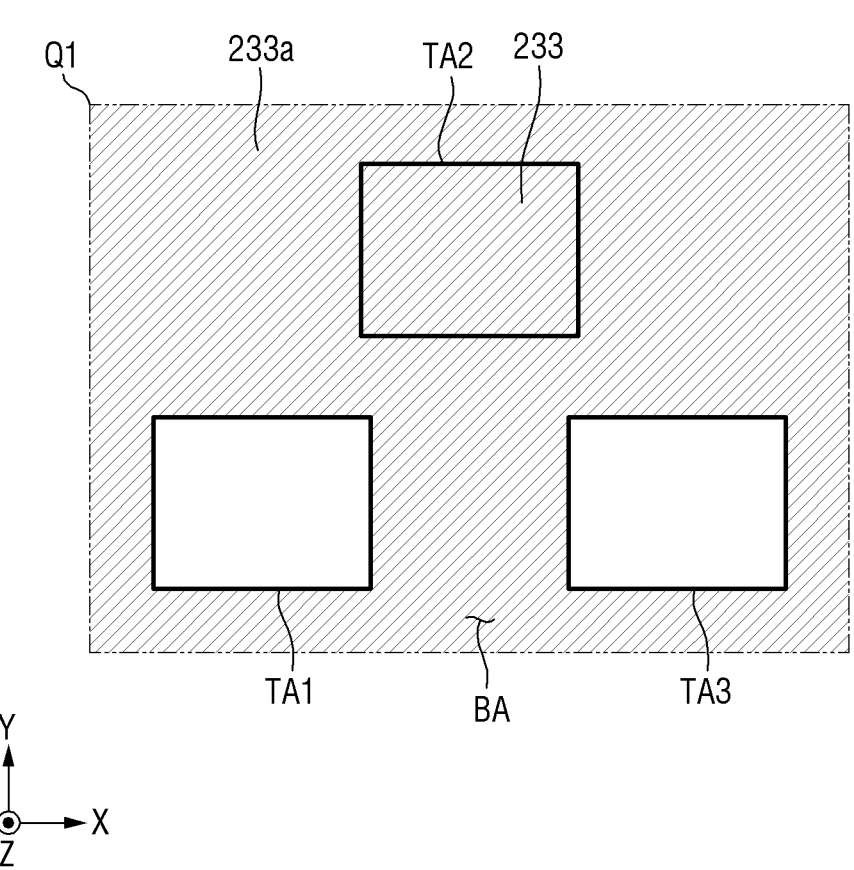
FIG. 16 is a schematic plan view illustrating the layout of second color filters in the color conversion substrate of the display device of FIG. 4.

In some embodiments, as illustrated in FIG. 15, the first wavelength shifting pattern member 340 may be formed in island pattern. The first wavelength shifting pattern member 340 is illustrated as not overlapping the light-blocking area BA, but embodiments are not limited thereto. In some embodiments, part of the first wavelength shifting pattern member 340 may overlap the light-blocking area BA. In some embodiments, the first wavelength shifting pattern member 340 may be in contact with (e.g., in direct contact with) the bank pattern layer 370.

The first wavelength shifting pattern member 340 may convert (or shift) the peak wavelength of incident light through a first wavelength shifter 345 and may emit the wavelength-shifted light. In some embodiments, the first wavelength shifting pattern member 340 may convert emission light LE from the first light-emitting element ED1 into red light having a peak wavelength of about 610 nm to about 650 nm and may emit the red light.

In some embodiments, the first wavelength shifting pattern member 340 may include a first base resin 341 and the first wavelength shifter 345, which is dispersed in the first base resin 341, and may further include a first scatterer 343.

The first base resin 341 may be formed of a material having a high light transmittance. In some embodiments, the first base resin 341 may be formed of an organic material. In some embodiments, the first base resin 341 and the third base resin 331 may be formed of the same material. For example, the first base resin 341 may include at least one selected from among the above-mentioned materials that is included in the third base resin 331.

Examples of the first wavelength shifter 345 may include quantum dots, quantum rods, or a phosphor. For example, the quantum dots may be a particulate material that emits light of a particular color in response to the electrons transitioning from the conduction band to the valance band.

The quantum dots may be a semiconductor nanocrystal material. Since the quantum dots have a certain band gap according to their composition and size, the quantum dots absorb light and emit light of a certain wavelength. The semiconductor nanocrystal material include a group IV element, a group II-VI compound, a group III-V compound, a group IV-VI compound, and a combination thereof.

The group II-VI compound may be selected from the group consisting of: a binary compound selected from among CdSe, CdTe, ZnS, ZnSe, ZnTe, ZnO, HgS, HgSe, HgTe, MgSe, MgS, and a mixture thereof; a ternary compound selected from among InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; or a quaternary compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of: a binary compound selected from among GaN, GaP, GaAs, GaSb, AN, AlP, AlAs, AlSb, InN, InP, InAs, InSb, and a mixture thereof; a ternary compound selected from among GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and a mixture thereof; and a quaternary compound selected from among GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound selected from among SnS, SnSe, SnTe, PbS, PbSe, PbTe, and a mixture thereof; a ternary compound selected from among SnSeS, SnSeTe, SnSTe, PbSeS, PbSeTe, PbSTe, SnPbS, SnPbSe, SnPbTe, and a mixture thereof; and a quaternary compound selected from among SnPbSSe, SnPbSeTe, SnPbSTe, and a mixture thereof. The group IV element may be selected from the group consisting of Si, Ge, and a mixture thereof. The group IV compound may be a binary compound selected from among SiC, SiGe, and a mixture thereof.

For example, the binary, ternary, or quaternary compounds may exist in a uniform concentration or in a partially different concentration in particles. The quantum dots may have a core-shell structure in which one quantum dot surrounds another quantum dot. The interfaces between the cores and the shells of the quantum dots may have a concentration gradient in which the concentration of the element(s) in the shells of the quantum dots gradually decreases toward the centers of the shells of the quantum dots.

In some embodiments, the quantum dots may have a core-shell structure consisting of a core including the above-described semiconductor nanocrystal material and a shell surrounding the core. The shells of the quantum dots may function as protective layers for maintaining the semiconductor characteristics of the quantum dots by preventing chemical denaturation of the cores of the quantum dots and/or as charging layers for imparting electrophoretic characteristics to the quantum dots. The shells of the quantum dots may have a single-layer structure or a multilayer structure. The interfaces between the cores and the shells of the quantum dots may have a concentration gradient in which the concentration of the element(s) at the shells of the quantum dots gradually decreases toward the centers of the shells of the quantum dots. The shells of the quantum dots may include a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO or a ternary compound such as $MgAl_2O_4$, $CoFe_2O_4$, $NiFe_2O_4$, or $CoMn_2O_4$, but embodiments are not limited thereto.

For example, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but embodiments are not limited thereto.

Light emitted by the first wavelength shifter 345 may have a full width at half maximum (FMHM) of about 45 nm or less, about 40 nm or less, or about 30 nm or less, and thus, the purity of colors displayed by the display device 1 and the color reproducibility of the display device 1 may be further improved. For example, the first wavelength shifter 345 may emit light in various directions regardless of the incidence direction of the light. The side visibility of the first color displayed in the first light-transmitting area TA1 may be improved.

Some of the emission light LE from the first light-emitting element ED1 may not be converted into red light by the first wavelength shifter 345, but may be emitted through the first wavelength shifting pattern member 340. Components of the emission light LE that are not wavelength-shifted by the first wavelength shifting pattern member 340, but are incident upon the first color filter 231, may be blocked by the first color filter 231. For example, red light converted from the emission light LE by the first wavelength shifting pattern member 340 may be emitted to the outside of the display device 1 through the first color filter 231. For example, first light L1 (see, e.g., FIG. 10) emitted to the outside of the display device 1 through the first light-transmitting area TA1 may be red light.

The first scatterer 343 may have a different refractive index from the first base resin 341 and may form an optical interface with the first base resin 341. For example, the first scatterer 343 may be light-scattering particles. The first scatterer 343 is substantially the same as the third scatterer 333, and thus, a detailed description thereof will be omitted for descriptive convenience.

The second wavelength shifting pattern member 350 may be positioned in space defined by the bank pattern layer 370 in the second light-transmitting area TA2.

In some embodiments, as illustrated in FIG. 10, the second wavelength shifting pattern member 350 may be formed in an island pattern. In some embodiments, part of the second wavelength shifting pattern member 350 may overlap the light-blocking area BA. In some embodiments, the second wavelength shifting pattern member 350 may be in contact with (e.g., in direct contact with) the bank pattern layer 370.

The second wavelength shifting pattern member 350 may convert (or shift) the peak wavelength of incident light through a second wavelength shifter 355 and may emit the wavelength-shifted light. In some embodiments, the second wavelength shifting pattern member 350 may convert the emission light LE from the second light-emitting element ED2 into green light having a peak wavelength of about 510 nm to about 550 nm and may emit the green light.

In some embodiments, the second wavelength shifting pattern member 350 may include a second base resin 351 and the second wavelength shifter 355, which is dispersed in the second base resin 351, and may further include a second scatterer 353, which is dispersed in the second base resin 351.

The second base resin 351 may be formed of a material having a high light transmittance. In some embodiments, the second base resin 351 may be formed of an organic material. In some embodiments, the second base resin 351 and the third base resin 331 may be formed of the same material. For example, the second base resin 351 may include at least one selected from among the above-mentioned materials that is included in the third base resin 331.

Examples of the second wavelength shifter 355 include quantum dots, quantum rods, or a phosphor. The second wavelength shifter 355 is substantially the same as the first wavelength shifter 345, and thus, a detailed description thereof will be omitted for descriptive convenience.

In some embodiments, the first and second wavelength shifters 345 and 355 may both be quantum dots. For example, the particle size of the second wavelength shifter 355 may be less than the particle size of the first wavelength shifter 345.

The second scatterer 353 may have a different refractive index from the second base resin 351 and may form an optical interface with the second base resin 351. For example, the second scatterer 353 may be light-scattering particles. The second scatterer 353 is substantially the same as the first scatterer 343, and thus, a detailed description thereof will be omitted for descriptive convenience.

The emission light LE from the third light-emitting element ED3 may be provided to the second wavelength shifting pattern member 350, and the second wavelength shifter 355 may convert the emission light LE into green light having a peak wavelength of about 510 nm to about 550 nm and may emit the green light.

Some of the emission light LE, which is blue light, may be transmitted through the second wavelength shifting pattern member 350, without being converted into green light by the second wavelength shifter 355, and may be blocked by the second color filter 233. For example, green light converted from the emission light LE by the second wavelength shifting pattern member 350 may be emitted to the outside of the display device 1 through the second color filter 233. Accordingly, second light L2 (see, e.g., FIG. 10) emitted to the outside of the display device 1 through the second light-transmitting area TA2 may be green light.

In some embodiments, a capping layer 393 may surround outer sides of the bank pattern layer 370 in the non-display area NDA. The capping layer 393 may be in contact with (e.g., in direct contact with) the low refractive index capping layer 392 in the non-display area NDA.

In some embodiments, the capping layer 393 may be formed of an inorganic material. In some embodiments, the capping layer 393 and the low refractive index layer 391 may be formed of the same material. For example, the capping layer 393 may include at least one selected from among the above-described materials that is included in the low refractive index layer 391. In a case where the low refractive index layer 391 and the capping layer 393 are both formed of an inorganic material, the low refractive index layer 391 and the capping layer 393 may be in contact with (e.g., in direct contact with) each other in the non-display area NDA to form inorganic-inorganic bonds.

As already mentioned above, the sealing member 50 may be positioned between the color conversion substrate 30 and the display substrate 10 in the non-display area NDA.

The sealing member 50 may overlap the encapsulation layer 170. For example, the sealing member 50 may overlap the lower and upper inorganic layers 171 and 175, but may not overlap the organic layer 173. In some embodiments, the sealing member 50 may be in contact with (e.g., in direct contact with) the encapsulation layer 170. For example, the sealing member 50 may be positioned on (e.g., directly on) the upper inorganic layer 175 and may be in contact with (e.g., in direct contact with) the upper inorganic layer 175.

In some embodiments, the upper and lower inorganic layers 175 and 171 below the sealing member 50 may extend to the outside of the sealing member 50.

The sealing member 50 may overlap the light-blocking pattern layer 250, the first color filter 231, and the bank pattern layer 370 in the non-display area NDA. In some embodiments, the sealing member 50 may be in contact with (e.g., in direct contact with) the capping layer 393, which covers the bank pattern layer 370.

The sealing member 50 may overlap the gate metals WR, which include lines connected to the connecting pads PD. As the sealing member 50 is disposed to overlap the gate metals WR, the width of the non-display area NDA may be reduced.

The filler 70 may be positioned in the space between the color conversion substrate 30, the display substrate 10, and the sealing member 50. In some embodiments, as illustrated in FIGS. 10 and 13, the filler 70 may be in contact with (e.g., in direct contact with) the capping layer 393 and the upper inorganic layer 175 of the encapsulation layer 170.

An antireflection film AF may be further disposed on the other surface of the second base part 310 that is opposite to the surface of the second base part 310 where the color filters (e.g., 231, 233, and 235) are disposed. The antireflection film AF may be disposed on the opposite side of the color filters (e.g., 231, 233, and 235) and may prevent (or minimize) external light from being incident into the display device 1. The antireflection film AF may have a first surface, which is on a display surface side of the display device 1, and a second surface, which is opposite to the first surface and is in contact with the second base part 310, and may minimize the incidence of external light by interfering (or mixing) external light reflected from the first surface and external light reflected from the second surface with each other. For example, the antireflection film AF may consist of layers whose refractive indexes are controlled, but embodiments are not limited thereto.

Figure 17:
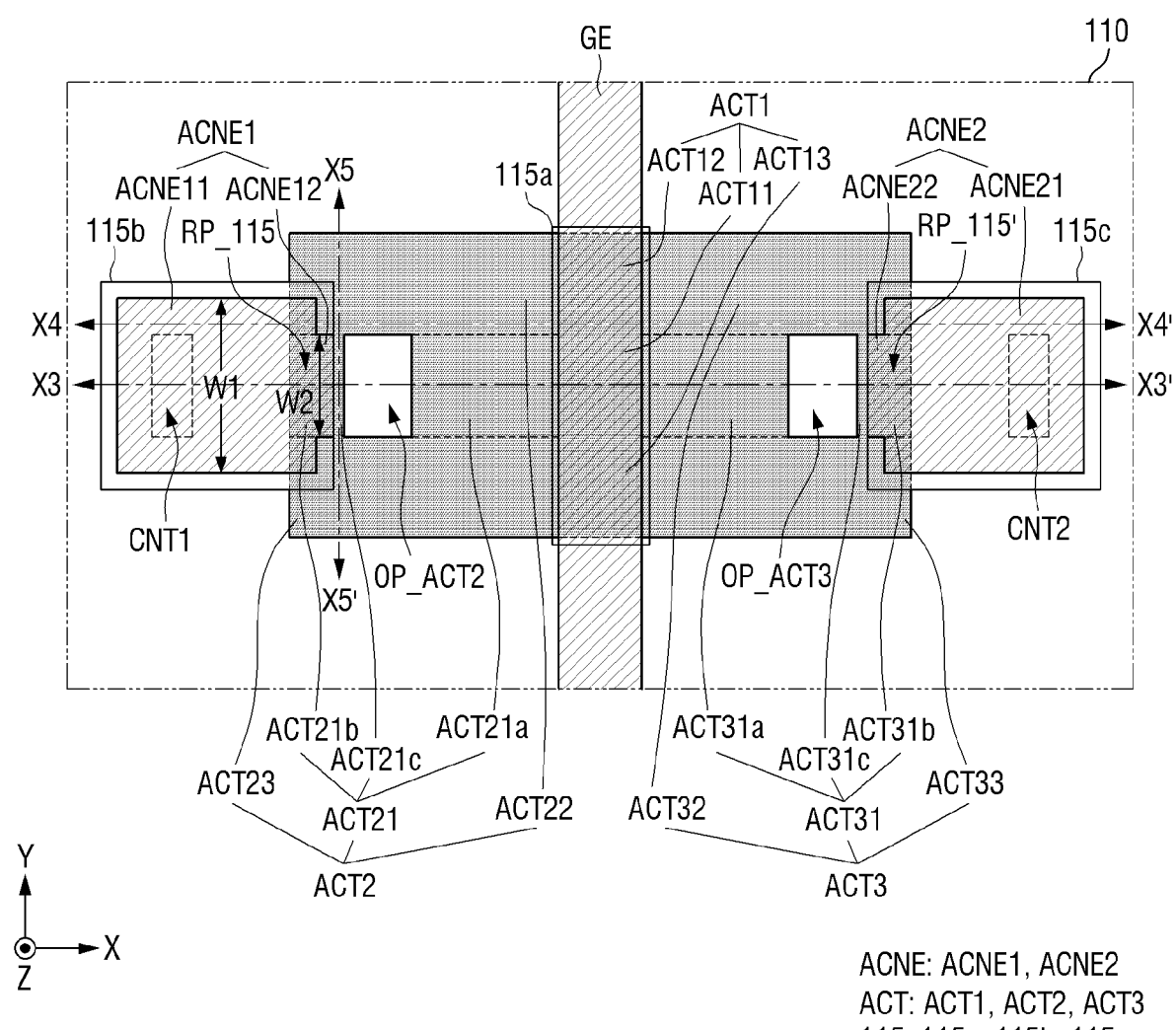
FIG. 17 is a schematic plan view of a transistor of a pixel of the display device of FIG. 1.
Figure 18:
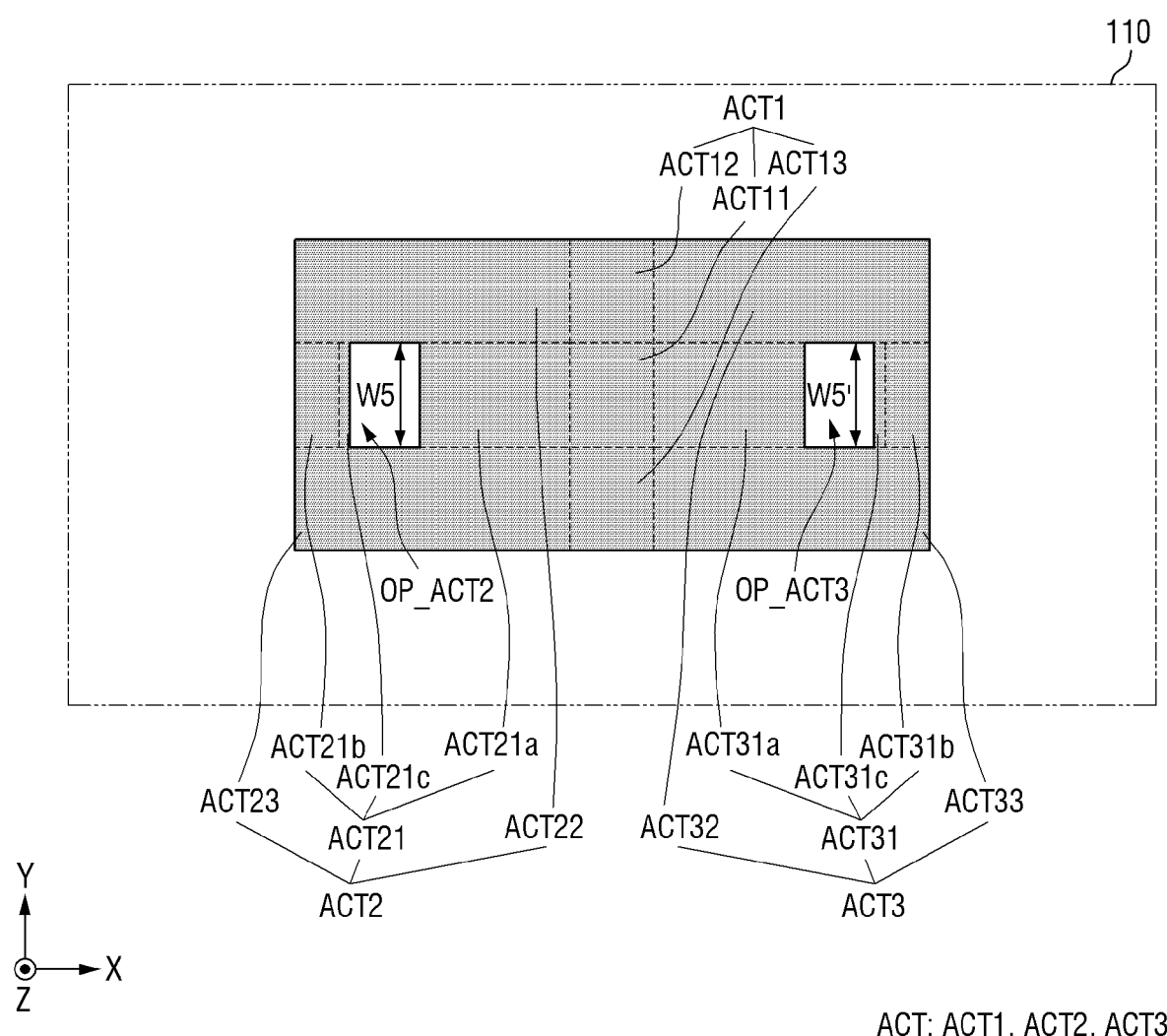
FIG. 18 is a schematic plan view of a semiconductor layer of FIG. 17.
Figure 19:
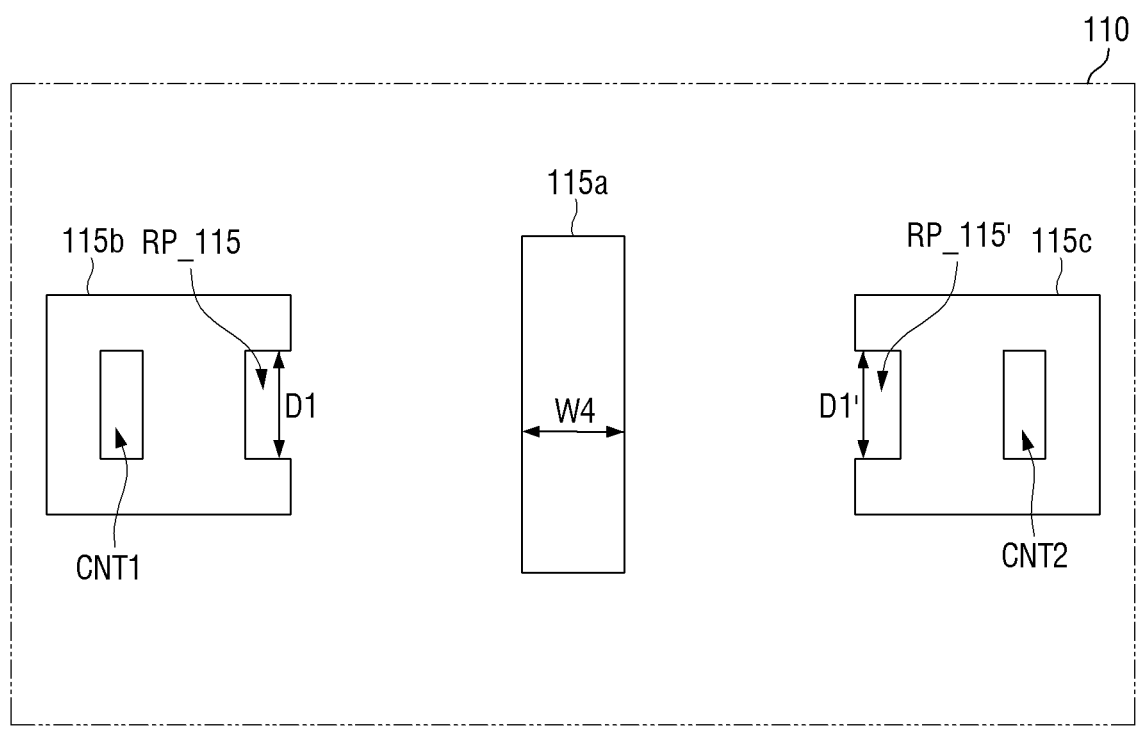
FIG. 19 is a schematic plan view of a gate insulating layer of FIG. 17.
Figure 19:
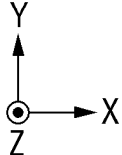
Figure 20:
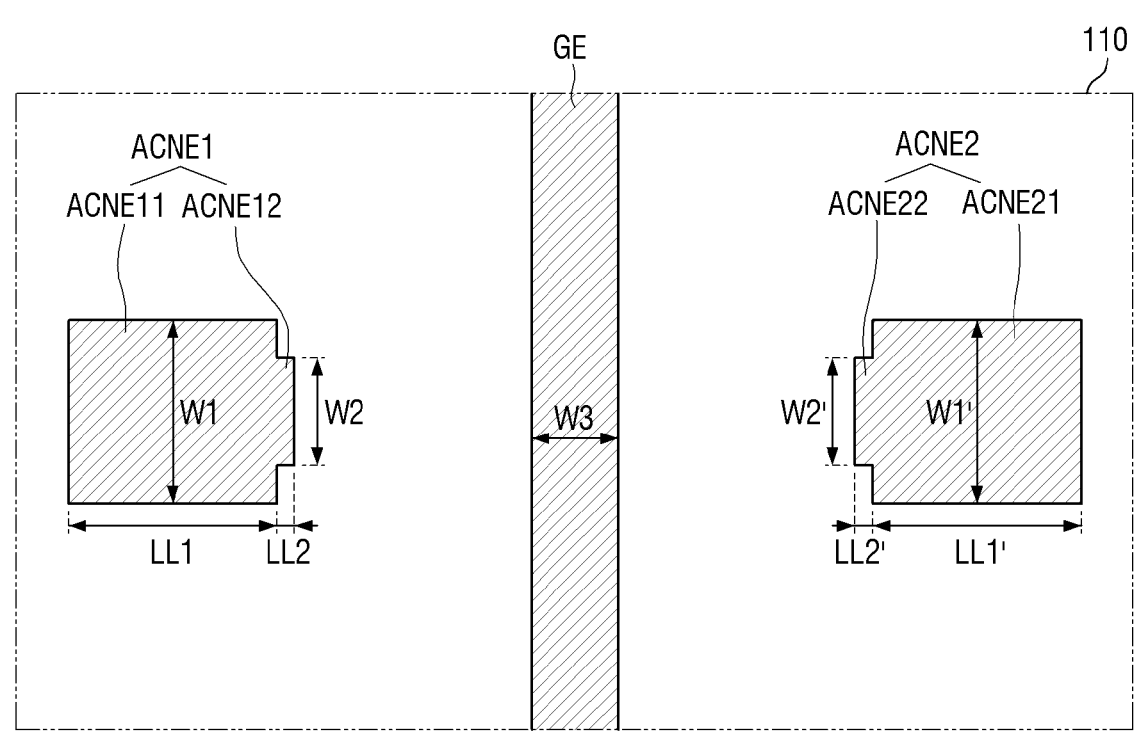
FIG. 20 is a schematic plan view of a second conductive layer of FIG. 17.
Figure 20:
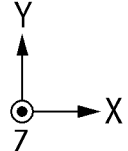
Figure 21:
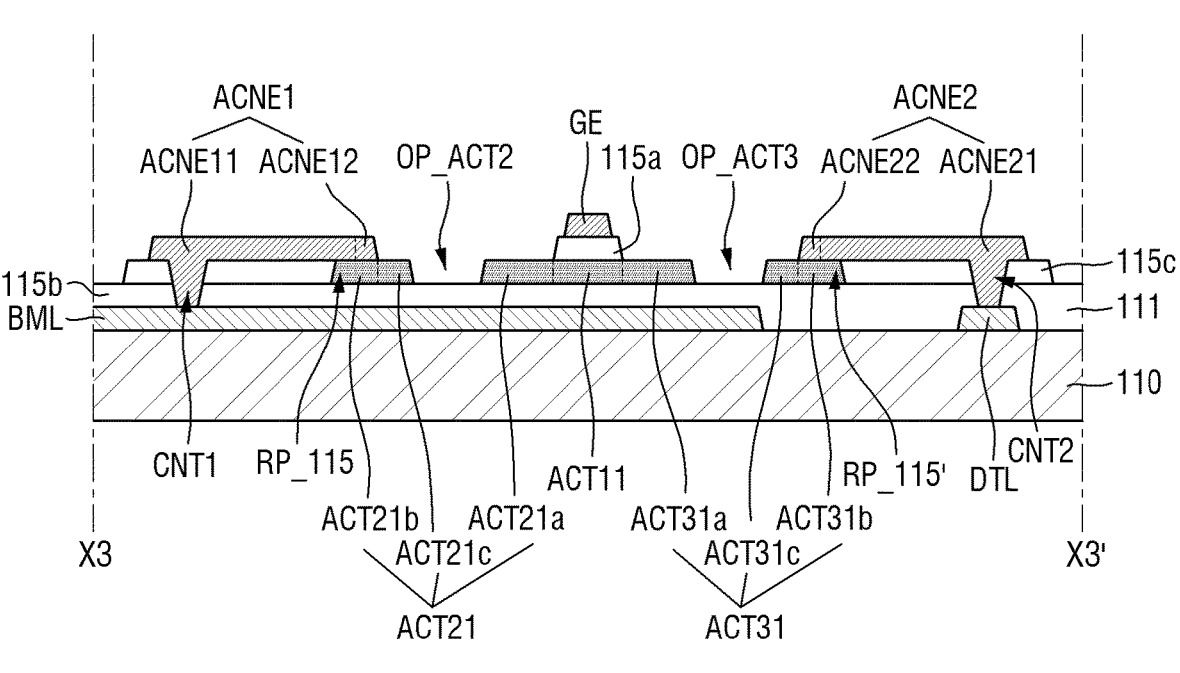
FIG. 21 is a schematic cross-sectional view taken along line X3-X3' of FIG. 17.
Figure 22:
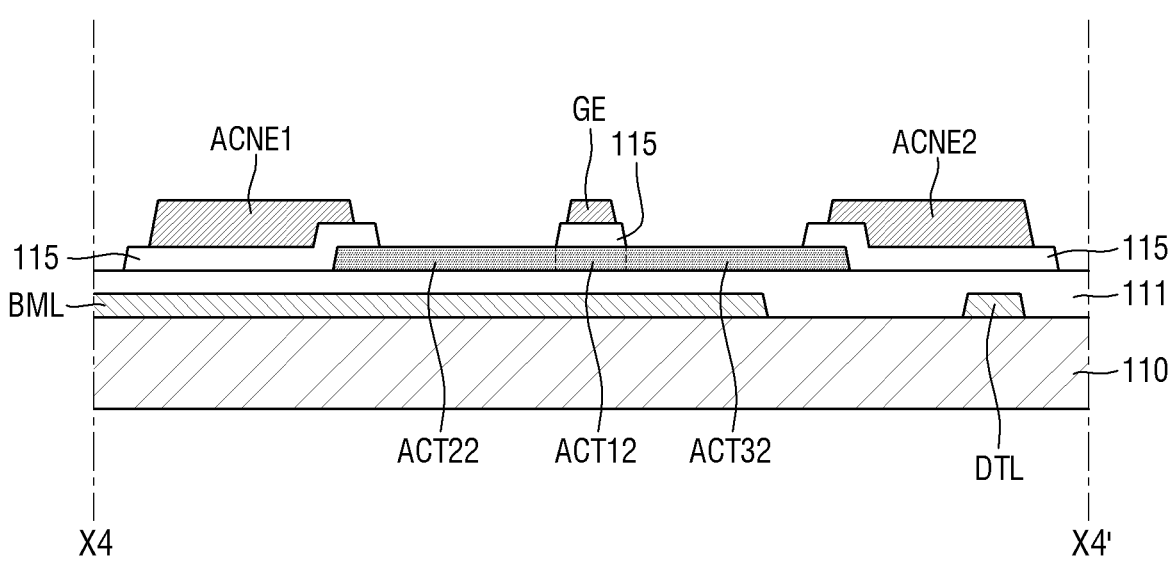
FIG. 22 is a schematic cross-sectional view taken along line X4-X4' of FIG. 17.
Figure 23:
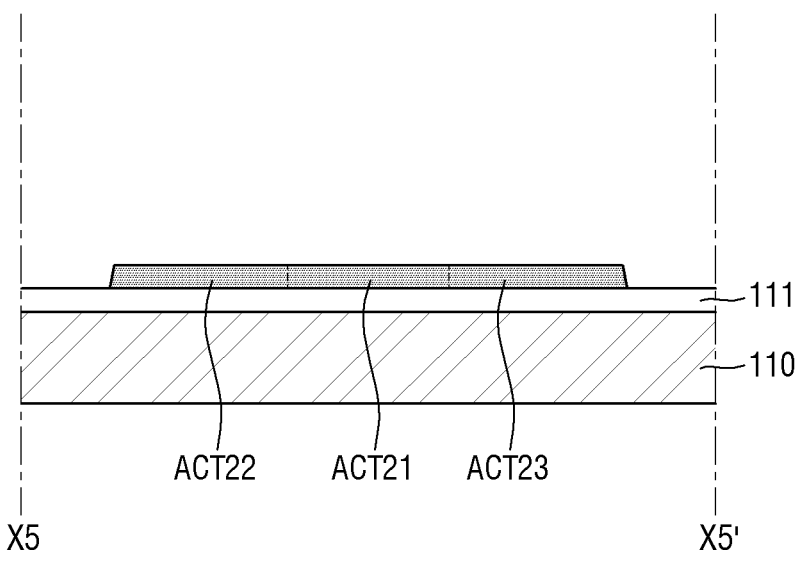
FIG. 23 is a schematic cross-sectional view taken along line X5-X5' of FIG. 17.

FIG. 17 is a schematic plan view of a transistor of a pixel of the display device 1 of FIG. 1. FIG. 18 is a schematic plan view of a semiconductor layer ACT of FIG. 17. FIG. 19 is a schematic plan view of a gate insulating layer 115 of FIG. 17. FIG. 20 is a schematic plan view of a second conductive layer of FIG. 17. FIG. 21 is a schematic cross-sectional view taken along line X3-X3' of FIG. 17. FIG. 22 is a schematic cross-sectional view taken along line X4-X4' of FIG. 17. FIG. 23 is a schematic cross-sectional view taken along line X5-X5' of FIG. 17.

Referring to FIGS. 17 through 23, the first conducive layer, which includes the lower light-blocking layer BML and the data lines DTL, may be disposed on the first base part 110.

The buffer layer 111 may be disposed on the first conductive layer.

The semiconductor layer ACT may be disposed on the buffer layer 111.

The semiconductor layer ACT may include a first semiconductor part ACT1, a second semiconductor part ACT2, which is on a second side, in the first direction X, of the first semiconductor part ACT1, and a third semiconductor part ACT3, which is disposed on a first side, in the first direction X, of the first semiconductor part ACT1.

The second and third semiconductor parts ACT2 and ACT3 may include semiconductor openings OP_ACT2 and OP_ACT3, respectively, which penetrate the second and third semiconductor parts ACT2 and ACT3, respectively, in the thickness direction. As illustrated in FIG. 17, the semiconductor openings OP_ACT2 and OP_ACT3 may have a rectangular shape in a plan view, but embodiments are not limited thereto. In another example, the semiconductor openings OP_ACT2 and OP_ACT3 may have a circular shape, an elliptical shape, or another polygonal shape.

The first semiconductor part ACT1 may include a (1-1)-th semiconductor part ACT11, which overlaps the semiconductor openings OP_ACT2 and OP_ACT3 in the first direction X, a (1-2)-th semiconductor part ACT12, which is on a first side, in the second direction Y, of the (1-1)-th semiconductor part ACT11, and a (1-3)-th semiconductor part ACT13, which is on a second side, in the second direction Y, of the (1-1)-th semiconductor part ACT11. The (1-2)-th and (1-3)-th semiconductor parts ACT12 and ACT13 may not overlap the semiconductor openings OP_ACT2 and OP_ACT3 in the in the first direction X. The first semiconductor part ACT1 may overlap a gate electrode GE, which extends in the second direction Y, and may overlap the gate insulating layer 115 in the thickness direction. For example, the gate insulating layer 115 may include a first gate insulating layer 115*a*, a second gate insulating layer 115*b*, and a third gate insulating layer 115c. For example, the first gate insulating layer 115a may overlap the gate electrode GE, the second gate insulating layer 115b may overlap the first connecting electrode ACNE1, and the third gate insulating layer 115c may overlap the second connecting electrode ACNE2.

The second semiconductor part ACT2 may include a (2-1)-th semiconductor part ACT21, which includes the semiconductor opening OP_ACT2, a (2-2)-th semiconductor part ACT22, which is on a first side, in the second direction Y, of the (2-1)-th semiconductor part ACT21, and a (2-3)-th semiconductor part ACT23, which is on a second side, in the second direction Y, of the (2-1)-th semiconductor part ACT21. The (2-2)-th and (2-3)-th semiconductor parts ACT22 and ACT23 may not overlap the semiconductor opening OP_ACT2. The (2-1)-th semiconductor part ACT21 may include a (2-1-1)-th semiconductor part ACT21a, which is between the semiconductor opening OP_ACT2 and the first semiconductor part ACT1, a (2-1-2)-th semiconductor part ACT21b, which is disposed on a second side, in the first direction X, of the semiconductor opening OP_ACT2, and a (2-1-3)-th semiconductor part ACT21c, which is between the semiconductor opening OP_ACT2 and the (2-1-2)-th semiconductor part ACT21b. For example, a first-side semiconductor part may include the (2-1-2)-th semiconductor part ACT21b and the (2-1-3)-th semiconductor part ACT21c. The (2-1-2)-th semiconductor part ACT21b may overlap a first connecting electrode ACNE1, and the (2-1-1)-th and (2-1-3)-th semiconductor parts ACT21a and ACT21c may not overlap the first connecting electrode ACNE1. The (2-2)-th semiconductor part ACT22 may overlap the second gate insulating layer 115b and a (1-1)-th connecting electrode ACNE11 of the first connecting electrode ACNE1 on second sides (e.g., a left side and a lower side) thereof in the first and second directions X and Y. The (2-3)-th semiconductor part ACT23 may overlap the second gate insulating layer 115b and the (1-1)-th connecting electrode ACNE11 on a second side (e.g., a left side) thereof in the first direction X and a first side (e.g., an upper side) thereof in the second direction Y.

The third semiconductor part ACT3 may include a (3-1)-th semiconductor part ACT31, which includes the semiconductor opening OP_ACT3, a (3-2)-th semiconductor part ACT32, which is on a first side, in the second direction Y, of the (3-1)-th semiconductor part ACT31, and a (3-3)-th semiconductor part ACT33, which is on a second side, in the second direction Y, of the (3-1)-th semiconductor part ACT31. The (3-2)-th and (3-3)-th semiconductor parts ACT32 and ACT33 may not overlap the semiconductor opening OP_ACT3.

The (3-1)-th semiconductor part ACT31 may include a (3-1-1)-th semiconductor part ACT31a, which is between the semiconductor opening OP_ACT3 and the first semiconductor part ACT1, a (3-1-2)-th semiconductor part ACT31b, which is disposed on a first side, in the first direction X, of the semiconductor opening OP_ACT3, and a (3-1-3)-th semiconductor part ACT31c, which is between the semiconductor opening OP_ACT3 and the (3-1-2)-th semiconductor part ACT31b. The (3-1-2)-th semiconductor part ACT31b may overlap a second connecting electrode ACNE2, and the (3-1-1)-th and (3-1-3)-th semiconductor parts ACT31a and ACT31c may not overlap the second connecting electrode ACNE2. The (3-2)-th semiconductor part ACT32 may overlap the third gate insulating layer 115c and a (2-1)-th connecting electrode ACNE21 of the second connecting electrode ACNE2 on first sides (e.g., a right side and a lower side) thereof in the first and second directions X and Y. The (3-3)-th semiconductor part ACT33 may overlap the third gate insulating layer 115c and the (2-1)-th connecting electrode ACNE21 on a first side (e.g., a right side) thereof in the first direction X and a second side (e.g., an upper side) thereof in the second direction Y.

The gate insulating layer 115 may be disposed on the semiconductor layer ACT. The gate insulating layer 115 (e.g., 115a, 115b, and 115c) may overlap the first and second connecting electrodes ACNE1 and ACNE2 and the gate electrode GE. The second and third gate insulating layers 115b and 115c overlapping the first and second connecting electrodes ACNE1 and ACNE2 may include insulating recesses RP_115 and RP_115' and contact holes CNT1 and CNT2, respectively. As illustrated in FIGS. 17 and 19, the insulating recesses RP_115 and RP_115' may be recessed from a side (e.g., a right side) of the second gate insulating layer 115b and a side (e.g., a left side) of the third gate insulating layer 115c in a direction away from the semiconductor openings OP_ACT2 and OP_ACT3, respectively.

The second and third gate insulating layers 115b and 115c overlapping the first and second connecting electrodes ACNE1 and ACNE2, respectively, may include longitudinal sides extending in the second direction Y and latitudinal sides extending in the first direction X. FIGS. 17 and 19 illustrate that the corners of the gate insulating layer 115 where the longitudinal sides and the latitudinal sides meet are right-angled, but embodiments are not limited thereto. In another example, the corners where the longitudinal sides and the latitudinal sides of the gate insulating layer 115 meet may be rounded. FIGS. 17 and 19 illustrate that the sides of the gate insulating layer 115 extend in the first or second direction X or Y, but embodiments are not limited thereto. In another example, the sides of the gate insulating layer 115 may extend in directions other than the first and second directions X and Y.

The contact holes CNT1 and CNT2 may be surrounded (e.g., completely surrounded) by the second and third gate insulating layers 115b and 115c.

The first gate insulating layer 115a overlapping the gate electrode GE may substantially have a linear shape extending in the second direction Y.

The insulating recesses RP_115 and RP_115' of the second and third gate insulating layers 115b and 115c may be adjacent to the semiconductor openings OP_ACT2 and OP_ACT3, respectively, in the first direction X. An end portion (e.g., a left side) of the insulating recess RP_115 overlapping the first connecting electrode ACNE1 in the first direction X may be substantially aligned with an end portion (e.g., a left side) of the second semiconductor part ACT2 in the first direction X. An end portion (e.g., a right side) of the insulating recess RP_115' overlapping the second connecting electrode ACNE2 in the first direction X may be substantially aligned with an end portion (e.g., a right side) of the third semiconductor part ACT3 in the first direction X. As illustrated in FIG. 21, the second gate insulating layer 115b overlapping the first connecting electrode ACNE1 may be in contact with the (2-1)-th semiconductor part ACT21 of the second semiconductor part ACT2. and the third gate insulating layer 115c overlapping the second connecting electrode ACNE2 may be in contact with the (3-1)-th semiconductor part ACT31 of the third semiconductor part ACT3. However, embodiments are not limited to this.

The second gate insulating layer 115b overlapping the first connecting electrode ACNE1 may be in contact with end portions (e.g., opposite end portions), in the second direction Y, of a (1-2)-th connecting electrode ACNE12. For example, parts of the second gate insulating layer 115b overlapping parts of the first connecting electrode ACNE1 may be spaced apart from each other by the insulating recess RP_115, in which the (1-2)-th connecting electrode ACNE12 is disposed, and the distance D1 between the parts (e.g., end portions) of the second gate insulating layer 115b (or a length of the insulating recess RP_115) in the second direction Y and a width W2 of the (1-2)-th connecting electrode ACNE12 in the second direction Y may be substantially the same as each other. However, embodiments are not limited to this.

The third gate insulating layer 115c overlapping the second connecting electrode ACNE2 may be in contact with end portions (e.g., opposite end portions), in the second direction Y, of the (2-2)-th connecting electrode ACNE22. For example, parts of the third gate insulating layer 115c overlapping parts of the second connecting electrode ACNE2 may be spaced apart from each other by the insulating recess RP_115', in which the (2-2)-th connecting electrode ACNE22 is disposed, and the distance D1' between the parts (e.g., end portions) of the gate insulating layer 115 that are spaced apart from each other by the insulating recess RP_115', in which the (2-2)-th connecting electrode ACNE22 is disposed and the width W2' of the (2-2)-th connecting electrode ACNE22 may be the same as each other. However, embodiments are not limited to this.

The second conductive layer may be disposed on the gate insulating layer 115.

The second conductive layer may include the first and second connecting electrodes ACNE1 and ACNE2 and the gate electrode GE. The gate electrode GE may extend in the second direction Y and may have a certain width. The gate electrode GE may overlap the first semiconductor part ACT1. The width W4, in the first direction X, of the first gate insulating layer 115a overlapping the gate electrode GE may be greater than the width W3, in the first direction X, of the gate electrode GE. For example, the first gate insulating layer 115a may protrude beyond sides (e.g., opposite sides), in the first direction X, of the gate electrode GE. The first semiconductor part ACT1, which overlaps the gate electrode GE, may form the channel region of a thin-film transistor (TFT). The second and third semiconductor parts ACT2 and ACT3 may form the drain and source regions of the thin-film transistor (TFT). The conductivity of the first semiconductor part ACT1 may be lower than the conductivity of the (2-2)-th and (2-3)-th semiconductor parts ACT22 and ACT23 of the second semiconductor part ACT2 and the conductivity of the (3-2)-th and (3-3)-th semiconductor parts ACT32 and ACT33 of the third semiconductor part ACT3.

The first connecting electrode ACNE1 may overlap the second semiconductor part ACT2. The first connecting electrode ACNE1 may include the (1-1)-th connecting electrode ACNE11 and the (1-2)-th connecting electrode ACNE12, which is connected to the (1-1)-th connecting electrode ACNE11 and protrudes toward the semiconductor opening OP_ACT2. The (1-1)-th connecting electrode ACNE11 may have a rectangular shape in a plan view. For example, the (1-1)-th connecting electrode ACNE11 may have latitudinal sides extending in the first direction X and longitudinal sides extending in the second direction Y. The corners where the latitudinal sides and the longitudinal sides of the (1-1)-th connecting electrode ACNE11 meet may be right-angled, but embodiments are not limited thereto. In another example, the corners where the latitudinal sides and the longitudinal sides of the (1-1)-th connecting electrode ACNE11 meet may be rounded. The shape of the (1-1)-th connecting electrode ACNE11 is not limited. In another example, the (1-1)-th connecting electrode ACNE11 may have a circular shape, an elliptical shape, or another polygonal shape.

The (1-2)-th connecting electrode ACNE12 may protrude in the first direction X from the middle portion of the longitudinal side of the (1-1)-th connecting electrode ACNE11 on a first side, in the first direction X, of the (1-1)-th connecting electrode ACNE11. A length LL2 (see, e.g., FIG. 17) by which the (1-2)-th connecting electrode ACNE12 protrudes in the first direction X from the middle portion of the longitudinal side of the (1-1)-th connecting electrode ACNE11 on the first side, in the first direction X, of the (1-1)-th connecting electrode ACNE11 may be about 0.01 to about 0.1 times of the length LL1 of the latitudinal sides of the (1-1)-th connecting electrode ACNE11. For example, the length LL2 by which the (1-2)-th connecting electrode ACNE12 protrudes in the first direction X from the middle portion of the longitudinal side of the (1-1)-th connecting electrode ACNE11 on the first side, in the first direction X, of the (1-1)-th connecting electrode ACNE11 may be about 0.1 μm to about 3 μm, but embodiments are not limited thereto. A width W1, in the second direction Y, of the (1-1)-th connecting electrode ACNE11 may be greater than the width W2, in the second direction Y, of the (1-2)-th connecting electrode ACNE12. The width W2 of the (1-2)-th connecting electrode ACNE12 may be the same as the width W5, in the second direction Y, of the semiconductor opening OP_ACT2, but embodiments are not limited thereto. The length LL2 by which the (1-2)-th connecting electrode ACNE12 protrudes in the first direction X from the middle portion of the longitudinal side of the (1-1)-th connecting electrode ACNE11 on the first side, in the first direction X, of the (1-1)-th connecting electrode ACNE11 may be formed in consideration of the shape of the gate insulating layer 115. The length LL2 by which the (1-2)-th connecting electrode ACNE12 protrudes in the first direction X from the middle portion of the longitudinal side of the (1-1)-th connecting electrode ACNE11 on the first side, in the first direction X, of the (1-1)-th connecting electrode ACNE11 may be formed such that a longitudinal side of the (1-2)-th connecting electrode ACNE12 on a first side, in the first direction X, of the (1-2)-th connecting electrode ACNE12 may be aligned with the same line as, or protrude in the first direction X beyond the corresponding longitudinal side of the second gate insulating layer 115b. FIG. 17 illustrates the longitudinal side of the (1-2)-th connecting electrode ACNE12 on the first side, in the first direction X, of the (1-2)-th connecting electrode ACNE12 as being aligned with the same line as the longitudinal side of the gate insulating layer 115. In another example, the (1-2)-th connecting electrode ACNE12 may protrude in the first direction X beyond the gate insulating layer 115.

The second gate insulating layer 115b overlapping the first connecting electrode ACNE1 may be formed to protrude (or extend) outwardly beyond the sides of the (1-1)-th connecting electrode ACNE11. For example, the longitudinal sides of part of the second gate insulating layer 115b overlapping the (1-1)-th connecting electrode ACNE11 may protrude in the first direction X beyond their respective longitudinal sides of the (1-1)-th connecting electrode ACNE11 by a certain length, and the latitudinal sides of the part of the gate insulating layer 115 overlapping the (1-1)-th connecting electrode ACNE11 may protrude in the second direction Y beyond their respective latitudinal sides of the (1-1)-th connecting electrode ACNE11 by a certain length. In another example, a longitudinal side of the second gate insulating layer 115b overlapping the (1-1)-th connecting electrode ACNE11 on a first side, in the first direction X, may be aligned with a longitudinal side of the (1-1)-th connecting electrode ACNE11 on the first side, in the first direction X, of the (1-1)-th connecting electrode ACNE11 or may be recessed from the longitudinal side of the (1-1)-th connecting electrode ACNE11 on the first side, in the first direction X, of the (1-1)-th connecting electrode ACNE11, by a certain length in the first direction X, to form a (2-1-3)-th semiconductor part ACT21$c$ connected (e.g., directly connected) to the (2-2)-th and (2-3)-th semiconductor parts ACT22 and ACT23. The (2-1-3)-th semiconductor part ACT21$c$ may be a conductive semiconductor part. As the (2-2)-th and (2-3)-th semiconductor parts ACT22 and ACT23, which are connected (e.g., directly connected) to the (2-1-3)-th semiconductor part ACT21$c$, include their own conductive semiconductor parts, signals received through the first connecting electrode ACNE1 may be transmitted from the (2-1-3)-th semiconductor part ACT21$c$ to the (2-2)-th and (2-3)-th semiconductor parts ACT22 and ACT23 through the conductive semiconductor parts of the (2-2)-th and (2-3)-th semiconductor parts ACT22 and ACT23, or signals received through the (2-2)-th and (2-3)-th semiconductor parts ACT22 and ACT23 may be transmitted to the first connecting electrode ACNE1 through the (2-1-3)-th semiconductor part ACT21$c$.

The shapes of the semiconductor opening OP_ACT2, the (2-1-2)-th semiconductor part ACT21$b$, and the (2-1-3)-th semiconductor part ACT21$c$ of the second semiconductor part ACT2 may be related to the shape of the first connecting electrode ACNE1. The (2-1-2)-th semiconductor part ACT21$b$ may correspond to the overlapping area of the second semiconductor part ACT2 and the (1-1)-th and (1-2)-th connecting electrodes ACNE11 and ACNE12, and the (2-1-3)-th semiconductor part ACT21$c$ may correspond to part of the second semiconductor part ACT2 protruding, by a certain length, from an outline formed by the outer profiles on the first sides, in the first direction X, of the (1-1)-th and (1-2)-th connecting electrodes ACNE11 and ACNE12. The outer profile on a second side, in the first direction X, of the semiconductor opening OP_ACT2 may be formed to correspond to the outline formed by the outer profiles on the first sides, in the first direction X, of the (1-1)-th and (1-2)-th connecting electrodes ACNE11 and ACNE12 to the entire second semiconductor part ACT2 except for the (2-1-1)-th, (2-1-2)-th and (2-1-3)-th semiconductor parts ACT21$a$, ACT21$b$, and ACT21$c$. As the longitudinal side of the second gate insulating layer 115$b$ overlapping the first connecting electrode ACNE1 on the first side, in the first direction X, is aligned with on the first side, in the first direction X, of the first connecting electrode ACNE1, or recessed in the first direction X from a longitudinal side of the (1-2)-th connecting electrode ACNE12 on a first side, in the first direction X, of the (1-2)-th connecting electrode ACNE12, an end portion of the (2-1-3)-th semiconductor part ACT21$c$ on a first side, in the second direction Y, of the (2-1-3)-th semiconductor part ACT21$c$ may extend even to the (2-2)-th semiconductor part ACT22 and may thus be connected (e.g., directly connected) to the (2-2)-th semiconductor part ACT22, and an end portion of the (2-1-3)-th semiconductor part ACT21$c$ on a second side, in the second direction Y, of the (2-1-3)-th semiconductor part ACT21$c$ may extend even to the (2-3)-th semiconductor part ACT23 and may thus be connected (e.g., directly connected) to the (2-3)-th semiconductor part ACT23. As a result, signals received through the first connecting electrode ACNE1 may be transmitted from the (2-1-3)-th semiconductor part ACT21$c$ to the (2-2)-th and (2-3)-th semiconductor parts ACT22 and ACT23 through the conductive semiconductor parts of the (2-2)-th and (2-3)-th semiconductor parts ACT22 and ACT23, and signals received through the (2-2)-th and (2-3)-th semiconductor parts ACT22 and ACT23 may be transmitted even to the first connecting electrode ACNE1 through the (2-1-3)-th semiconductor part ACT21$c$. The second connecting electrode ACNE2 may include the (2-1)-th connecting electrode ACNE21 and the (2-2)-th connecting electrode ACNE22, which is connected to the (2-1)-th connecting electrode ACNE21 and protrudes toward the semiconductor opening OP_ACT3. The (2-1)-th connecting electrode ACNE21 may have a rectangular shape in a plan view. For example, the (2-1)-th connecting electrode ACNE21 may have latitudinal sides extending in the first direction X and longitudinal sides extending in the second direction Y. The corners where the latitudinal sides and the longitudinal sides of the (2-1)-th connecting electrode ACNE21 meet may be right-angled, but embodiments are not limited thereto. In another example, the corners where the latitudinal sides and the longitudinal sides of the (2-1)-th connecting electrode ACNE21 meet may be rounded. The shape of the (2-1)-th connecting electrode ACNE21 is not limited. In another example, the (2-1)-th connecting electrode ACNE21 may have a circular shape, an elliptical shape, or another polygonal shape.

The (2-2)-th connecting electrode ACNE22 may protrude in the first direction X from the middle portion of the longitudinal side of the (2-1)-th connecting electrode ACNE21 on a second side, in the first direction X, of the (2-1)-th connecting electrode ACNE21. The length LL2' by which the (2-2)-th connecting electrode ACNE22 protrudes in the first direction X from a longitudinal side of the (2-1)-th connecting electrode ACNE21 on the second side, in the first direction X, of the (2-1)-th connecting electrode ACNE21 may be about 0.01 to about 0.1 times of the length LL1' of the latitudinal sides of the (2-1)-th connecting electrode ACNE21. For example, the length LL2' by which the (2-2)-th connecting electrode ACNE22 protrudes in the first direction X from the longitudinal side of the (2-1)-th connecting electrode ACNE21 on the second side, in the first direction X, of the (2-1)-th connecting electrode ACNE21 may be about about 0.1 μm to about 3 μm, but embodiments are not limited thereto. The width W1', in the second direction Y, of the (2-1)-th connecting electrode ACNE21 may be greater than the width W2', in the second direction Y, of the (2-2)-th connecting electrode ACNE22.

As already mentioned above with regard to the first connecting electrode ACNE1, the length LL2' by which the (2-2)-th connecting electrode ACNE22 protrudes in the first direction X from the longitudinal side of the (2-1)-th connecting electrode ACNE21 on the second side, in the first direction X, of the (2-1)-th connecting electrode ACNE21 may be formed in consideration of the shape of the third gate insulating layer 115$c$. For example, the length LL2' by which the (2-2)-th connecting electrode ACNE22 protrudes in the first direction X from the longitudinal side of the (2-1)-th connecting electrode ACNE21 on the second side, in the first direction X, of the (2-1)-th connecting electrode ACNE21 may be formed such that the (2-2)-th connecting electrode ACNE22 may be at least aligned with the third gate insulating layer 115$c$ or may protrude in the first direction X beyond the third gate insulating layer 115$c$.

The third gate insulating layer 115$c$ overlapping the second connecting electrode ACNE2 may be formed to protrude (or extend) outwardly beyond the sides of the (2-1)-th connecting electrode ACNE21. The relationship between the second connecting electrode ACNE2 and the third gate insulating layer 115c is almost the same as the relationship between the first connecting electrode ACNE1 and the second gate insulating layer 115b, and thus, a detailed description thereof will be omitted for descriptive convenience.

A longitudinal side of the third gate insulating layer 115c overlapping the (2-1)-th connecting electrode ACNE21 extending in the first direction X may be aligned with a longitudinal side of the (2-1)-th connecting electrode ACNE21 extending in the first direction X. For example, the third gate insulating layer 115c overlapping the (2-1)-th connecting electrode ACNE21 may be recessed from the longitudinal side of the (2-1)-th connecting electrode ACNE21 by a certain length in the first direction X. Thus, a (3-1-3)-th semiconductor part ACT31c may be connected (e.g., directly connected) to the (3-2)-th and (3-3)-th semiconductor parts ACT32 and ACT33. The (3-1-3)-th semiconductor part ACT31c may be a conductive semiconductor part. As the (3-2)-th and (3-3)-th semiconductor parts ACT32 and ACT33, which are connected (e.g., directly connected) to the (3-1-3)-th semiconductor part ACT31c, include their own conductive semiconductor parts, signals received through the second connecting electrode ACNE2 may be transmitted from the (3-1-3)-th semiconductor part ACT31c to the (3-2)-th and (3-3)-th semiconductor parts ACT32 and ACT33 through the conductive semiconductor parts of the (3-2)-th and (3-3)-th semiconductor parts ACT32 and ACT33, or signals received through the (3-2)-th and (3-3)-th semiconductor parts ACT32 and ACT33 may be transmitted to the second connecting electrode ACNE2 through the (3-1-3)-th semiconductor part ACT31c.

The shapes of the semiconductor opening OP_ACT3, the (3-1-2)-th semiconductor part ACT31b, and the (3-1-3)-th semiconductor part ACT31c of the third semiconductor part ACT3 may be related to the shape of the second connecting electrode ACNE2. The (3-1-2)-th semiconductor part ACT31b may correspond to the overlapping area of the third semiconductor part ACT3 and the (2-1)-th and (2-2)-th connecting electrodes ACNE21 and ACNE22, and the (3-1-3)-th semiconductor part ACT31c may correspond to part of the third semiconductor part ACT3 protruding, by a certain length, from an outline formed by the outer profiles on the second sides, in the first direction X, of the (2-1)-th and (2-2)-th connecting electrode ACNE21 and ACNE22. The outer profile on a first side, in the first direction X, of the semiconductor opening OP_ACT3 may be formed to correspond to the outline formed by the outer profiles on the second sides, in the first direction X, of the (2-1)-th and (2-2)-th connecting electrodes ACNE21 and ACNE22 to the entire third semiconductor part ACT3 except for the (3-1-1)-th, (3-1-2)-th and (3-1-3)-th semiconductor parts ACT31a, ACT31b, and ACT31c. As the longitudinal side of the third gate insulating layer 115c overlapping the second connecting electrode ACNE2 is aligned with, or the third gate insulating layer 115c may be recessed in the first direction X from a longitudinal side of the (2-2)-th connecting electrode ACNE22, an end portion of the (3-1-3)-th semiconductor part ACT31c on a first side, in the second direction Y, of the (3-1-3)-th semiconductor part ACT31c may extend even to the (3-2)-th semiconductor part ACT32 and may thus be connected (e.g., directly connected) to the (3-2)-th semiconductor part ACT32, and an end portion of the (3-1-3)-th semiconductor part ACT31c on a second side, in the second direction Y, of the (3-1-3)-th semiconductor part ACT31c may extend even to the (3-3)-th semiconductor part ACT33 and may thus be connected (e.g., directly connected) to the (3-3)-th semiconductor part ACT33. As a result, signals received through the second connecting electrode ACNE2 may be transmitted from the (3-1-3)-th semiconductor part ACT31c to the (3-2)-th and (3-3)-th semiconductor parts ACT32 and ACT33 through the conductive semiconductor parts of the (3-2)-th and (3-3)-th semiconductor parts ACT32 and ACT33, and signals received through the (3-2)-th and (3-3)-th semiconductor parts ACT32 and ACT33 may be transmitted even to the second connecting electrode ACNE2 through the (3-1-3)-th semiconductor part ACT31c.

The conductivities of the first, second, and third semiconductor parts ACT1, ACT2, and ACT3 may be determined whether the first, second, and third semiconductor parts ACT1, ACT2, and ACT3 overlap the second conductive layer and the gate insulating layer 115. For example, the conductivity of semiconductor parts not overlapping the second conductive layer and the gate insulating layer 115 may be higher than the conductivity of semiconductor parts overlapping the second conductive layer and the gate insulating layer 115.

Referring to FIGS. 17 and 19 through 22, the first semiconductor part ACT1, which overlaps the gate electrode GE, the (2-1-2)-th semiconductor part ACT21b, parts of the (2-2)-th semiconductor part ACT22 (e.g., parts of the (2-2)-th semiconductor part ACT22 on the second sides, in the first and second directions X and Y, of the (2-2)-th semiconductor part ACT22), and parts of the (2-3)-th semiconductor part ACT23 (e.g., parts of the (2-3)-th semiconductor part ACT23 on the second side, in the first direction X, and the first side in the second direction Y, of the (2-3)-th semiconductor part ACT23), which all overlap the first connecting electrode ACNE1, and the (3-1-2)-th semiconductor part ACT31b, parts of the (3-2)-th semiconductor part ACT32 (e.g., parts of the (3-2)-th semiconductor part ACT32 on the first side, in the first direction X, and the second side, in the second direction Y, of the (3-2)-th semiconductor part ACT32), and parts of the (3-3)-th semiconductor part ACT33 (e.g., parts of the (3-3)-th semiconductor part ACT33 on the first sides, in the first and second directions X and Y, of the (3-3)-th semiconductor part ACT33), which all overlap the second connecting electrode ACNE2 may be semiconductor regions, and the (2-1-3)-th semiconductor part ACT21c, other parts of the (2-2)-th semiconductor part ACT22, other parts of the (2-3)-th semiconductor part ACT23, the (3-1-3)-th semiconductor part ACT31c, other parts of the (3-2)-th semiconductor part ACT32, and other parts of the (3-3)-th semiconductor part ACT33 may be conductive regions (or conductor regions). The conductivity of the conductor regions may be higher than the conductivity of the semiconductor regions.

Figure 24:
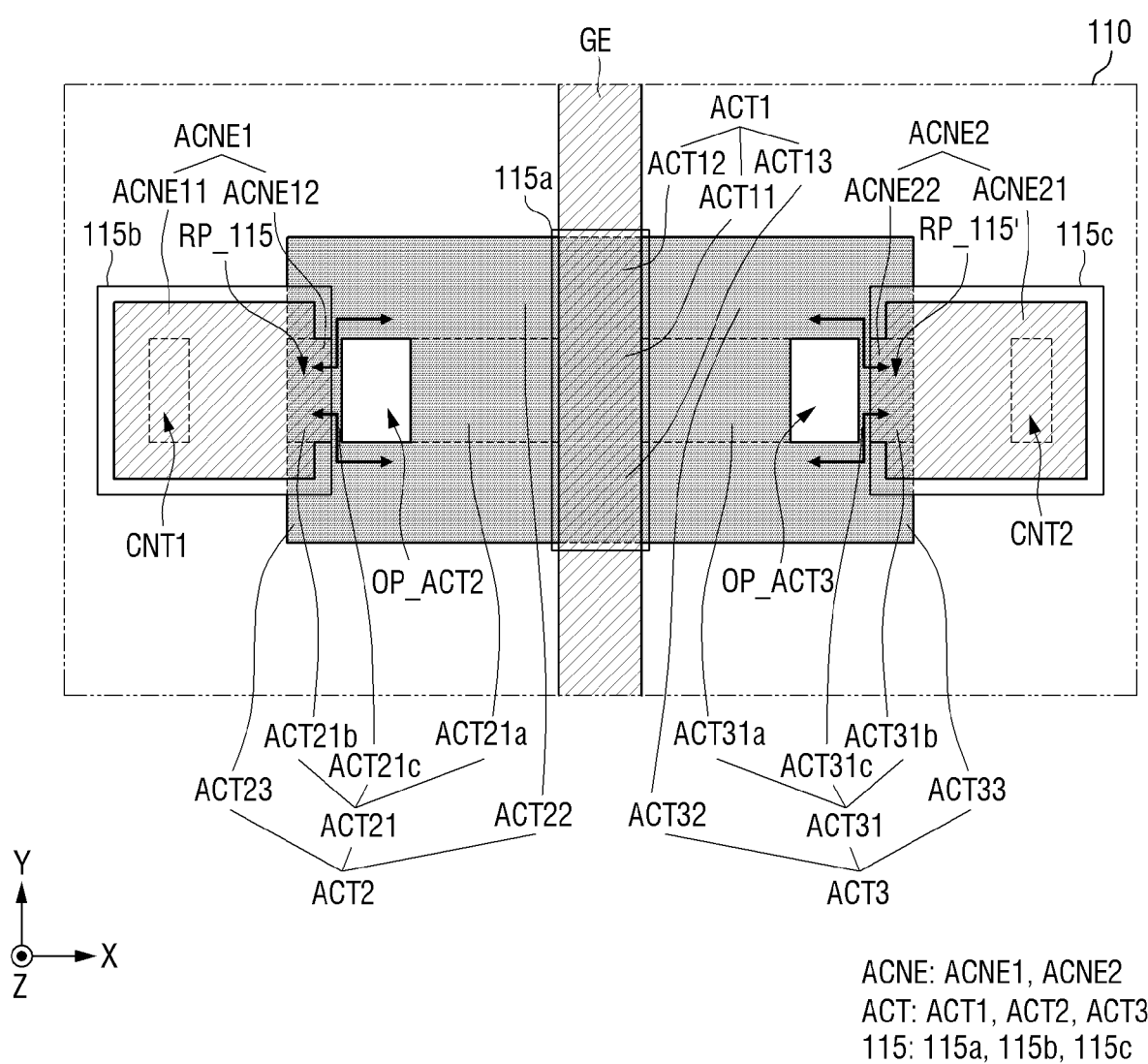
FIGS. 24 and 25 are a schematic plan view and a schematic cross-sectional view illustrating how currents flow in a transistor of a pixel of the display device of FIG. 1.
Figure 25:
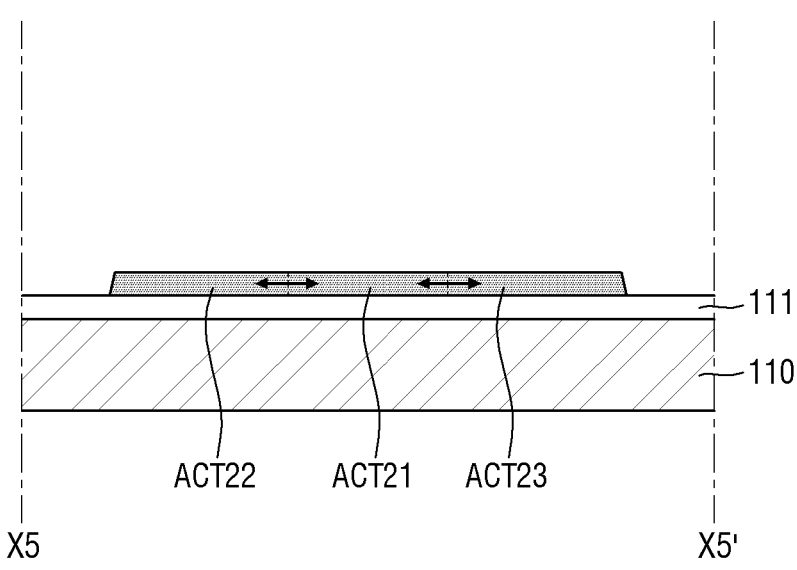

FIGS. 24 and 25 are a schematic plan view and a schematic cross-sectional view illustrating how currents flow in a transistor of a pixel of the display device of FIG. 1.

Referring to FIGS. 24 and 25 and further to FIGS. 17 and 21 through 23, as the (2-1-3)-th semiconductor part ACT21c is a conductive semiconductor part (or a conductor region) and the (2-2)-th and (2-3)-th semiconductor parts ACT22 and ACT23, which are connected (e.g., directly connected) to the (2-1-3)-th semiconductor part ACT21c, include their own conductive semiconductor parts, signals received through the first connecting electrode ACNE1 may be transmitted to the (2-2)-th and (2-3)-th semiconductor parts ACT22 and ACT23 through the conductive semiconductor parts of the (2-2)-th and (2-3)-th semiconductor parts ACT22 and ACT23, or signals received through the (2-2)-th and (2-3)-th semiconductor parts ACT22 and ACT23 may be transmitted to the first connecting electrode ACNE1 through the (2-1-3)-th semiconductor part ACT21c.

As the (3-1-3)-th semiconductor part ACT31c is a conductive semiconductor part (or a conductor region) and the (3-2)-th and (3-3)-th semiconductor parts ACT32 and ACT33, which are connected (e.g., directly connected) to the (3-1-3)-th semiconductor part ACT31c, include their own conductive semiconductor parts, signals received through the second connecting electrode ACNE2 may be transmitted to the (3-2)-th and (3-3)-th semiconductor parts ACT32 and ACT33 through the conductive semiconductor parts of the (3-2)-th and (3-3)-th semiconductor parts ACT32 and ACT33, or signals received through the (3-2)-th and (3-3)-th semiconductor parts ACT32 and ACT33 may be transmitted to the second connecting electrode ACNE2 through the (3-1-3)-th semiconductor part ACT31c.

FIGS. 26, 28, 30, 32, 34, and 37 are schematic plan views illustrating a method of manufacturing a display device according to an embodiment. FIGS. 27, 29, 31, 33, 35, 36, and 38 through 40 are schematic cross-sectional views illustrating the method of manufacturing a display device according to an embodiment. The method of manufacturing a display device according to an embodiment will hereinafter be described with reference to FIGS. 26 through 40 and further to FIGS. 17 through 23. Descriptions of elements or features that have already been described above with reference to FIGS. 17 through 23 will be omitted for descriptive convenience.

Figure 26:
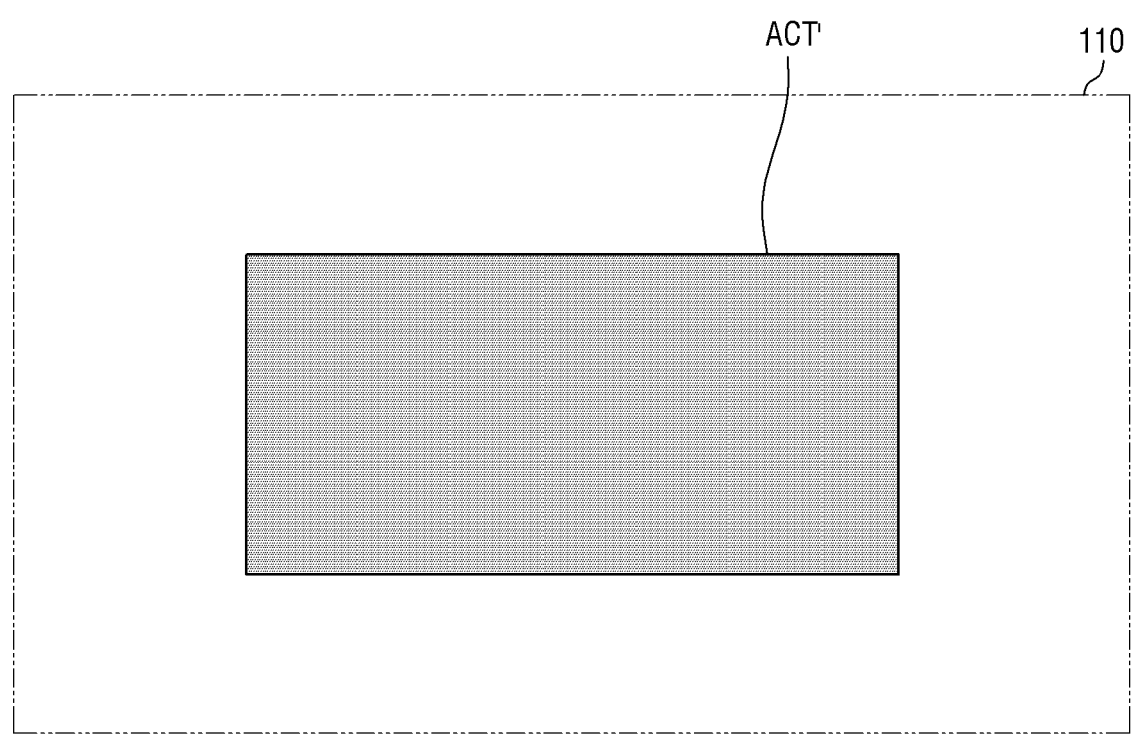
FIGS. 26, 28, 30, 32, 34, and 37 are schematic plan views illustrating a method of manufacturing a display device according to an embodiment.
Figure 26:
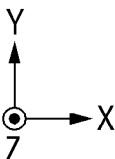
Figure 27:
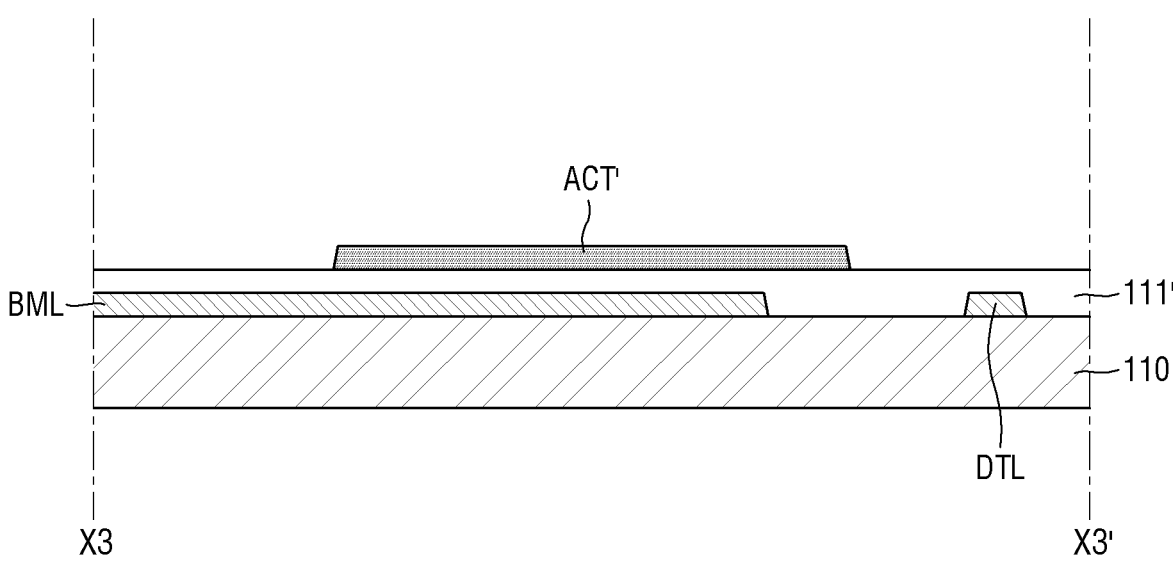
FIGS. 27, 29, 31, 33, 35, 36, and 38 through 40 are schematic cross-sectional views illustrating the method of manufacturing a display device according to an embodiment.

Referring to FIGS. 26 and 27, a conductive layer including a lower light-blocking layer BML and a data line DTL may be formed on the first base part 110, a buffer layer 111' may be formed on the first conductive layer, and a semiconductor layer ACT' may be formed on the buffer layer 111'. The first conductive layer may include Ag, Ni, Au, Pt, Al, Cu, Mo, Ti, Nd, or an alloy thereof. In some embodiments, the first conductive layer may have a single-layer structure or a multilayer structure. For example, in a case where the first conductive layer has a multilayer structure, the first conductive layer may be a stack of Ti/Cu/ITO or Ti/Cu/Al$_2$O$_3$, but embodiments are not limited thereto. For example, the buffer layer 111' may include an inorganic material such as SiO$_2$, SiN$_x$, or SiON and may be formed as a single-layer film or a multilayer film. In some embodiments, the semiconductor layer ACT' may include an oxide semiconductor. The semiconductor layer ACT' may be formed of ZnO or a ZnO-based material such as IZO or IGZO and may be a IGZO semiconductor, which is ZnO including metals such as In and Ga, but embodiments are not limited thereto. In another example, the semiconductor layer ACT' may include amorphous silicon or polysilicon.

Figure 28:
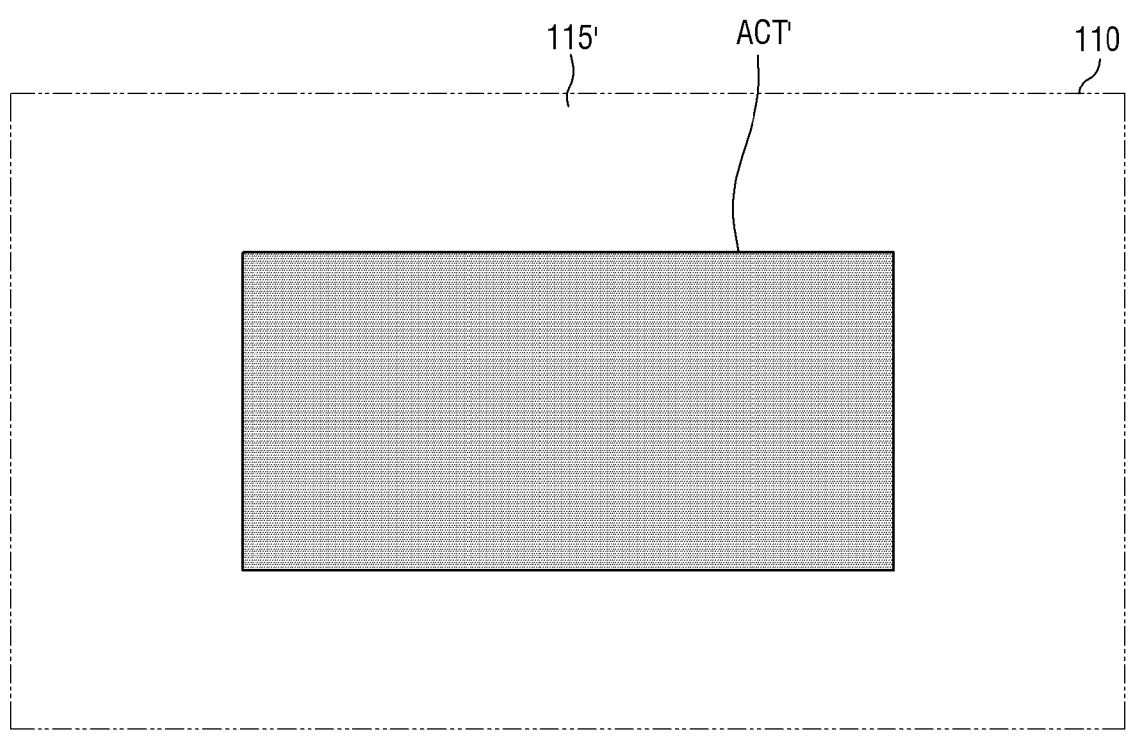
Figure 28:
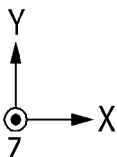
Figure 29:
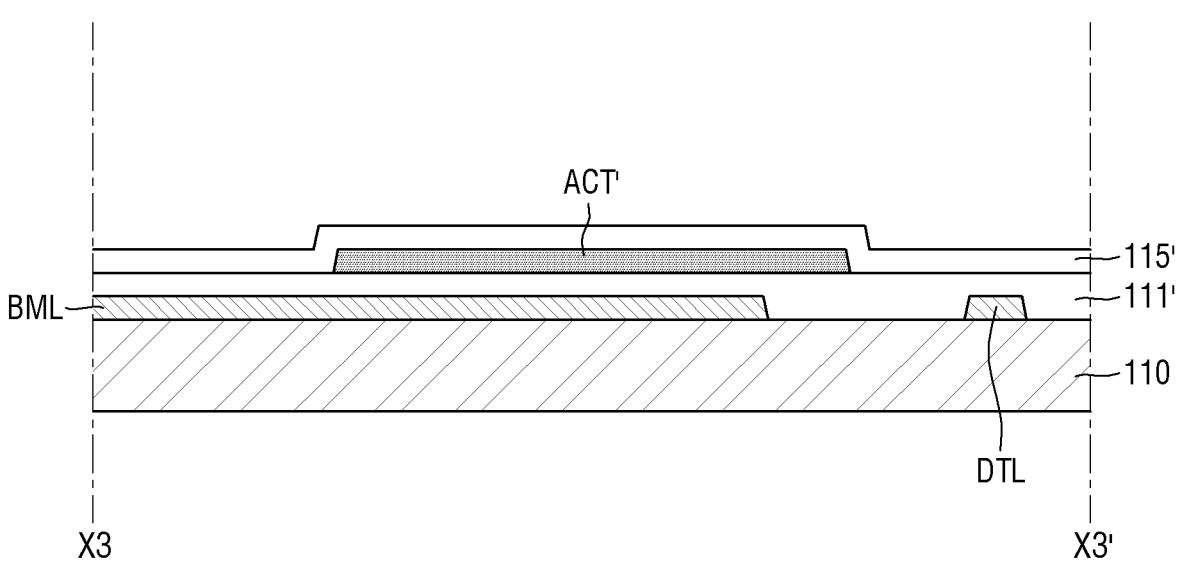

Thereafter, referring to FIGS. 28 and 29, a gate insulating layer 115' may be formed on the entire surface of the semiconductor layer ACT'. In some embodiments, the gate insulating layer 115' may include an inorganic material such as SiO$_2$, SiN$_x$, SiON, Al$_2$O$_3$, TiO$_2$, Ta$_2$O, HfO$_2$, or ZrO$_2$.

Figure 30:
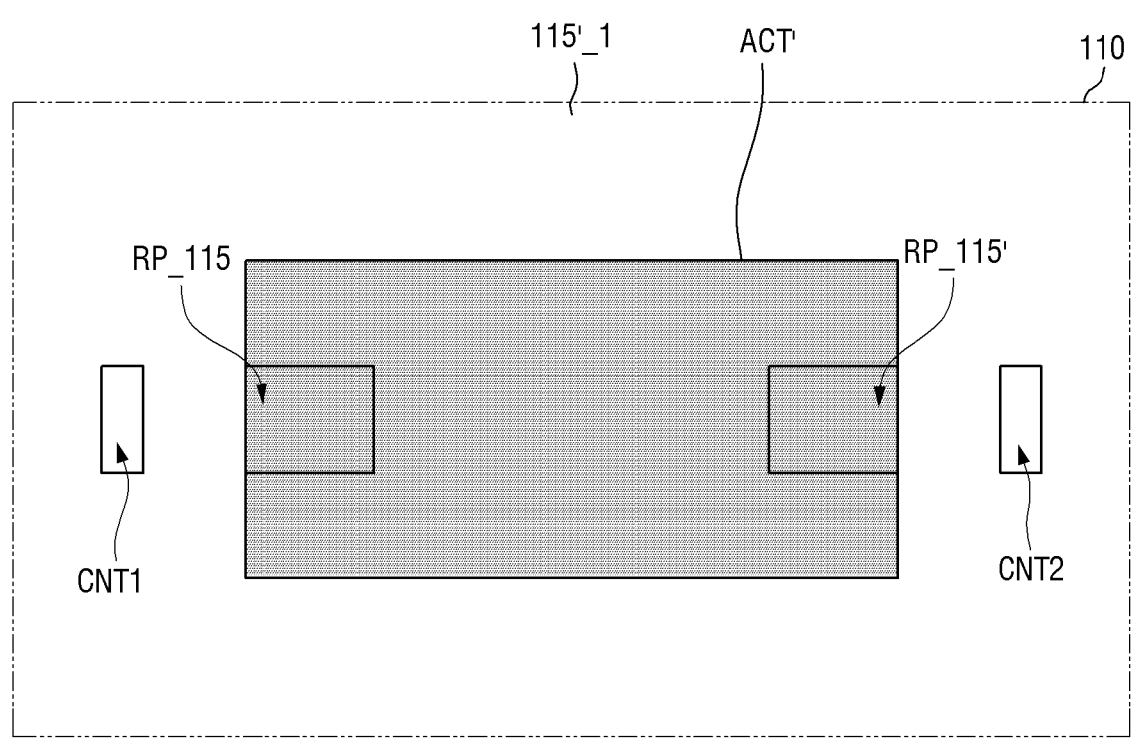
Figure 30:
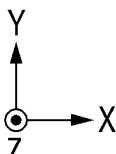
Figure 31:
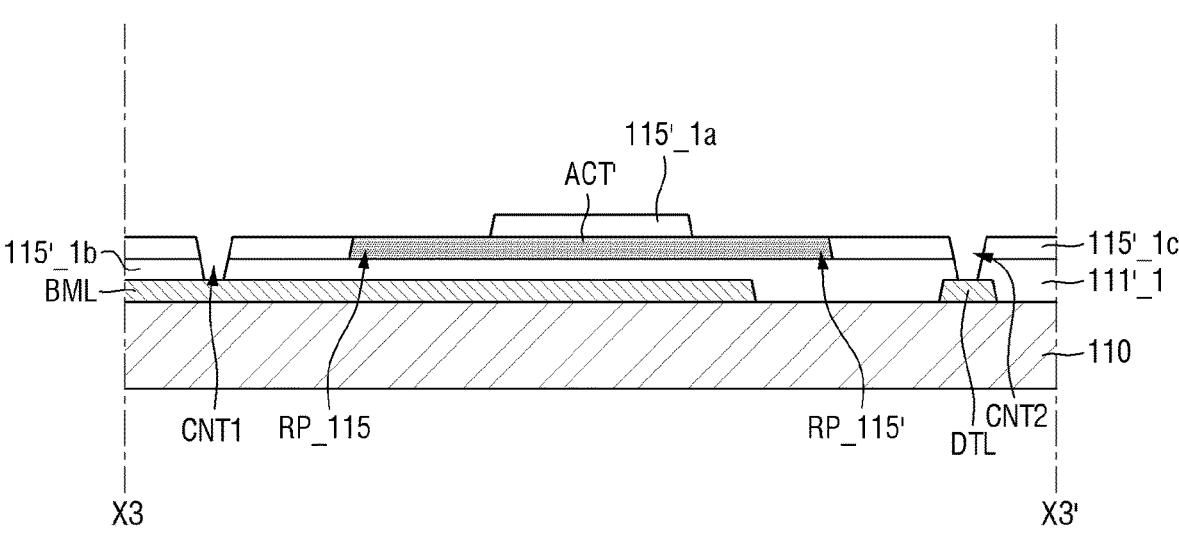

Thereafter, referring to FIGS. 30 and 31, contact holes CNT1 and CNT2 and insulating openings (or insulating recesses) RP_115 and RP_115' may be formed in a gate insulating layer 115'_1. The contact holes CNT1 and CNT2 may penetrate (e.g., completely penetrate) the gate insulating layer 115'_1 and the buffer layer 111' in the thickness direction, and the insulating openings (or insulating recesses) RP_115 and RP_115' may penetrate (e.g., completely penetrate) the gate insulating layer 115'_1 in the thickness direction. As already mentioned above, the insulating openings (or insulating recesses) RP_115 and RP_115' may overlap (e.g., completely overlap) the semiconductor layer ACT' in the thickness direction. For example, sides of the gate insulating layer 115'_1 may be in contact with sides of the semiconductor layer ACT'. For example, the gate insulating layer 115'_1 may include a first gate insulating layer 115'_1a, a second gate insulating layer 115'_1b, and a third gate insulating layer 115'_1c.

Figure 32:
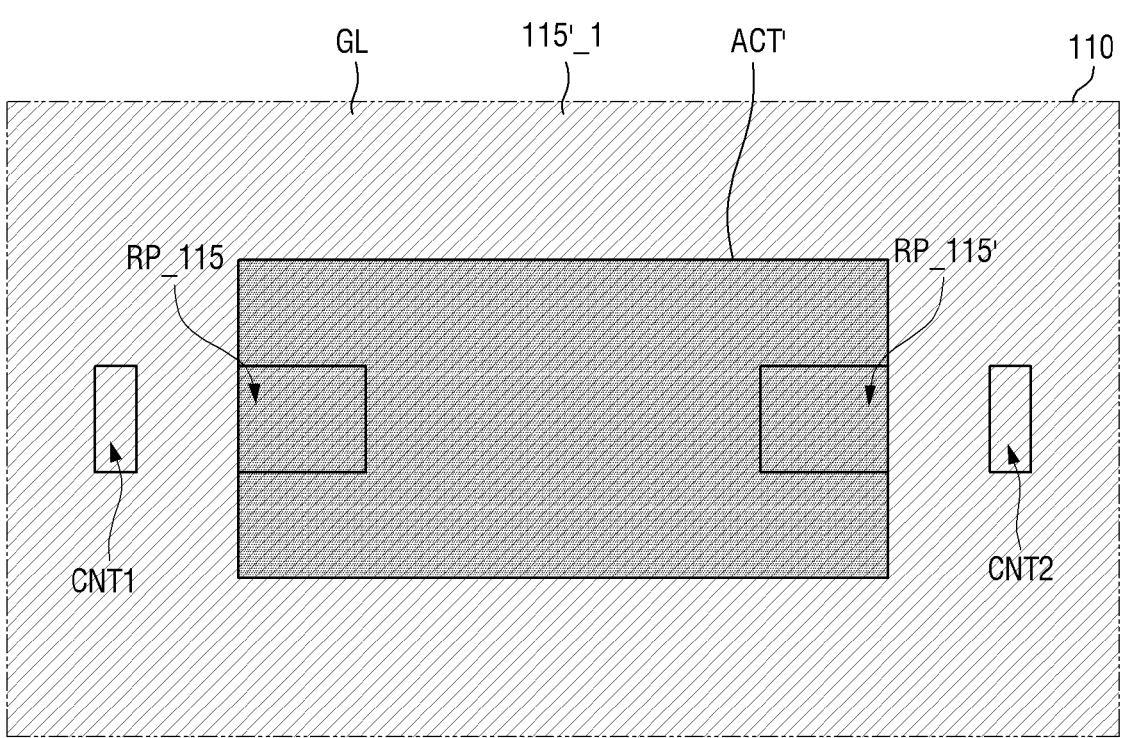
Figure 32:
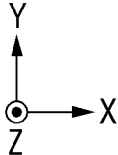
Figure 33:
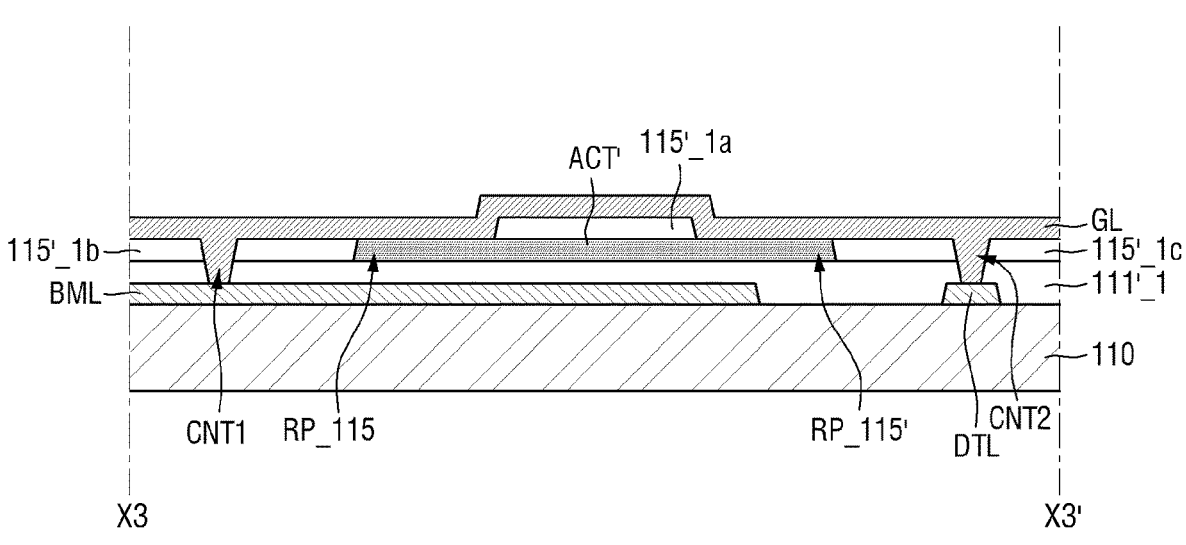

Thereafter, referring to FIGS. 32 and 33, a second conductive layer GL may be deposited on the entire surfaces of the gate insulating layer 115'_1 and the semiconductor layer ACT'. The second conductive layer GL may include at least one of Al, Pt, Pd, Ag, Mg, Au, Ni, Nd, Ir, Cr, Li, Ca, Mo, Ti, W, and Cu for adhesion to neighboring layers, surface flatness, and processability. The second conductive layer GL may be formed as a single-layer film or a multilayer film. In some embodiments, the second conductive layer GL may include a TCO. For example, the second conductive layer GL may include W$_x$O$_x$, TiO$_2$, ITO, IZO, ZnO, ITZO, or MgO. For example, the second conductive layer GL may have a structure in which Ti, Cu, and ITO are stacked from the bottom thereof, but embodiments are not limited thereto.

Figure 34:
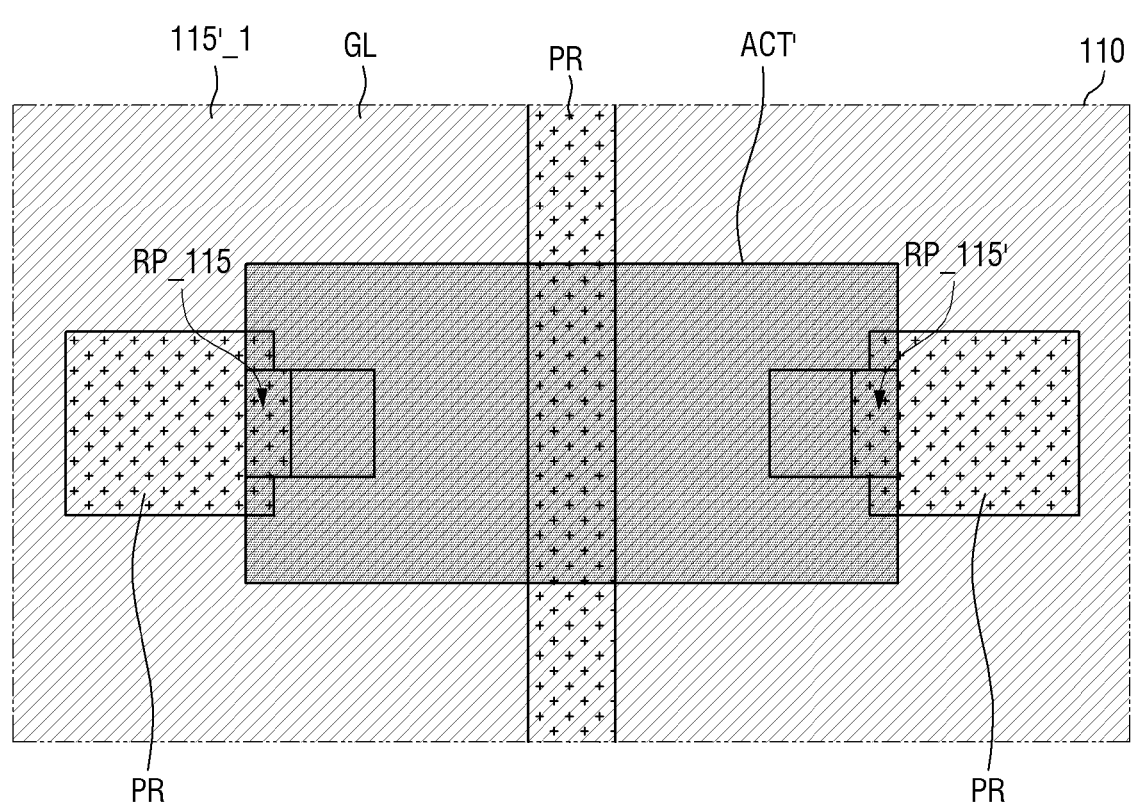
Figure 34:
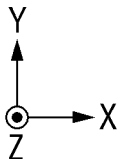
Figure 35:
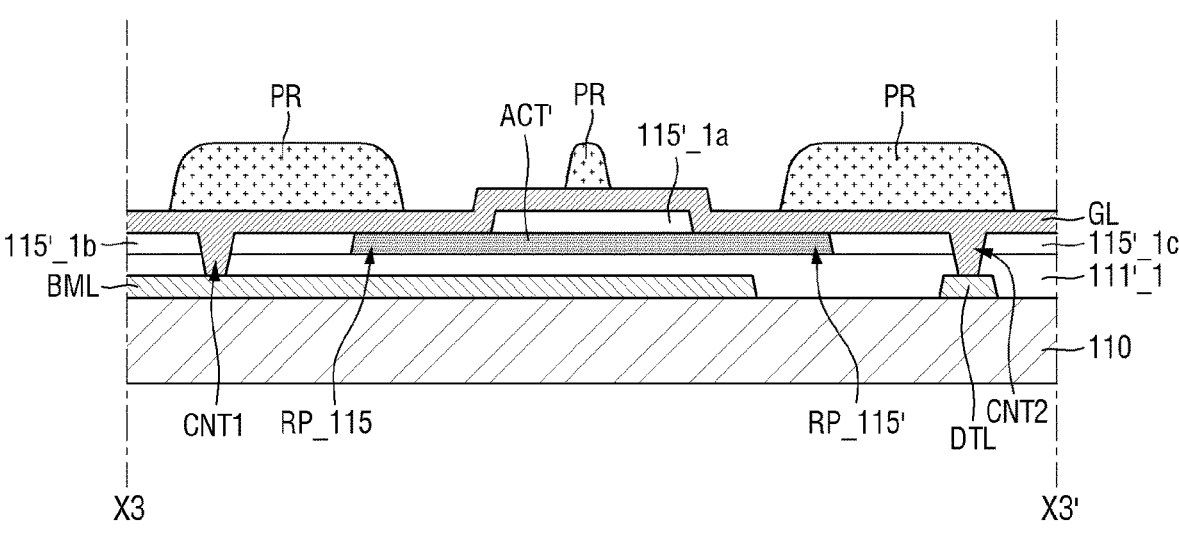

Thereafter, referring to FIGS. 34 and 35, a photoresist PR may be formed on the second conductive layer GL. First and second connecting electrodes ACNE1 and ACNE2 and a gate electrode GE of FIGS. 37 and 38 may be formed from the second conductive layer GL via the photoresist PR. For example, the photoresist PR may be disposed in regions corresponding to (or overlapping) the first and second connecting electrodes ACNE1 and ACNE2 and the gate electrode GE of FIGS. 37 and 38. FIGS. 34 and 35 illustrate that the photoresist PR is disposed in the exact regions corresponding to the first and second connecting electrodes ACNE1 and ACNE2 and the gate electrode GE of FIGS. 37 and 38. In some embodiments, the photoresist PR may have a larger area (or size) than the first and second connecting electrodes ACNE1 and ACNE2 and the gate electrode GE of FIGS. 37 and 38. For example, the photoresist PR may extend outwardly beyond the sides of each of the first and second connecting electrodes ACNE1 and ACNE2 and beyond the sides of the gate electrode GE.

Figure 36:
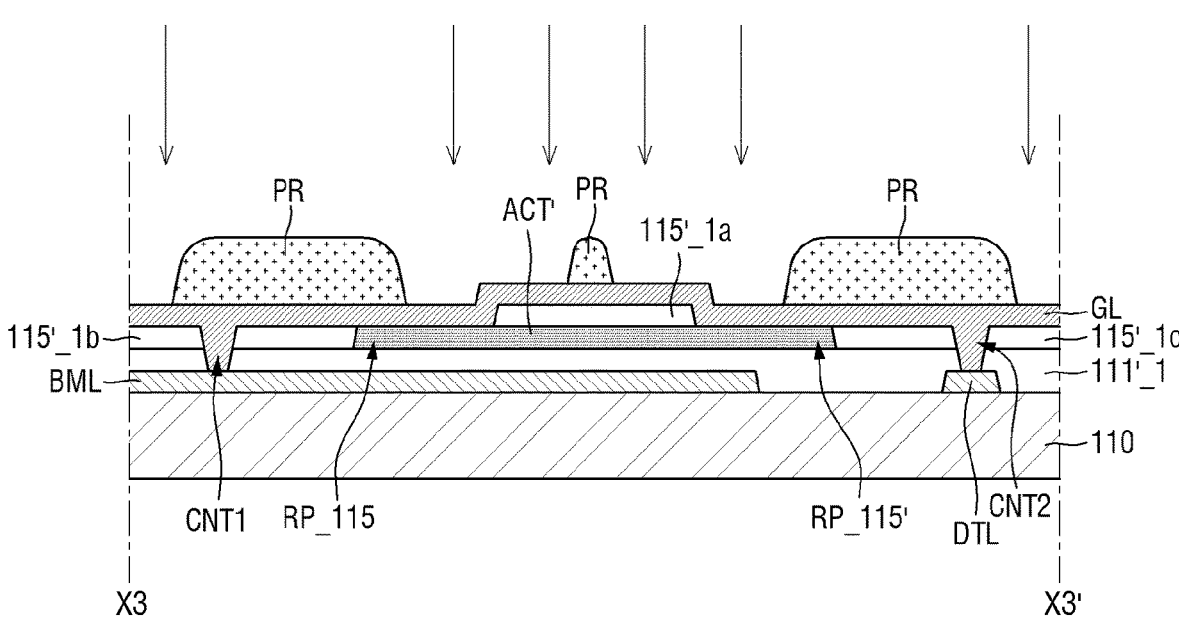

Thereafter, referring to FIG. 36, the second conductive layer GL may be etched by an etching process by using the photoresist PR on the second conductive layer GL. The second conductive layer GL may be etched by wet etching. As illustrated in FIG. 36, the second conductive layer GL may be etched using a certain etchant provided on the photoresist PR. As a result, the first and second connecting electrodes ACNE1 and ACNE2 and the gate electrode GE of FIGS. 37 and 38 may be formed.

Figure 37:
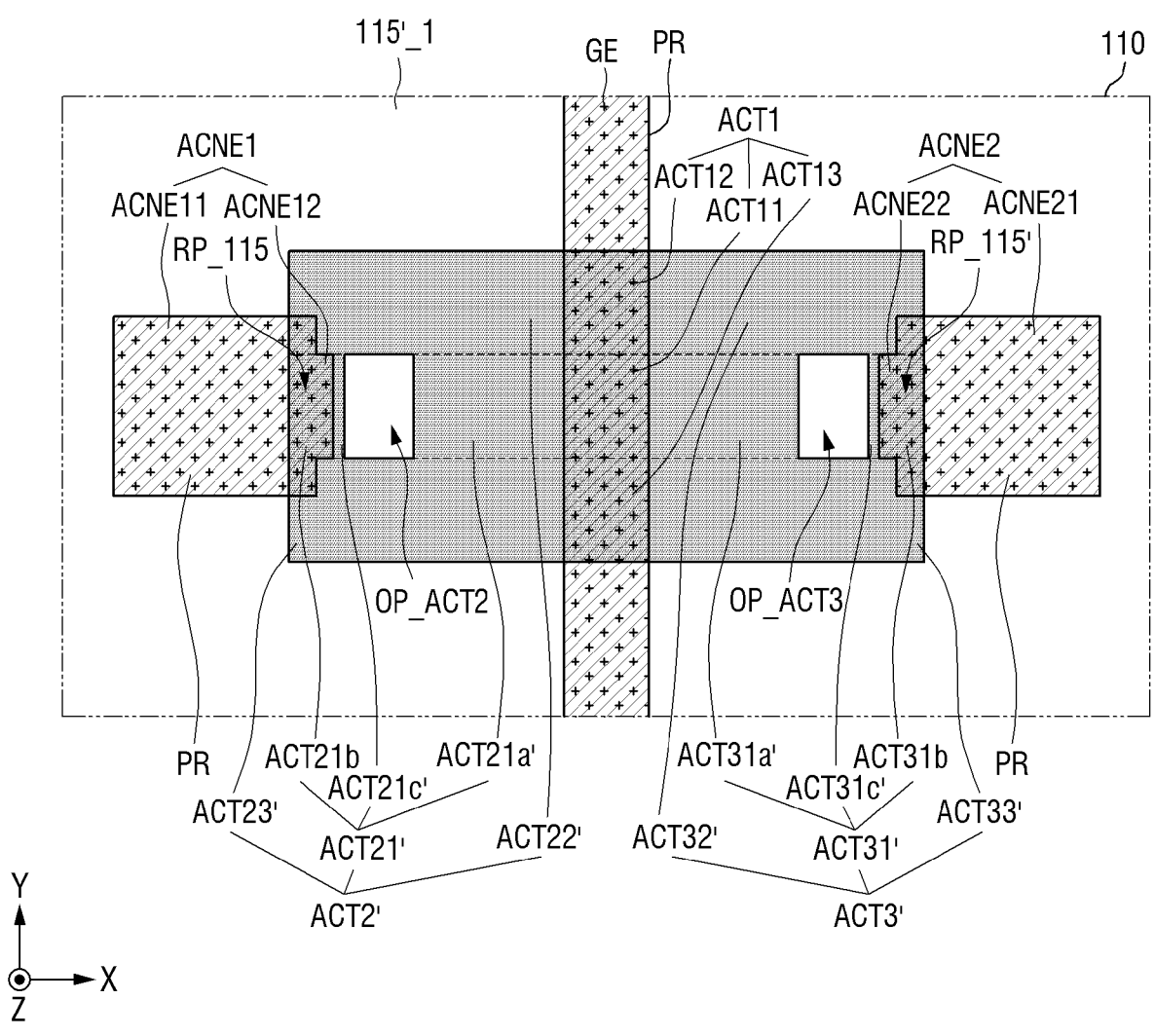
Figure 38:
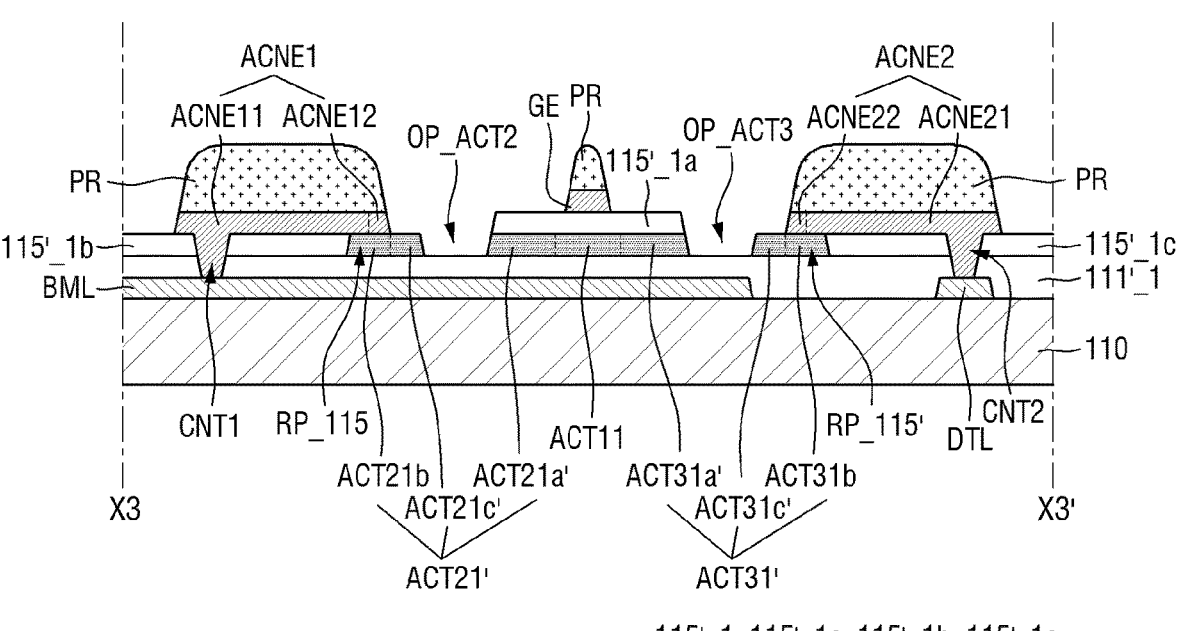

Referring to FIGS. 37 and 38, during the etching process on the second conductive layer GL, the semiconductor layer ACT' may also be etched so that semiconductor openings OP_ACT2 and OP_ACT3 may be formed. A second semiconductor part ACT2' may include a (2-1)-th semiconductor part ACT21', which includes the semiconductor opening OP_ACT2, a (2-2)-th semiconductor part ACT22', which is on a first side, in the second direction Y, of the (2-1)-th semiconductor part ACT21', and a (2-3)-th semiconductor part ACT23', which is on a second side, in the second direction Y, of the (2-1)-th semiconductor part ACT21'. The (2-2)-th and (2-3)-th semiconductor parts ACT22' and ACT23' may not overlap the semiconductor opening OP_ACT2 in the first direction X. The (2-1)-th semiconductor part ACT21' may include a (2-1-1)-th semiconductor part ACT21a', which is between the semiconductor opening OP_ACT2 and a first semiconductor part ACT1', a (2-1-2)-th semiconductor part ACT21b, which is on a second side, in the first direction X, of the semiconductor opening OP_ACT2, and a (2-1-3)-th semiconductor part ACT21$c'$, which is between the semiconductor opening OP_ACT2 and the (2-1-2)-th semiconductor part ACT21$b$. The (2-1-2)-th semiconductor part ACT21$b$ may overlap the first connecting electrode ACNE1, and the (2-1-1)-th and (2-1-3)-th semiconductor parts ACT21$a'$ and ACT21$c'$ may not overlap the first connecting electrode ACNE1. Parts of the (2-2)-th semiconductor part ACT22$'$ on second sides, in the first and second directions X and Y, of the (2-2)-th semiconductor part ACT22$'$ may overlap the second gate insulating layer 115$'$_1$b$ and a (1-1)-th connecting electrode ACNE11 of the first connecting electrode ACNE1. Parts of the (2-3)-th semiconductor part ACT23$'$ on a second side, in the first direction X, and a first side, in the second direction Y, of the (2-3)-th semiconductor part ACT23$'$ may overlap the second gate insulating layer 115$'$_1$b$ and the (1-1)-th connecting electrode ACNE11 of the first connecting electrode ACNE1.

A third semiconductor part ACT3$'$ may include a (3-1)-th semiconductor part ACT31$'$, which includes the semiconductor opening OP_ACT3, a (3-2)-th semiconductor part ACT32$'$, which is on a first side, in the second direction Y, of the (3-1)-th semiconductor part ACT31$'$, and a (3-3)-th semiconductor part ACT33$'$, which is on a second side, in the second direction Y, of the (3-1)-th semiconductor part ACT31$'$. The (3-2)-th and (3-3)-th semiconductor parts ACT32$'$ and ACT33$'$ may not overlap the semiconductor opening OP_ACT3 in the first direction X.

The (3-1)-th semiconductor part ACT31$'$ may include a (3-1-1)-th semiconductor part ACT31$a'$, which is between the semiconductor opening OP_ACT3 and the first semiconductor part ACT1$'$, a (3-1-2)-th semiconductor part ACT31$b$, which is on a first side, in the first direction X, of the semiconductor opening OP_ACT3, and a (3-1-3)-th semiconductor part ACT31$c'$, which is between the semiconductor opening OP_ACT3 and the (3-1-2)-th semiconductor part ACT31$b$. The (3-1-2)-th semiconductor part ACT31$b$ may overlap the second connecting electrode ACNE2, and the (3-1-1)-th and (3-1-3)-th semiconductor parts ACT31$a'$ and ACT31$c'$ may not overlap the second connecting electrode ACNE2. Parts of the (3-2)-th semiconductor part ACT32$'$ on a first side, in the first direction X, and a second side, in the second direction Y, of the (3-2)-th semiconductor part ACT32$'$ may overlap the third gate insulating layer 115$'$_1$c$ and a (2-1)-th connecting electrode ACNE21 of the second connecting electrode ACNE2. Parts of the (3-3)-th semiconductor part ACT33$'$ on first sides, in the first and second directions X and Y, of the (3-3)-th semiconductor part ACT33$'$ may overlap the third gate insulating layer 115$'$_1$c$ and the (2-1)-th connecting electrode ACNE21 of the second connecting electrode ACNE2.

Figure 39:
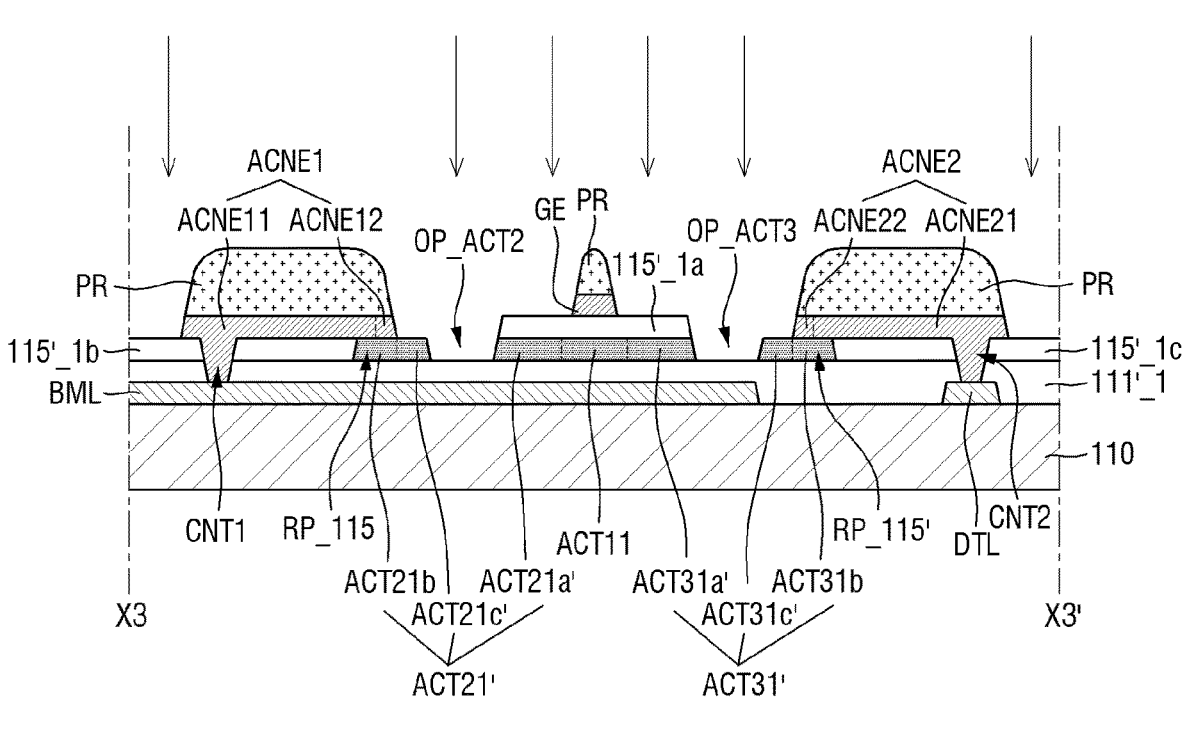
Figure 40:
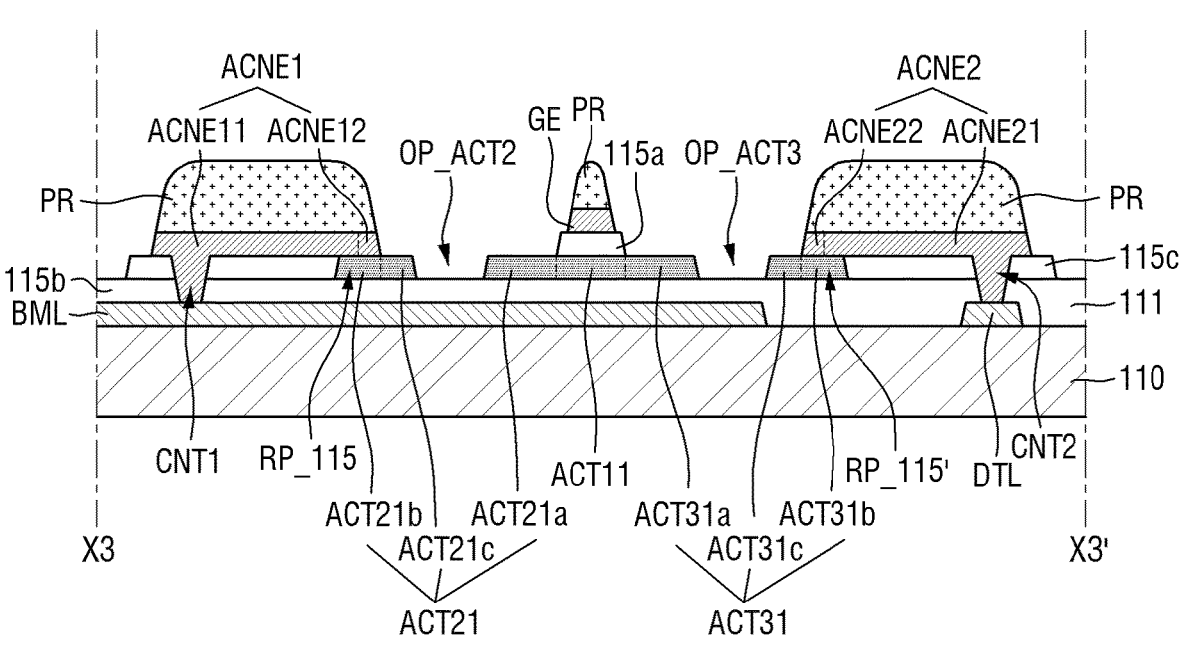

Thereafter, referring to FIG. 39, the gate insulating layer 115$'$_1 may be etched using the photoresist PR. The gate insulating layer 115$'$_1 may be etched by a dry etching process, but embodiments are not limited thereto. As a result of the etching of the gate insulating layer 115$'$_1, a gate insulating layer 115 of FIG. 40 may be formed. During the dry etching process on the gate insulating layer 115$'$_1, the semiconductor layer ACT$'$ may become conductive. For example, parts of the semiconductor layer ACT$'$ of FIG. 39, exposed by the gate insulating layer 115, the first and second connecting electrodes ACNE1 and ACNE2, and the gate electrode GE, may become conductive. For example, the first semiconductor part ACT11$'$, part of the (2-2)-th semiconductor part ACT22$'$, part of the (2-3)-th semiconductor part ACT23$'$, part of the (3-2)-th semiconductor part ACT32$'$, part of the (3-3)-th semiconductor part ACT33$'$, the (2-1-1)-th semiconductor part ACT21$a'$, the (2-1-3)-th semiconductor part ACT21$c'$, the (3-1-1)-th semiconductor part ACT31$a'$, and the (3-1-3)-th semiconductor part ACT31$c'$ may become conductive.

Figure 41:
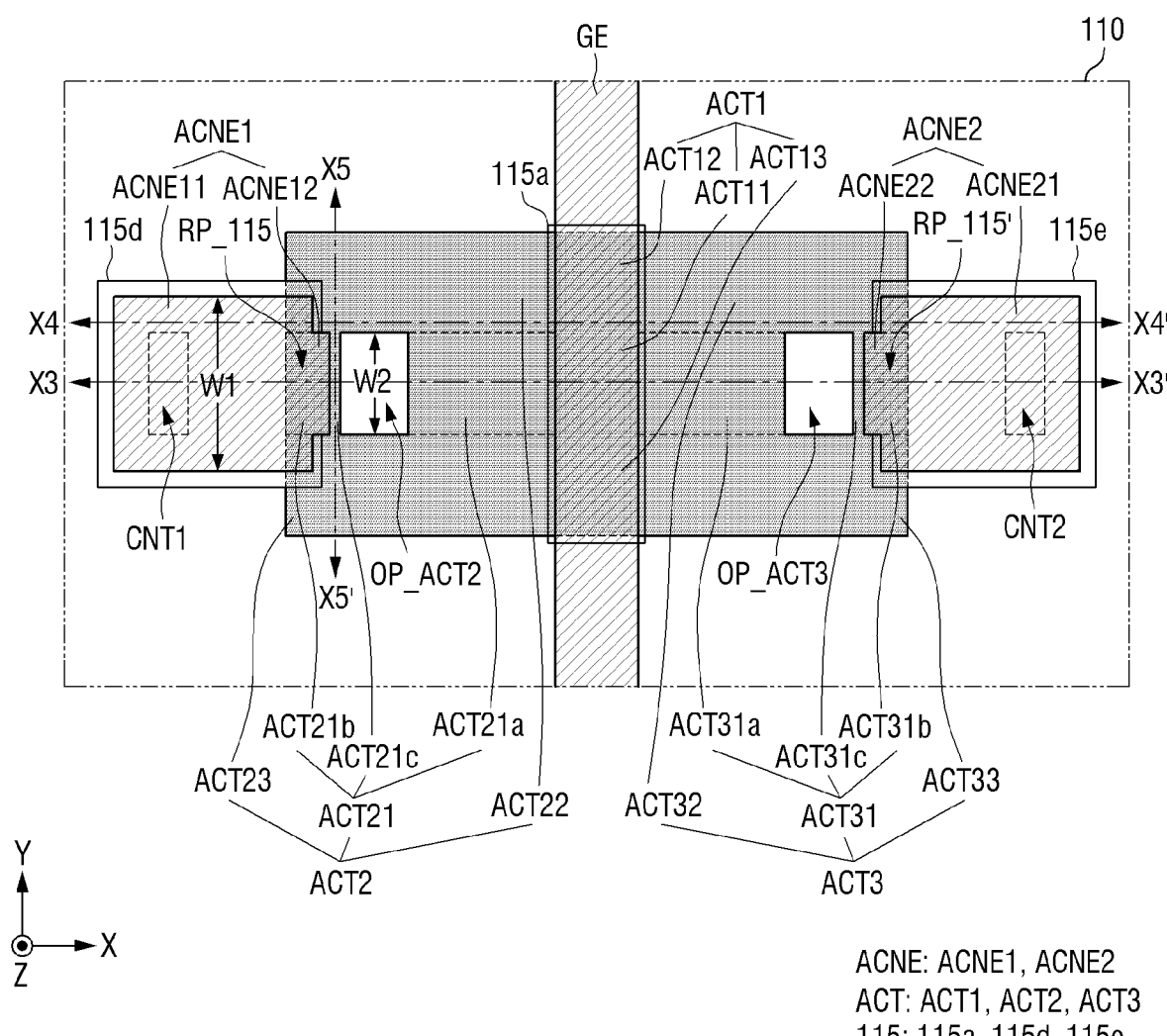
FIG. 41 is a schematic plan view of a transistor of a pixel of a display device according to an embodiment.

FIG. 41 is a schematic plan view of a transistor of a pixel of a display device according to an embodiment.

Referring to FIG. 41, the display device of FIG. 41 differs from its counterpart of FIG. 17 in that an end portion of a gate insulating layer 115$d$ is positioned between an end portion of a (1-2)-th connecting electrode ACNE12 and an end portion of a (1-1)-th connecting electrode ACNE11, and an end portion of a gate insulating layer 115$e$ is positioned between an end portion of a (2-2)-th connecting electrode ACNE22 and an end portion of a (2-1)-th connecting electrode ACNE21.

Other features or elements of the display device of FIG. 41 are almost as described above with reference to FIGS. 17 through 25, and thus, detailed descriptions thereof will be omitted for descriptive convenience.

In concluding the detailed description, those skilled in the art will appreciate that many variations and modifications can be made to the embodiments without substantially departing from the principles of the present invention. Therefore, the disclosed embodiments of the invention are used in a generic and descriptive sense only and not for purposes of limitation.

What is claimed is:

1. A display device comprising:
   a first base part;
   a semiconductor layer including:
      a first semiconductor part disposed on the first base part,
      a second semiconductor part adjacent to a first side of the first semiconductor part in a first direction, and
      a third semiconductor part adjacent to a second side of the first semiconductor part in the first direction;
   a gate insulating layer disposed on the semiconductor layer, the gate insulating layer including a first gate insulating layer, a second gate insulating layer, and a third gate insulating layer spaced apart from each other; and
   a gate conductive layer including:
      a gate electrode disposed on the first gate insulating layer and overlapping the first semiconductor part,
      a first connecting electrode overlapping the second gate insulating layer and the second semiconductor part, and
      a second connecting electrode overlapping the third gate insulating layer and the third semiconductor part, wherein
   the first connecting electrode includes a protrusion in a plan view,
   the second gate insulating layer includes a recess in the plan view, and
   the protrusion of the first connecting electrode overlaps the recess of the second gate insulating layer.

2. The display device of claim 1, wherein
   the second connecting electrode includes a protrusion in the plan view,
   the third gate insulating layer includes a recess in the plan view, and
   the protrusion of the second connecting electrode overlaps the recess of the third gate insulating layer.

3. The display device of claim 1, wherein
   the first connecting electrode is directly connected to the second semiconductor part, the second connecting electrode is directly connected to the third semiconductor part, the second and third semiconductor parts include semiconductor openings penetrating the second and third semiconductor parts in a thickness direction, the first connecting electrode includes:

a (1-1)-th connecting electrode, and a (1-2)-th connecting electrode including the protrusion of the first connecting electrode and connected to the (1-1)-th connecting electrode, an end portion of the second gate insulating layer overlapping the first connecting electrode is aligned with an end portion of the (1-2)-th connecting electrode or is disposed between the end portion of the (1-2)-th connecting electrode and an end portion of the (1-1)-th connecting electrode.

4. The display device of claim 3, wherein the second semiconductor part includes a (2-1)-th semiconductor part extending in the first direction, the (2-1)-th semiconductor part including:

the semiconductor opening of the second semiconductor part, a first-side semiconductor part adjacent to a first side of the semiconductor opening of the second semiconductor part in the first direction, wherein the first-side semiconductor part includes:

a (2-1-2)-th semiconductor part overlapping the first connecting electrode, and a (2-1-3)-th semiconductor part protruding toward the semiconductor opening of the second semiconductor part beyond the first connecting electrode in the plan view, and a (2-1-1)-th semiconductor part adjacent to a second side of the semiconductor opening of the second semiconductor part in the first direction, wherein the (2-1-1)-th semiconductor part is directly connected to the first semiconductor part.

5. The display device of claim 4, wherein the (2-1-1)-th semiconductor part has a higher conductivity than the first semiconductor part, wherein the (2-1-3)-th semiconductor part has a higher conductivity than the (2-1-2)-th semiconductor part.

6. The display device of claim 4, wherein the second semiconductor part further includes:

a (2-2)-th semiconductor part adjacent to a first side of the (2-1)-th semiconductor part in a second direction intersecting the first direction, and a (2-3)-th semiconductor part adjacent to on a second side of the (2-1)-th semiconductor part in the second direction, and the (2-2)-th and (2-3)-th semiconductor parts are directly connected to the (2-1-3)-th semiconductor part.

7. The display device of claim 6, wherein the (2-2)-th and (2-3)-th semiconductor parts have a higher conductivity than the (2-1-2)-th semiconductor part.

8. The display device of claim 6, wherein a width of the (1-2)-th connecting electrode in the second direction is smaller than a width of the (1-1)-th connecting electrode in the second direction, wherein the (1-2)-th connecting electrode protrudes from the end portion of the (1-1)-th connecting electrode toward the semiconductor openings.

9. The display device of claim 8, wherein the (2-1-3)-th semiconductor part protrudes from the (1-2)-th connecting electrode toward the semiconductor openings in the plan view.

10. The display device of claim 8, wherein the (1-2)-th connecting electrode is positioned in a middle portion of the end portion of the (1-1)-th connecting electrode, wherein the recess of the second gate insulating layer overlapping the first connecting electrode includes an insulating opening recessed from the end portion of the second gate insulating layer in the first direction from the first semiconductor part to the second semiconductor part.

11. The display device of claim 3, wherein the second gate insulating layer overlapping the first connecting electrode includes end portions spaced apart from each other in a second direction intersecting the first direction and forming the recess of the second gate insulating layer, and the (1-2)-th connecting electrode is disposed between the end portions of the second gate insulating layer.

12. The display device of claim 11, wherein the end portions of the second gate insulating layer overlapping the first connecting electrode are in contact with end portions of the (1-2)-th connecting electrode in the second direction.

13. The display device of claim 11, wherein a distance between the end portions of the second gate insulating layer in the second direction and a width of the (1-2)-th connecting electrode in the second direction are substantially same as each other.

14. A display device comprising:

a first base part;

a semiconductor layer including:

a first semiconductor part disposed on the first base part, and a second semiconductor part adjacent to a first side of the first semiconductor part in a first direction;

a gate insulating layer disposed on the semiconductor layer, the gate insulating layer including a first gate insulating layer and a second gate insulating layer spaced apart from each other; and a gate conductive layer including:

a gate electrode disposed on the first gate insulating layer and overlapping the first semiconductor part, and a first connecting electrode overlapping the second gate insulating layer and the second semiconductor part, wherein the first connecting electrode includes a protrusion in a plan view, the second gate insulating layer includes a recess in the plan view, and the protrusion of the first connecting electrode overlaps the recess of the second gate insulating layer.

15. The display device of claim 14, wherein the first connecting electrode is directly connected to the second semiconductor part, the first connecting electrode includes:

a (1-1)-th connecting electrode, and a (1-2)-th connecting electrode including the protrusion of the first connecting electrode and connected to the (1-1)-th connecting electrode, and a width of the (1-2)-th connecting electrode in a second direction is smaller than a width of the (1-1)-th connecting electrode in the second direction.

16. The display device of claim 15, wherein the second semiconductor part includes a semiconductor opening penetrating the second semiconductor part.

17. The display device of claim 16, wherein the (1-2)-th connecting electrode protrudes from an end portion of the (1-1)-th connecting electrode toward the semiconductor opening.

18. The display device of claim 17, wherein the first gate insulating layer overlaps the gate electrode, and the second gate insulating layer overlaps the first connecting electrode.

19. The display device of claim 18, wherein the recess of the second gate insulating layer overlapping the first connecting electrode includes an insulating opening recessed from an end portion of the second gate insulating layer in the first direction from the first semiconductor part to the second semiconductor part, wherein the end portion of the second gate insulating layer overlapping the first connecting electrode is disposed between an end portion of the (1-2)-th connecting electrode and an end portion of the (1-1)-th connecting electrode.

20. An electronic device, comprising:

a display device comprising:

a first base part;

a semiconductor layer including:

a first semiconductor part disposed on the first base part, a second semiconductor part adjacent to a first side of the first semiconductor part in a first direction, and a third semiconductor part adjacent to a second side of the first semiconductor part in the first direction;

a gate insulating layer disposed on the semiconductor layer, the gate insulating layer including a first gate insulating layer, a second gate insulating layer, and a third gate insulating layer spaced apart from each other; and a gate conductive layer including:

a gate electrode disposed on the first gate insulating layer and overlapping the first semiconductor part, a first connecting electrode overlapping the second gate insulating layer and the second semiconductor part, and a second connecting electrode overlapping the third gate insulating layer and the third semiconductor part, wherein the first connecting electrode includes a protrusion in a plan view, the second gate insulating layer includes a recess in the plan view, and the protrusion of the first connecting electrode overlaps the recess of the second gate insulating layer.

* * * * *